(12) United States Patent
Taguchi et al.

(10) Patent No.: US 11,112,693 B2
(45) Date of Patent: Sep. 7, 2021

(54) CURABLE COLORING COMPOSITION, COLOR FILTER, SOLID-STATE IMAGING DEVICE, IMAGE DISPLAY DEVICE, AND METHOD FOR PRODUCING CURED FILM

(71) Applicant: FUJIFILM Corporation, Tokyo (JP)

(72) Inventors: Yoshinori Taguchi, Haibara-gun (JP); Naotsugu Muro, Haibara-gun (JP); Yousuke Murakami, Haibara-gun (JP); Seongmu Bak, Haibara-gun (JP); Akiko Yoshii, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 507 days.

(21) Appl. No.: 16/058,441

(22) Filed: Aug. 8, 2018

(65) Prior Publication Data

US 2018/0348630 A1 Dec. 6, 2018

Related U.S. Application Data

(63) Continuation of application No. PCT/JP2017/005087, filed on Feb. 13, 2017.

(30) Foreign Application Priority Data

Feb. 15, 2016 (JP) .............................. JP2016-026043

(51) Int. Cl.
| | | |
|---|---|---|
| *G02B 5/20* | (2006.01) | |
| *G03F 7/004* | (2006.01) | |
| *G03F 7/00* | (2006.01) | |
| *C09B 47/04* | (2006.01) | |
| *C08K 5/23* | (2006.01) | |
| *C08K 5/3417* | (2006.01) | |
| *C08F 2/50* | (2006.01) | |
| *C08K 5/3447* | (2006.01) | |
| *C08L 101/00* | (2006.01) | |
| *C08G 59/32* | (2006.01) | |
| *C09B 69/10* | (2006.01) | |
| *G03F 7/105* | (2006.01) | |
| *C08K 5/00* | (2006.01) | |
| *C08G 59/68* | (2006.01) | |
| *G03F 7/038* | (2006.01) | |
| *G03F 7/027* | (2006.01) | |
| *G03F 7/40* | (2006.01) | |
| *G02B 1/04* | (2006.01) | |
| *G03F 7/16* | (2006.01) | |
| *G03F 7/20* | (2006.01) | |
| *G03F 7/32* | (2006.01) | |
| *H01L 27/32* | (2006.01) | |
| *C08F 220/34* | (2006.01) | |
| *C08F 220/38* | (2006.01) | |
| *G02F 1/1335* | (2006.01) | |
| *H01L 27/30* | (2006.01) | |

(52) U.S. Cl.
CPC .............. *G03F 7/0007* (2013.01); *C08F 2/50* (2013.01); *C08G 59/3218* (2013.01); *C08G 59/686* (2013.01); *C08K 5/0041* (2013.01); *C08K 5/0091* (2013.01); *C08K 5/23* (2013.01); *C08K 5/3417* (2013.01); *C08K 5/3447* (2013.01); *C08L 101/00* (2013.01); *C09B 47/04* (2013.01); *C09B 69/108* (2013.01); *G02B 1/04* (2013.01); *G02B 5/20* (2013.01); *G03F 7/027* (2013.01); *G03F 7/038* (2013.01); *G03F 7/105* (2013.01); *G03F 7/162* (2013.01); *G03F 7/168* (2013.01); *G03F 7/2004* (2013.01); *G03F 7/2024* (2013.01); *G03F 7/322* (2013.01); *G03F 7/40* (2013.01); *C08F 220/343* (2020.02); *C08F 220/387* (2020.02); *G02F 1/133514* (2013.01); *H01L 27/307* (2013.01); *H01L 27/322* (2013.01)

(58) Field of Classification Search
CPC ........ G03F 7/0007; G03F 7/027; G03F 7/028; G03F 7/031; G03F 7/2024; G03F 7/105; G03F 7/40; G02B 5/223
USPC ....................... 430/7, 270.1, 281.1
See application file for complete search history.

(56) References Cited

U.S. PATENT DOCUMENTS

| 2010/0039028 A1 | 2/2010 | Suzuki et al. |
| 2016/0139505 A1 | 5/2016 | Taguchi et al. |

FOREIGN PATENT DOCUMENTS

| JP | 62-239145 A | 10/1987 |
| JP | 2001-174621 A | 6/2001 |
| JP | 2009-221376 A | 10/2009 |
| JP | 2010-044981 A | 2/2010 |
| JP | 2011-157478 A | 8/2011 |
| JP | 2012-247588 A | 12/2012 |

(Continued)

OTHER PUBLICATIONS

Computer-generated translation of JP 2012-247588 (Dec. 2012) (Year: 2012).*

(Continued)

*Primary Examiner* — John A McPherson
(74) *Attorney, Agent, or Firm* — Sughrue Mion, PLLC

(57) ABSTRACT

Provided are a curable coloring composition which is suitable for the production of a cured film in cyan color, having good moisture resistance, a color filter, an image sensor, and a method for producing a cured film. The curable coloring composition includes a coloring agent including a phthalocyanine pigment having Al as a central metal, a basic pigment derivative, and a curable compound, in which the coloring agent includes 80% by mass or more of the phthalocyanine pigments, and the content of the phthalocyanine pigment having Al as a central metal among the phthalocyanine pigments is 30% by mass or more.

24 Claims, No Drawings

(56) References Cited

FOREIGN PATENT DOCUMENTS

| | | |
|---|---|---|
| JP | 2013-254126 A | 12/2013 |
| JP | 2014-199308 A | 10/2014 |
| JP | 2015-41058 A | 3/2015 |
| JP | 2015-045706 A | 3/2015 |
| JP | 2015-063593 A | 4/2015 |
| JP | 2015-151530 A | 8/2015 |
| JP | 2016-191909 A | 11/2016 |
| TW | 201512773 A | 4/2015 |
| WO | WO 2015/025689 A1 * | 2/2015 |

OTHER PUBLICATIONS

Office Action dated Aug. 6, 2019 issued by the Japanese Patent Office in counterpart Japanese Application No. 2018-500099.
International Preliminary Report on Patentability and Written Opinion issued from the International Bureau in counterpart International Application No. PCT/JP2017/005087, dated Aug. 21, 2018.
Written Opinion issued by the International Searching Authority in corresponding International Application No. PCT/JP2017/005087, dated May 16, 2017.
International Search Report, issued by International Searching Authority in corresponding International Application No. PCT/JP2017/005087, dated May 16, 2017.
Office Action dated Dec. 23, 2019, issued by the Korean Intellectual Property Office in Korean Application No. 10-2018-7022699.
Office Action dated May 5, 2020, from the Taiwanese Intellectual Property Office in TW Application No. 106104548.

* cited by examiner

CURABLE COLORING COMPOSITION, COLOR FILTER, SOLID-STATE IMAGING DEVICE, IMAGE DISPLAY DEVICE, AND METHOD FOR PRODUCING CURED FILM

CROSS-REFERENCE TO RELATED APPLICATIONS

This application is a Continuation of PCT International Application No. PCT/JP2017/005087 filed on Feb. 13, 2017, which claims priority under 35 U.S.C § 119(a) to Japanese Patent Application No. 2016-026043 filed on Feb. 15, 2016. Each of the above application(s) is hereby expressly incorporated by reference, in its entirety, into the present application.

BACKGROUND OF THE INVENTION

1. Field of the Invention

The present invention relates to a curable coloring composition, a color filter, a solid-state imaging device, an image display device, and a method for producing a cured film.

2. Description of the Related Art

Recently, as a digital camera, a mobile phone with a camera, and the like have been further spreading, there has been an increasing demand for a solid-state imaging device such as a charge-coupled device (CCD) image sensor. A color filter has been used as a key device in a display or optical element.

A color filter is manufactured using a curable coloring composition including a coloring agent and a curable compound. Further, use of a phthalocyanine pigment using Al as a central metal has recently been investigated (see JP2015-045706A, JP2014-199308, and JP2009-221376A).

SUMMARY OF THE INVENTION

In recent years, various devices including a solid-state imaging device using a color filter, or the like may be used in an environment having a high humidity in some cases. As a result, there has recently been a demand for development of a curable coloring composition capable of producing a cured film for a color filter or the like, having excellent moisture resistance.

In addition, development of a color filter having pixels in cyan color has recently been investigated.

Therefore, an object of the present invention is to provide a curable coloring composition which is suitable for the production of a cured film in cyan color, having good moisture resistance. Another object of the present invention is to provide a color filter, a solid-state imaging device, an image display device, and a method for producing a cured film.

The present inventors have conducted extensive studies, and as a result, they have found that by increasing the content of the phthalocyanine pigment having Al as a central metal in a coloring agent, the moisture resistance of the obtained cured film is improved, and in addition, the cured film can be provided with spectral characteristics suitable for cyan color, thereby completing the present invention. That is, the present invention is as follows.

<1> A curable coloring composition comprising:
a coloring agent including a phthalocyanine pigment having Al as a central metal;
a basic pigment derivative; and
a curable compound,
in which the coloring agent includes 80% by mass or more of the phthalocyanine pigments, and the content of the phthalocyanine pigment having Al as a central metal among the phthalocyanine pigments is 30% by mass or more.

<2> The curable coloring composition as described in <1>,
in which the content of the phthalocyanine pigment having Al as a central metal among the phthalocyanine pigments is 50% by mass or more.

<3> The curable coloring composition as described in <1> or <2>,
in which the phthalocyanine pigment having Al as a central metal has a ligand including a phosphorus atom.

<4> The curable coloring composition as described in <3>,
in which the ligand including a phosphorus atom has a hydrophobic group.

<5> The curable coloring composition as described in any one of <1> to <4>,
in which the phthalocyanine pigment having Al as a central metal is represented by Formula (Pc-1),

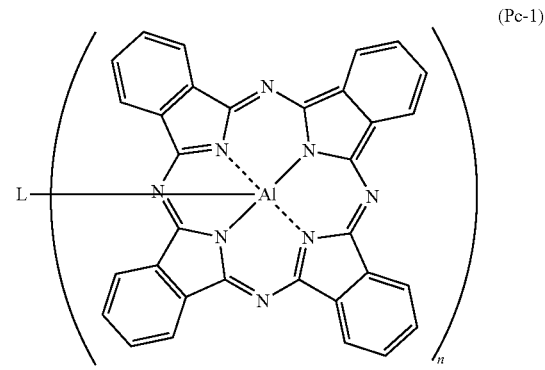

(Pc-1)

in the formula, L represents a ligand having one or more coordination sites for the Al atom, and n represents the number of coordination sites contained in L.

<6> The curable coloring composition as described in any one of <1> to <5>,
in which the coloring agent has a content of the yellow coloring agent of 5% by mass or less.

<7> The curable coloring composition as described in any one of <1> to <6>,
in which the basic pigment derivative has at least one selected from an azo-based skeleton and a benzoimidazolone-based skeleton.

<8> The curable coloring composition as described in any one of <1> to <7>,
in which the curable compound includes an epoxy compound, and the curable coloring composition further includes a curing aid.

<9> The curable coloring composition as described in any one of <1> to <8>,
in which the curable compound includes a radically polymerizable compound, and
the curable coloring composition further includes a photopolymerization initiator A having a light absorption coefficient at 365 nm of $1.0 \times 10^3$ mL/gcm or more in methanol, and a photopolymerization initiator B having a light absorption coefficient at 365 nm of $1.0 \times 10^2$ mL/gcm or less and a light absorption coefficient at 254 nm of $1.0 \times 10^3$ mL/gcm or more in methanol.

<10> The curable coloring composition as described in any one of <1> to <9>, used for forming pixels in cyan color.

<11> A color filter using the curable coloring composition as described in any one of <1> to <10>.

<12> A solid-state imaging device comprising the color filter as described in <11>.

<13> The solid-state imaging device as described in <12>, further comprising an organic photoelectric conversion film.

<14> An image display device comprising the color filter as described in <11>.

<15> A method for producing a cured film, comprising:
a step of forming a curable coloring composition layer on a substrate, using the curable coloring composition as described in any one of <1> to <10>;
a step of patternwise exposing the curable coloring composition layer; and
a step of removing an unexposed area by development to form a pattern,
in which the method for producing a cured film is carried out at a temperature of 180° C. or lower through all the steps.

<16> The method for producing a cured film as described in <15>, further comprising a step of performing exposure after formation of the pattern.

<17> The method for producing a cured film as described in <16>,
in which a curable coloring composition including a radically polymerizable compound, a photopolymerization initiator A having a light absorption coefficient at 365 nm of $1.0 \times 10^3$ mL/gcm or more in methanol, and a photopolymerization initiator B having a light absorption coefficient at 365 nm of $1.0 \times 10^2$ mL/gcm or less and a light absorption coefficient at 254 nm of $1.0 \times 10^3$ mL/gcm or more in methanol is used as the curable coloring composition, and
the exposure before formation of the pattern is performed with light at a wavelength of more than 350 nm and 380 nm or less, and
the exposure after formation of the pattern is performed with light at a wavelength of 254 to 350 nm.

<18> The method for producing a cured film as described in any one of <15> to <17>,
in which the substrate is a substrate having an organic photoelectric conversion film.

According to the present invention, it is possible to provide a curable coloring composition which is suitable for the production of a cured film in cyan color, having good moisture resistance. It is also possible to provide a color filter, a solid-state imaging device, an image display device, and a method for producing a cured film.

DESCRIPTION OF THE PREFERRED EMBODIMENTS

Hereinafter, the contents of the present invention will be described in detail.

In citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, light means actinic rays or radiation. Further, "actinic rays" or "radiation" means, for example, a bright line spectrum of a mercury lamp, far ultraviolet rays typified by an excimer laser, extreme ultraviolet rays (EUV light), X-rays, electron beams, or the like.

In the present specification, "exposure" includes, unless otherwise specified, not only exposure using a mercury lamp, far ultraviolet rays typified by an excimer laser, X-rays, EUV light, or the like, but also lithography by particle rays such as electron beams and ion beams.

In the present specification, a numerical range expressed using "to" means a range that includes the preceding and succeeding numerical values of "to" as the lower limit value and the upper limit value, respectively.

In the present specification, the total solid content refers to a total mass of the components remaining by excluding a solvent from all the components of a coloring composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, a term "step" includes not only an independent step, but also a step which is not clearly distinguished from other steps in a case where an intended action of the step is obtained.

In the present specification, a weight-average molecular weight (Mw) and a number-average molecular weight (Mn) are defined as values in terms of polystyrene by the measurement using gel permeation chromatography (GPC).

In the present invention, the pigment means an insoluble compound that is poorly soluble in a specific solvent, and typically means a compound that exists in a state of being dissolved as particles in a composition. The pigment preferably has a solubility at 25° C. of 0.1 g/100 g solvent or less in, for example, any one of propylene glycol monomethyl ether acetate and water.

<Curable Coloring Composition>

The curable coloring composition of the present invention includes a coloring agent including a phthalocyanine pigment having Al as a central metal, a basic pigment derivative, and a curable compound,
in which the coloring agent includes 80% by mass or more of the phthalocyanine pigments, and the content of the phthalocyanine pigment having Al as a central metal among the phthalocyanine pigments is 30% by mass or more. Hereinafter, the "curable coloring composition" is also referred to as a "coloring composition". Further, the "phthalocyanine pigment having Al as a central metal" is also referred to as an "aluminum phthalocyanine pigment".

By using the coloring composition of the present invention, it is possible to produce a cured film having good moisture resistance and spectral characteristics suitable for pixels in cyan color or the like, as shown in Examples which will be described later. A reason why such an effect is obtained is not clear, but it is presumed that the effect is caused by a combined use of a coloring agent including 80% by mass or more of the phthalocyanine pigments, in which the content of the aluminum phthalocyanine pigment is 30% by mass or more among the phthalocyanine pigments, and a basic pigment derivative. That is, by increasing the content of the aluminum phthalocyanine pigment in the composition, the moisture resistance of the obtained cured film is improved, and a cured film having spectral characteristics suitable for cyan color can be obtained. By using the coloring agent containing the aluminum phthalocyanine pigment at the above-mentioned ratio in combination with the basic pigment derivative, the moisture resistance of the obtained cured film can also be improved. As a result, according to the present invention, it is possible to produce a cured film having good moisture resistance and spectral characteristics suitable for pixels in cyan color or the like.

In addition, by using the coloring agent and the basic pigment derivative, each described above, it is also possible to the temporal stability of the coloring composition. Moreover, it is also possible to suppress the adhesiveness of the obtained cured film to a substrate or the like, to suppress a residue during pattern formation, or to suppress color mixture with other layers, or the like.

Hereinafter, the respective components of the coloring composition of the present invention will be described.

<<Coloring Agent>>

The coloring composition of the present invention includes 80% by mass or more of the phthalocyanine pigments, and contains a coloring agent in which the content of the aluminum phthalocyanine pigment is 30% by mass or more among the phthalocyanine pigments.

The coloring agent includes 80% by mass or more, preferably 85% by mass or more, and more preferably 90% by mass or more of the phthalocyanine pigment. The upper limit of the content may be 100% by mass. That is, the phthalocyanine pigment can also account for the total amount of the coloring agent. Further, the content of the aluminum phthalocyanine pigment is 30% by mass or more, preferably 35% by mass or more, and more preferably 40% by mass or more, among the phthalocyanine pigments. The upper limit of the content may be 100% by mass. That is, according to desired spectral characteristics, the aluminum phthalocyanine pigment can also account for the total amount of the phthalocyanine pigment. Further, by incorporating other phthalocyanine pigments, it is also possible to improve the temporal stability of the coloring composition. By using a coloring agent containing the phthalocyanine pigment and aluminum phthalocyanine pigment in the above-mentioned ratio, it is also possible to a cured film having good moisture resistance and spectral characteristics suitable for cyan color.

Furthermore, the coloring agent has a content of the pigment of preferably 80% by mass or more, more preferably 90% by mass or more, and still more preferably 95% by mass or more.

One kind or two or more kinds of the aluminum phthalocyanine pigments may be included. In a case where two or more kinds of the aluminum phthalocyanine pigments are included, a total amount thereof is preferably within the range.

The content of the coloring agent is preferably 10% by mass or more, more preferably 20% by mass or more, and still more preferably 30% by mass or more, with respect to the total solid content of the coloring composition. The upper limit of the content is preferably 80% by mass or less, more preferably 75% by mass or less, and still more preferably 70% by mass or less.

The content of the phthalocyanine pigment is preferably 8% by mass or more, more preferably 16% by mass or more, and still more preferably 24% by mass or more, with respect to the total solid content of the coloring composition. The upper limit of the content is preferably 80% by mass or less, more preferably 75% by mass or less, and still preferably 70% by mass or less.

The content of the aluminum phthalocyanine pigment is preferably 2.4% by mass or more, more preferably 4.8% by mass or more, and still more preferably 7.2% by mass or more, with respect to the total solid content of the coloring composition. The upper limit of the content is preferably 80% by mass or less, more preferably 75% by mass or less, and still more preferably 70% by mass or less.

(Aluminum Phthalocyanine Pigment)

The aluminum phthalocyanine pigment is a compound in which Al as a central metal is positioned in a region surrounded by four nitrogen atoms in an isoindole ring. The aluminum phthalocyanine pigment is preferably a compound represented by Formula (Pc).

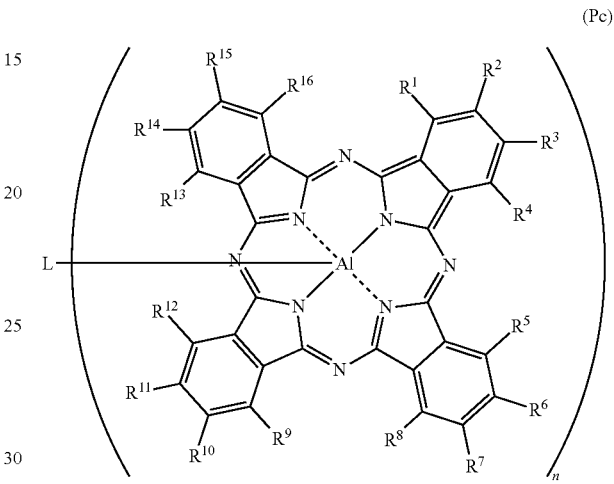

(Pc)

In Formula (Pc), $R^1$ to $R^{16}$ each independently represent a hydrogen atom or a substituent, L represents a ligand having one or more coordination sites for the Al atom, and n represents the number of coordination sites contained in L.

Examples of the substituent represented by each of $R^1$ and $R^{16}$ include a halogen atom, a cyano group, a nitro group, an alkyl group, an aryl group, a heterocyclic group, an aralkyl group, $-OR_Z^1$, $-COR_Z^1$, $-COOR_Z^1$, $-OCOR_Z^1$, $-NR_Z^1R_Z^2$, $-NHCOR_Z^1$, $-CONR_Z^1R_Z^2$, $-NHCONR_Z^1R_Z^2$, $-NHCOOR_Z^1$, $-SR_Z^1$, $-SO_2R_Z^1$, $-SO_2OR_Z^1$, $-NHSO_2R_Z^1$, and $-SO_2NR_Z^1R_Z^2$. $R_Z^1$ and $R_Z^2$ each independently represent a hydrogen atom, an alkyl group, an aryl group, a hetero ring, or an aralkyl group, and $R_Z^1$ and $R_Z^2$ may or may not be bonded to each other to form a ring in some aspects.

Examples of the halogen atom include a fluorine atom, a chlorine atom, a bromine atom, and an iodine atom.

The number of carbon atoms of the alkyl group is preferably 1 to 20, more preferably 1 to 15, and still more preferably 1 to 8. The alkyl group may be linear, branched, or cyclic.

The number of carbon atoms of the aryl group is preferably 6 to 20, and more preferably 6 to 12.

The alkyl moiety of the aralkyl group is the same as that of the alkyl group. The aryl moiety of the aralkyl group is the same as that of the aryl group. The number of carbon atoms of the aralkyl group is preferably 7 to 20, and more preferably 7 to 15.

The heterocyclic group is preferably a monocycle or a fused ring, more preferably a fused ring having 2 to 8 monocycles or fusions, and still more preferably a fused ring having 2 to 4 monocycles or fusions. The number of heteroatoms constituting the ring of the heterocyclic group is preferably 1 to 3. The heteroatoms constituting the ring of the heterocyclic group is preferably a nitrogen atom, an oxygen atom, or a sulfur atom. The heterocyclic group is preferably a 5- or 6-membered ring. The number of carbon atoms constituting the ring of the heterocyclic group is preferably 3 to 20, more preferably 3 to 18, and still more preferably 3 to 12.

The alkyl group, the aralkyl group, the aryl group, and the heterocyclic group may have a substituent or be unsubstituted. Examples of the substituent include the above-mentioned substituents, for example, an alkyl group, an aryl group, a heterocyclic group, and a halogen atom.

Preferably, at least one, more preferably at least eight, and still more preferably all of $R^1$ to $R^{16}$ are hydrogen atoms. That is, the aluminum phthalocyanine pigment is preferably a compound represented by Formula (Pc-1) which will be described later.

Examples of the ligand represented by L include a ligand having one or more selected from a coordination site that coordinates to an anion for the Al atom and a coordination site that coordinates to an unshared electron pair for the Al atom. The coordination site that coordinates to an anion may be dissociated or undissociated. The ligand may be a ligand (monodentate ligand) having one coordination site for the Al atom or may be a ligand (multidentate ligand) having two or more coordination sites for the Al atom. From the viewpoints of a residue and residual color mixture, it is preferable that L is a monodentate ligand. In a case where L is a multidentate ligand, the molecular weight of the aluminum phthalocyanine pigment itself increases, as compared with a case where L is a monodentate ligand, and therefore, the developability may be reduced in some cases.

From the viewpoint of suppression of a residue, it is preferable that L is a ligand having a phosphorus atom. Further, from the viewpoint of moisture resistance, L is preferably a ligand having a hydrophobic group. Among those, L is more preferably a ligand including a phosphorus atom and having a hydrophobic group. Further, in the present invention, the hydrophobic group represents a group having a low affinity for water. Examples of the group having a low affinity for water include an alkyl group, an aryl group, an alkoxy group, and an aryloxy group. The number of carbon atoms of each of the alkyl group and the alkoxy group is preferably 1 to 30. The lower limit is preferably 2 or more, and more preferably 3 or more. The upper limit is preferably 25 or less, and more preferably 20 or less. The alkyl group and the alkoxy group may have a substituent or be unsubstituted. Examples of the substituent include a halogen atom and an aryl group. The number of carbon atoms of each of the aryl group and the aryloxy group is preferably 6 to 30. The upper limit is preferably 25 or less, and more preferably 20 or less. The aryl group and the aryloxy group may have a substituent or be unsubstituted. Examples of the substituent include a halogen atom and an alkyl group.

L is preferably a halogen atom, a hydroxyl group, an alkoxy group, an aryloxy group, a heteroaryloxy group, an alkylthio group, an arylthio group, a heteroarylthio group, $-OP(=O)R^{101}R^{102}$, $-O-Si(R^{103})_3$, $-O-SO_2-R^{104}$, $-O-C(=O)-R^{105}$, $-O-SiR^{106}R^{107}-O-$, $-O-SiR^{108}R^{109}-O-SiR^{110}R^{111}-O-$, or $-O-P(=O)R^{112}-O-$, more preferably $-OP(=O)R^{101}R^{102}$ or $-O-P(=O)R^{112}-O-$, and still more preferably $-OP(=O)R^{101}R^{102}$.

The number of carbon atoms of the alkoxy group and the alkylthio group is preferably 1 to 30. The lower limit is preferably 2 or more, and more preferably 3 or more. The upper limit is preferably 25 or less, and more preferably 20 or less. Each of the alkoxy group and the alkylthio group is preferably linear or branched, and more preferably linear. Each of the alkoxy group and the alkylthio group may be unsubstituted or have a substituent. Examples of the substituent include the substituents described above as $R^1$ to $R^{16}$, and preferred ranges thereof are also the same.

The number of carbon atoms of each of the aryloxy group and the arylthio group is preferably 6 to 30. The upper limit is preferably 25 or less, and more preferably 20 or less. Each of the aryloxy group and the arylthio group may be unsubstituted or have a substituent. Examples of the substituent include the substituents described above as $R^1$ to $R^{16}$.

The number of heteroatoms constituting the heteroaryl group of each of the heteroaryloxy group and the heteroarylthio group is preferably 1 to 3. The heteroatom constituting the heteroaryl group is preferably a nitrogen atom, a sulfur atom, or an oxygen atom. The number of carbon atoms of the heteroaryl group is preferably 3 to 18, and more preferably 3 to 12. The heteroaryloxy group may be unsubstituted or have a substituent. Examples of the substituent include the substituents described above as $R^1$ to $R^{16}$.

$R^{101}$ to $R^{112}$ each independently represent a hydrogen atom or a substituent. The substituent is preferably a halogen atom, a hydroxyl group, an alkyl group, an aryl group, a heteroaryl group, an alkoxy group, an aryloxy group, or a heteroaryloxy group, more preferably an aryl group or an aryloxy group, and particularly preferably an aryloxy group.

The number of carbon atoms of each of the alkyl group and the alkoxy group is preferably 1 to 30. The lower limit is preferably 2 or more, and more preferably 3 or more. The upper limit is preferably 25 or less, and more preferably 20 or less. Each of the alkyl group and the alkoxy group is preferably linear or branched, and more preferably linear.

The number of carbon atoms of each of the aryl group and the aryloxy group is preferably 6 to 30. The upper limit is preferably 25 or less, and more preferably 20 or less.

The number of heteroatoms constituting the heteroaryl group of each of the heteroaryl group and the heteroaryloxy group is preferably 1 to 3. The heteroatom constituting the heteroaryl group is preferably a nitrogen atom, a sulfur atom, or an oxygen atom. The number of carbon atoms of the heteroaryl group is preferably 3 to 18, and more preferably 3 to 12.

n represents the number of coordination sites contained in L. n is preferably an integer of 1 to 5, more preferably 1 or 2, and still more preferably 1.

The aluminum phthalocyanine pigment is preferably a compound represented by Formula (Pc-1). The following compound is excellent from the viewpoint of spectral characteristics (particularly spectral characteristics of cyan color). In addition, it is also possible to effectively suppress the color mixture with other layers or the like during pattern formation.

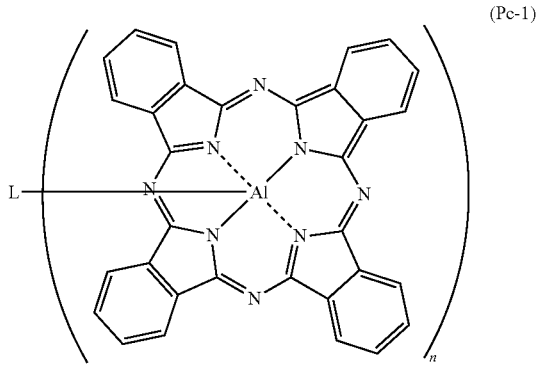

(Pc-1)

In the formula, L represents a ligand having one or more coordination sites for the Al atom, and n represents the number of coordination sites contained in L.

In the present invention, the aluminum phthalocyanine pigment is preferably a compound represented by Formula (Pc-1-1) or (Pc-1-2), and more preferably a compound represented by Formula (Pc-1-1).

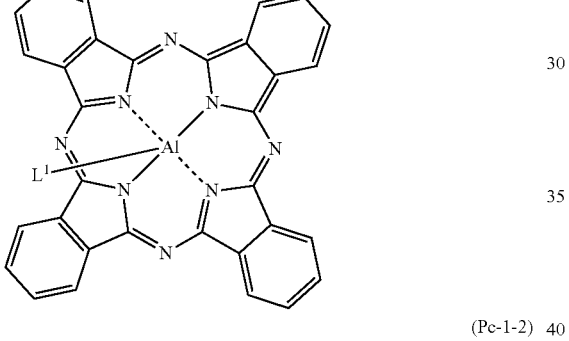

(Pc-1-1)

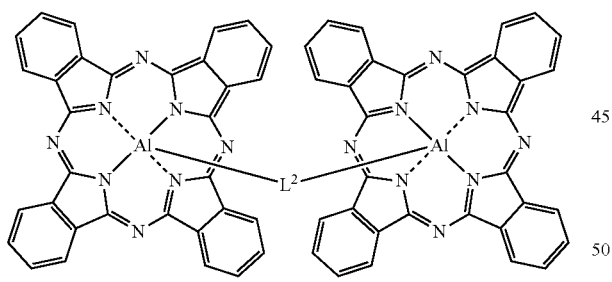

(Pc-1-2)

In Formula (Pc-1-1), $L^1$ represents a ligand having one coordination site for the Al atom.

In Formula (Pc-1-2), $L^2$ represents a ligand having two coordination sites for the Al atom.

Examples of $L^1$ include a halogen atom, a hydroxyl group, an alkoxy group, an aryloxy group, a heteroaryloxy group, an alkylthio group, an arylthio group, a heteroarylthio group, —OP(=O)$R^{101}R^{102}$, —O—Si($R^{103}$)$_3$, —O—SO$_2$—$R^{104}$, and —O—C(=O)—$R^{105}$, with —OP(=O)$R^{101}R^{102}$ being preferable.

Examples of $L^2$ include —O—Si$R^{106}R^{107}$—O—, —O—Si$R^{108}R^{109}$—O—Si$R^{110}R^{111}$—O—, and —O—P(=O)$R^{112}$—O—, with —O—P(=O)$R^{112}$—O— being preferable.

Specific examples of the aluminum phthalocyanine pigment include the following compounds. Further, as a compound classified as a Color Index (C. I.; issued by The Society of Dyers and Colourists) Pigment, C. I. Pigment Blue 79 or the like can also be used. In addition, the compounds described in paragraphs 0046 to 0053 of JP2015-63593A, the compounds described in paragraphs 0025 to 0034 of JP2010-79247A, the compounds described in paragraphs 0022 to 0030 of JP2012-247591A, the compounds described in paragraph 0047 of JP2011-157478A, or the like can also be included, and the contents of the publications are incorporated herein by reference.

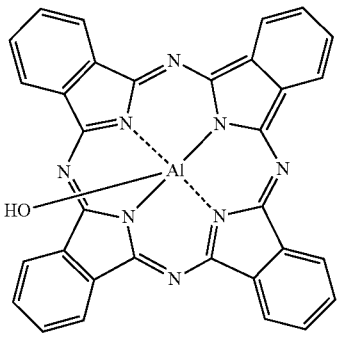

A-1

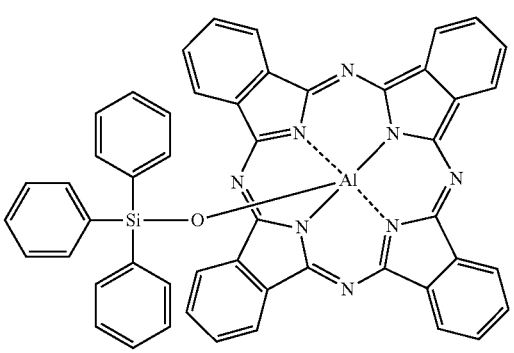

A-2

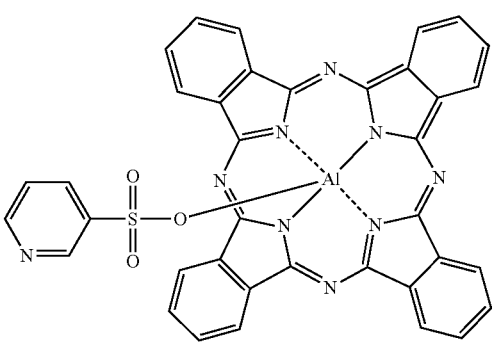

A-3

A-4
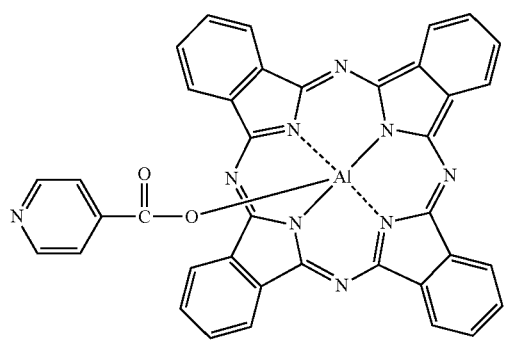

A-5
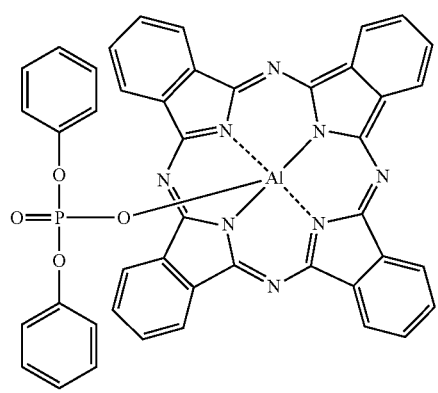

A-6
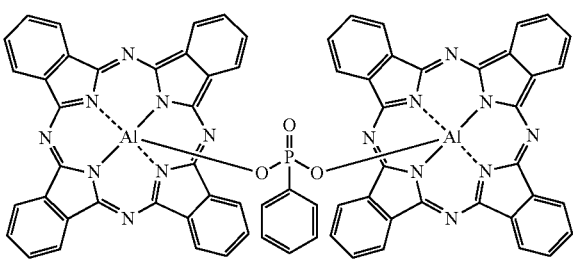

A-7
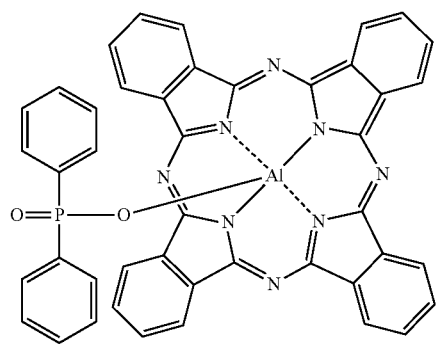

A-8
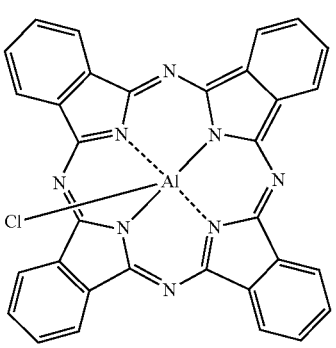

A-9
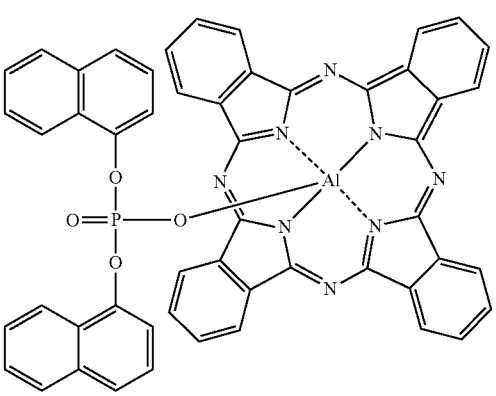

A-13
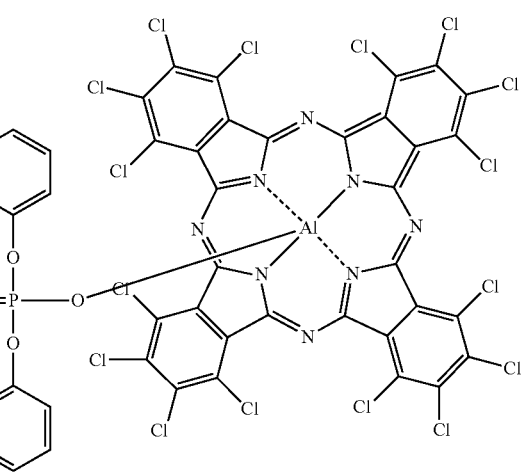

(Other Phthalocyanine Pigments)

The coloring agent can include other phthalocyanine pigments, in addition to the aluminum phthalocyanine pigment. By incorporation of such other phthalocyanine pigments, there is tendency that the temporal stability of the coloring composition is improved. Examples of such other phthalocyanine pigments include one or more selected from a phthalocyanine pigment having one selected from the group consisting of Zn, Cu, Ti, Fe, Sn, Pb, Ga, V, Mo, Ta, and Nb as a central metal, and a phthalocyanine pigment having no central metal. As such other phthalocyanine pigments, a halogenated phthalocyanine pigment having Zn as a central metal (hereinafter also referred to as a halogenated zinc phthalocyanine pigment) is preferable. Further, the halogenated zinc phthalocyanine pigment is preferably a compound represented by Formula (A1).

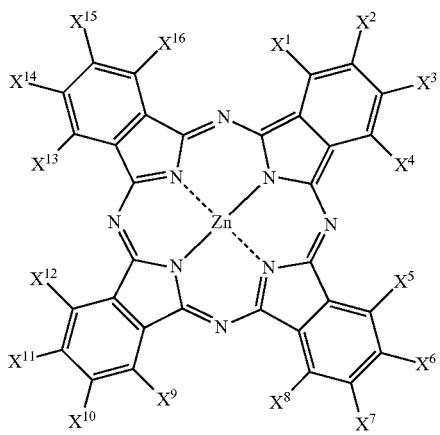

(A1)

In Formula (A1), $X^1$ to $X^{16}$ each independently represent a hydrogen atom or a substituent. It is preferable that any 8 to 16 of $X^1$ to $X^{16}$ each represent a halogen atom, and the others represent a hydrogen atom, or a substituent other than a halogen atom. Examples of the substituent include the groups described above in Formula (Pc).

As specific examples of the halogenated zinc phthalocyanine pigment, for example, aspects shown below may be mentioned as a preferred example.

<1> The halogenated zinc phthalocyanine pigment in which the average number of halogen atoms in one molecule of phthalocyanine is 8 to 12. In this aspect, it is preferable that $X^1$ to $X^{16}$ include one or more of a chlorine atom, a bromine atom, and a hydrogen atom. Further, it is also preferable that $X^1$ to $X^{16}$ have 0 to 4 chlorine atoms, 8 to 12 bromine atoms, and 0 to 4 hydrogen atoms. With regard to the specific examples, reference can be made to the descriptions in paragraphs 0013 to 0039, and 0084 to 0085 of JP2007-284592A, the contents of which are incorporated herein by reference.

<2> The halogenated zinc phthalocyanine pigment in which the average number of halogen atoms is 10 to 14, the average number of bromine atoms is 8 to 12, and the average number of chlorine atoms is 2 to 5, in one molecule of phthalocyanine. Specific examples thereof include the compounds described in the publication of WO2015/118720A.

The halogenated zinc phthalocyanine pigment can use, for example, C. I. Pigment Green 58 and 59, or the like.

In addition, examples of the phthalocyanine pigment other than the halogenated zinc phthalocyanine pigment include C. I. Pigment Green 7, 36, and 37, C. I. Pigment Blue 15, 15:1, 15:2, 15:3, 15:4, 15:6, 16, and the like.

(Coloring Agents Other than Phthalocyanine Pigment)

The coloring agent may further include coloring agents (other coloring agents) other than the phthalocyanine pigment. Such other coloring agents may be any one of a dye and a pigment, both of which may also be used in combination. Examples of the pigment include various inorganic pigments or organic pigments known in the related art.

Examples of the inorganic pigment include a black pigment, and metal compounds such as a metal oxide and a metal complex, and specifically, black pigments such as carbon black and titanium black, oxides of metals such as iron, cobalt, aluminum, cadmium, lead, copper, titanium, magnesium, chromium, zinc, and antimony, and composite oxides of the metals.

Examples of the organic pigment include the following pigments. These organic pigments can be used singly or in various combinations.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like C. I. Pigment Orange 2, 5, 13, 16, 17:1, 31, 34, 36, 38, 43, 46, 48, 49, 51, 52, 55, 59, 60, 61, 62, 64, 71, 73, and the like C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279, C. I. Pigment Green 10, C. I. Pigment Violet 1, 19, 23, 27, 32, 37, and 42, C. I. Pigment Blue 1, 2, 22, 60, 64, 66, and 80.

As the dye, the colorants disclosed in, for example, JP1989-90403A (JP-S64-90403A) JP1989-91102A (JP-S64-91102A), JP1989-94301A (JP-H01-94301A), JP1994-11614A (JP-H06-11614A), JP2592207B, U.S. Pat. Nos. 4,808,501A, 5,667,920A, 505,950A, 5,667,920A, JP1993-333207A (JP-H05-333207A), JP1994-35183A (JP-H06-35183A), JP1994-51115A (JP-H06-51115A), and JP1994-194828A (JP-H06-194828A) can be used. In terms of classification based on the chemical structure, it is possible to use a pyrazoleazo compound, a pyrromethene compound, an anilinoazo compound, a triphenylmethane compound, an anthraquinone compound, a benzylidene compound, an oxonol compound, a pyrazolotriazoleazo compound, a pyridoneazo compound, a cyanine compound, a phenothiazine compound, a pyrrolopyrazoleazomethine compound, or the like can be used.

Furthermore, a colorant multimer may be used. The colorant multimer is preferably a dye that is used after being dissolved in a solvent, but may form a particle. In a case where the colorant multimer is the particle, it is usually used in a state of being dispersed in a solvent or the like. The colorant multimer in the particle state can be obtained by, for example, emulsion polymerization, and specific examples thereof include the compounds and production methods described in JP2015-214682A. In addition, examples of the colorant multimer can also use the compounds described in JP2011-213925A, JP2013-041097A, JP2015-028144A, JP2015-030742A, and the like.

Furthermore, as the yellow coloring agent, the quinophthalone compounds described in paragraphs 0011 to 0034 of JP2013-54339A, the quinophthalone compounds described in paragraphs 0013 to 0058 of JP2014-26228A, or the like can also be used.

The content of such other coloring agents in the coloring agent is preferably 20% by mass or less, more preferably 10% by mass or less, and still more preferably 5% by mass or less. It is preferable that such other coloring agents are not substantially contained. The expression, being not substantially contained, means that the content of such other coloring agents in the coloring agent is preferably 0.5% by mass or less, more preferably 0.1% by mass or less, and still more preferably, such other coloring agents are not contained.

Furthermore, the content of the yellow coloring agent in the coloring agent is preferably 5% by mass or less, more preferably 1% by mass or less, and still more preferably, the yellow coloring agent is not substantially contained.

<<Curable Compound>>

The coloring composition of the present invention contains a curable compound. As the curable compound, known compounds which can be crosslinked by a radical, an acid, or heat can be used. Examples thereof include a compound having a group having an ethylenically unsaturated bond (hereinafter also referred to as a polymerizable compound), an epoxy compound (a compound having an epoxy group), and a compound having a methylol group. Examples of the polymerizable compound include a compound having an ethylenically unsaturated bond, such as a vinyl group, a (meth)allyl group, and a (meth)acryloyl group. The polymerizable compound is preferably a radically polymerizable compound.

The content of the curable compound is preferably 0.1% to 50% by mass with respect to the total solid content of the coloring composition. The lower limit is, for example, more preferably 0.5% by mass or more, and still more preferably 1% by mass or more. The upper limit is, for example, more preferably 45% by mass or less, and still more preferably 40% by mass or less. The curable compounds may be used singly or in combination of two or more kinds thereof. In a case where the curable compounds are used in combination of two or more kinds thereof, the total amount thereof preferably falls within the range.

In addition, in a case where the polymerizable compound and the epoxy compound are used in combination, the content of the polymerizable compound is preferably 100 to 600 parts by mass with respect to 100 parts by mass of the epoxy compound. The lower limit is more preferably 150 parts by mass or more. The upper limit is more preferably 550 parts by mass or less.

(Polymerizable Compound (Compound Having Ethylenically Unsaturated Bond))

In the present invention, the polymerizable compound may be, for example, any of chemical forms such as a monomer, a prepolymer, that is, a dimer or a trimer, an oligomer, a mixture thereof, a multimer thereof, and the like. The molecular weight of the monomer type of the polymerizable compound (polymerizable monomer) is preferably 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, and more preferably a trifunctional to hexafunctional (meth)acrylate compound. With regard to these specific examples, reference can be made to the compounds described in paragraphs 0095 to 0108 of JP2009-288705A, paragraph 0227 of JP2013-29760A, and paragraphs 0254 to 0257 of JP2008-292970A, the contents of which are incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), a structure (for example, SR454 and SR499, commercially available from Sartomer Company, Inc.) in which an ethylene glycol or propylene glycol residue is interposed between these (meth)acryloyl groups is preferable. Oligomer types of these can also be used. In addition, KAYARAD RP-1040 and DPCA-20 (manufactured by Nippon Kayaku Co., Ltd.) can also be used. Further, ARONIX M-305, ARONIX M-306, ARONIX M-309, ARONIX M-450, ARONIX M-402, ARONIX TO-1382, and ARONIX TO-2349 (all trade names; manufactured by Toagosei Co., Ltd.) can also be used. In addition, pentaerythritol tetraacrylate (NK ESTER A-TMMT (manufactured by Shin-Nakamura Chemical Co., Ltd.) as a commercially available product) can also be used.

The polymerizable compound may have an acid group such as a carboxyl group, a sulfonic acid group, and a phosphoric acid group. Examples of the commercially available product thereof include ARONIX M-305, ARONIX M-306, ARONIX M-309, ARONIX M-450, ARONIX M-402, ARONIX TO-1382, an ARONIX TO-2349, which are each a polybasic acid-modified acryl oligomer manufactured by Toagosei Co., Ltd.

The acid value of the polymerizable compound having an acid group is preferably 0.1 to 40 mgKOH/g, and particularly preferably 5 to 30 mgKOH/g. In a case where the acid value of the polymerizable compound is 0.1 mgKOH/g or more, the development and dissolution characteristics are good, whereas if the acid value is 40 mgKOH/g or less, it is advantageous in production or handling. In addition, the photopolymerization performance is good and the curability is excellent.

In another preferred aspect, the polymerizable compound is a compound having a caprolactone structure.

The polymerizable compound having a caprolactone structure is commercially available as KAYARAD DPCA series from Nippon Kayaku Co., Ltd., and examples thereof include DPCA-20, DPCA-30, DPCA-60, and DPCA-120.

As the polymerizable compound, a polymerizable compound having an alkyleneoxy group can be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups.

Examples of the commercially available product of the polymerizable compound having an alkyleneoxy group include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

As polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, it is also preferable to use addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A).

Examples of commercially available products thereof include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-306I, AH-600, T-600, and AI-600 (manufactured by KYOEISHA CHEMICAL CO., LTD.).

(Epoxy Compound (Compound Having Epoxy Group))

In the present invention, an epoxy compound can also be used as the curable compound. Examples of the epoxy compound include a compound having one or more epoxy groups per molecule, with a compound having two or more epoxy groups per molecule being preferable. The number of epoxy groups per molecule is preferably 1 to 100. The lower limit is preferably 2 or more. The upper limit can be set to, for example, 10 or less, or to 5 or less.

The epoxy compound in the present invention preferably has a structure having an aromatic ring and/or an aliphatic ring, and more preferably has a structure having an aliphatic ring. The epoxy group is preferably bonded to an aromatic ring and/or an aliphatic ring via a single bond or a linking group. Examples of the linking group include an alkylene group, an arylene group, —O—, —NR'— (R' represents a hydrogen atom, an alkyl group which may have a substituent, or an aryl group which may have a substituent, the hydrogen atom being preferable), —SO$_2$—, —CO—, —O—, —S—, and a group formed by combination thereof. In a case of a compound having an aliphatic ring, a compound in which an epoxy group is bonded to an aliphatic ring via a direct bond (single bond) is preferable. In a case of a compound having an aromatic ring, a compound in which an epoxy group is bonded to an aromatic ring via a linking group is preferable. The linking group is preferably an alkylene group, or a group formed by combination of an alkylene group with —O—. In addition, as the compound having an epoxy group, a compound having a structure in which 2 or more aromatic rings are linked to a hydrocarbon group can also be used. The hydrocarbon group is preferably an alkylene group having 1 to 6 carbon atoms. The epoxy group is preferably linked via the linking group.

The epoxy equivalents (=the molecular weight of the epoxy compound/the number of epoxy groups) of the epoxy compound is preferably 500 g/eq or less, more preferably 100 to 400 g/eq, and still more preferably 100 to 300 g/eq.

The epoxy compound may be either a low molecular compound (for example, a molecular weight of less than 2,000, and further a molecular weight of less than 1,000) or a polymer compound (macromolecule) (for example, a molecular weight of 1,000 or more, and in the case of a polymer, a weight-average molecular weight of 1,000 or more). The weight-average molecular weight of the epoxy compound is preferably 200 to 100,000, and more preferably 500 to 50,000. The upper limit of the weight-average molecular weight is preferably 10,000 or less, more preferably 5,000 or less, and still more preferably 3,000 or less.

As the epoxy compound, the compounds described in paragraphs 0034 to 0036 of JP2013-011869A, paragraphs 0147 to 0156 of JP2014-043556A, or paragraphs 0085 to 0092 of JP2014-089408A can also be used, the contents of the publications are incorporated herein by reference, can also be used. Examples of the commercially available products thereof include jER825, jER827, jER828, jER834, jER1001, jER1002, jER1003, jER1055, jER1007, jER1009, and jER1010 (all manufactured by Japan Epoxy Resins Co., Ltd.), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Japan Epoxy Resins Co., Ltd.), EPICLON830 and EPICLON835 (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Japan Epoxy Resins Co., Ltd.), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (all manufactured by Nippon Kayaku Co., Ltd.) as a cresol novolac type epoxy resin; and ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Chemical Industries, Ltd.), and DENACOL EX-212L, EX-214L, EX-216L, EX-321L, and EX-850L (all manufactured by Nagase ChemteX Corporation) as an aliphatic epoxy resin. Other examples include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Mitsubishi Chemical Corporation).

Furthermore, a compound represented by Formula (EP1) can also be used as the epoxy compound.

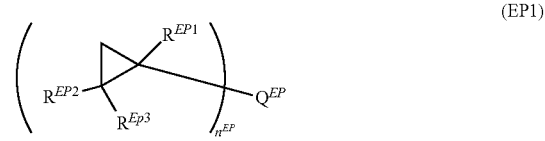

(EP1)

In Formula (EP1), $R^{EP1}$ to $R^{EP3}$ each represent a hydrogen atom, a halogen atom, or an alkyl group, in which the alkyl group may have a cyclic structure or may have a substituent. $R^{EP1}$ and $R^{EP2}$, or $R^{EP2}$ and $R^{EP3}$ may be bonded with each other to form a cyclic structure. $Q^{EP}$ represents a single bond or an $n^{EP}$-valent organic group. $R^{EP1}$ to $R^{EP3}$ may also be bonded to $Q^{EP}$ to form a cyclic structure. $n^{EP}$ represents an integer of 1 or more, preferably 2 to 10, and more preferably 2 to 6. Incidentally, in a case where $Q^{EP}$ is a single bond, $n^{EP}$ is 2.

With reference to the details of $R^{EP1}$ to $R^{EP3}$, or $Q^{EP}$, reference can be made to the description in paragraphs 0087 and 0088 of JP2014-089408A, the contents of which are incorporated herein by reference. Specific examples of the compound represented by Formula (EP1) include glycidyl trityl ether, and also include well as the compounds described in paragraph 0090 of JP2014-089408A, the contents of which are incorporated herein by reference.

In a case where the epoxy compound is used as the curable compound, the content of the epoxy compound is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. The epoxy compound may be used singly or in combination of two or more kinds thereof. In a case where the epoxy compounds are used in combination of two or more kinds thereof, the total amount thereof preferably falls within the range.

In addition, the content of the epoxy compound is preferably 1% to 80% by mass, and more preferably 1% to 50% by mass, with respect to the total mass of the curable compound.

<<Pigment Derivative>>

The coloring composition of the present invention contains at least contains a pigment derivative including at least a basic pigment derivative. The basic pigment derivative is preferably a compound having a structure resulting from substitution of a portion of a chromophore with a basic group.

Examples of the chromophore for constituting the pigment derivative include a quinoline-based skeleton, a benzoimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton, among which the quinoline-based skeleton, the benzoimidazolone-based skeleton, the diketopyrrolopyrrole-based skeleton, the azo-based skeleton, the quinophthalone-based skeleton, the isoindoline-based skeleton, and the phthalocyanine-based skeleton are preferable, and the azo-based skeleton and the benzoimidazolone-based skeleton are more preferable.

The basic group contained in the basic pigment derivative is preferably an amino group, and more preferably a tertiary amino group. The basic pigment derivative is more preferably a basic pigment derivative having at least one selected from an azo-based skeleton and a benzoimidazolone-based skeleton, and still more preferably a basic pigment derivative having an azo-based skeleton and a benzoimidazolone-based skeleton. According to this aspect, the dispersibility of a phthalocyanine pigment (particularly an aluminum phthalocyanine pigment) is excellent.

The pigment derivative is preferably a compound represented by Formula (P).

$$A\text{-}L\text{-}(E)_t \quad (P)$$

In Formula (P), A represents a chromophore, L represents a (t+1)-valent linking group, E represents a basic group, and t represents an integer of 1 or more.

In Formula (P), A represents a chromophore, and is preferably a chromophore having a skeleton selected from a quinoline-based skeleton, a benzoimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton, more preferably a chromophore having a skeleton selected from a quinoline-based skeleton, a benzoimidazolone-based skeleton, a diketopyrrolopyrrole-based skeleton, an azo-based skeleton, a quinophthalone-based skeleton, an isoindoline-based skeleton, and a phthalocyanine-based skeleton, and still more preferably a chromophore having a skeleton selected from an azo-based skeleton and a benzoimidazolone-based skeleton.

In Formula (P), L represents a (t+1)-valent linking group.

As the linking group, a group formed of 1 to 100 carbon atoms, 0 to 10 nitrogen atoms, 0 to 50 oxygen atoms, 1 to 200 hydrogen atoms, and 0 to 20 sulfur atoms is preferable, and the group may be unsubstituted or further have a substituent. Examples of the linking group include an alkylene group, an arylene group, a heteroarylene group, —NR—, —CO—, —CO$_2$—, —SO$_2$—, —O—, —S—, and a group formed by combination thereof.

L preferably includes at least one of structures represented by Formulae (PA-4) to (PA-9), and more preferably includes at least one of structures represented by Formulae (PA-6) to (PA-9).

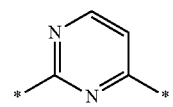

(PA-4)

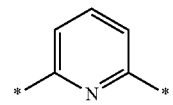

(PA-5)

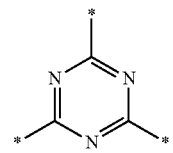

(PA-6)

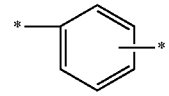

(PA-7)

(PA-8)

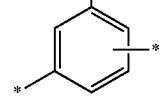

(PA-9)

E represents a basic group. Examples of the basic group include Formulae (X-3) to (X-9), with (X-3) being preferable.

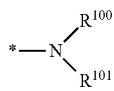

(X-3)

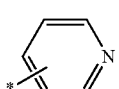

(X-4)

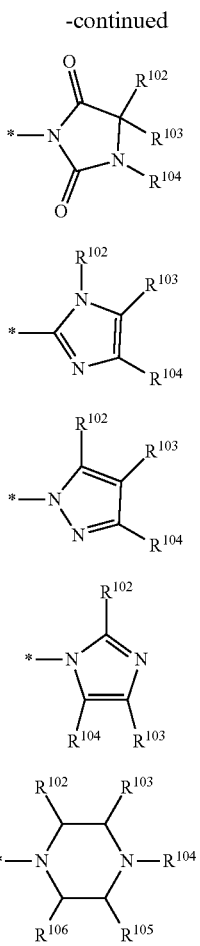

(X-5)

(X-6)

(X-7)

(X-8)

(X-9)

In the formulae, * represents a linking arm to L of Formula (P), $R^{100}$ to $R^{106}$ each independently represent a hydrogen atom, an alkyl group, or an aryl group, and $R^{100}$ and $R^{101}$ may be linked to form a ring.

The alkyl group may be linear, branched, or cyclic. The number of carbon atoms of the linear alkyl group is preferably 1 to 20, more preferably 1 to 12, and still more preferably 1 to 8. The number of carbon atoms of the branched alkyl group is preferably 3 to 20, more preferably 3 to 12, and still more preferably 3 to 8. The cyclic alkyl group may be either monocyclic or polycyclic. The number of carbon atoms of the cyclic alkyl group is preferably 3 to 20, more preferably 4 to 10, and still more preferably 6 to 10.

The number of carbon atoms of the aryl group is preferably 6 to 18, more preferably 6 to 14, and still more preferably 6 to 10.

$R^{100}$ and $R^{101}$ may be linked to form a ring. The ring may be alicyclic or an aromatic ring. The ring may be either a monocycle or a polycycle. In a case where $R^{100}$ and $R^{101}$ are bonded to form a ring, they may be linked via a divalent linking group selected from the group consisting of a linking group, —CO—, —O—, —NH—, a divalent aliphatic group, a divalent aromatic group, and a combination thereof. Specific examples of the ring include a piperazine ring, a pyrrolidine ring, a pyrrole ring, a piperidine ring, a pyridine ring, an imidazole ring, a pyrazole ring, an oxazole ring, a thiazole ring, a pyrazine ring, a morpholine ring, a thiazine ring, an indole ring, an isoindole ring, a benzoimidazole ring, a purine ring, a quinoline ring, an isoquinoline ring, a quinoxaline ring, a cinnoline ring, and a carbazole ring.

In Formula (P), t represents an integer of 1 or more. The upper limit of t represents the number of the substituents which can be taken by the chromophore A. For example, the upper limit of t is preferably 10 or less, and more preferably 5 or less. Further, the lower limit of t is preferably 2 or more. In a case where t is 2 or more, a plurality of E's may be different from each other.

The basic pigment derivative is preferably a compound represented by Formula (P1).

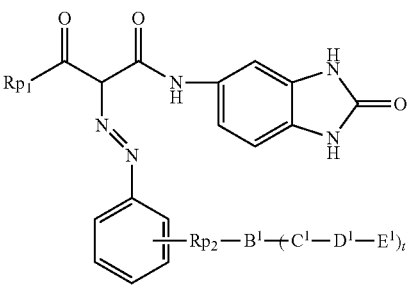

(P1)

In Formula (P1), $Rp_1$ represents an alkyl group or an aryl group, $Rp_2$ represents a single bond, —NR—, —CO—, —CO$_2$—, —SO$_2$—, —O—, —S—, or a group formed of a combination thereof, and R represents a hydrogen atom, an alkyl group, or an aryl group, $B^1$ represents a single bond or a (t+1)-valent linking group, $C^1$ represents a single bond, —NR—, —CO—, —CO$_2$—, —SO$_2$—, —O—, —S—, or a group formed by combination thereof, and R represents a hydrogen atom, an alkyl group, or an aryl group, $D^1$ represents a single bond, an alkylene group, or an arylene group, $E^1$ represents —NR$^{100}$R$^{101}$, $R^{100}$ and $R^{101}$ each independently represent a hydrogen atom, an alkyl group, or an aryl group, and $R^{100}$ and $R^{101}$ may be linked to form a ring, and t represents an integer of 1 to 5.

$Rp_1$ is preferably a methyl group or a phenyl group, and most preferably a methyl group.

$Rp_2$ represents a single bond, —NR—, —CO—, —CO$_2$—, —SO$_2$—, —O—, —S—, or a group formed by combination thereof, and R represents a hydrogen atom, an alkyl group, or an aryl group. Examples of the alkyl group represented by R include linear, branched, and cyclic alkyl groups, with the linear or branched alkyl group being preferable. The number of carbon atoms of the alkyl group is preferably 1 to 10, and more preferably 1 to 5. The number of carbon atoms of the aryl group represented by R is preferably 6 to 30, more preferably 6 to 20, and still more preferably 6 to 12. R is preferably a hydrogen atom. Examples of the combination of the groups include —NRCO—, —CONR—, —SO$_2$NR—, and —NRSO$_2$—.

$B^1$ represents a single bond, or a (t+1)-valent linking group. Examples of the (t+1)-valent linking group include an alkylene group, an arylene group, and a heteroarylene group. Examples of the alkylene group include linear, branched, and cyclic alkylene groups.

The (t+1)-valent linking group is preferably a linking group represented by Formulae (PA-4) to (PA-9). * represents a linking moiety between $Rp_2$ and $C^1$.

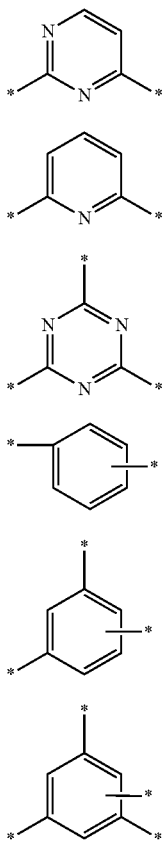

(PA-4)
(PA-5)
(PA-6)
(PA-7)
(PA-8)
(PA-9)

$C^1$ represents a single bond, —NR—, —CO—, —$CO_2$—, —$SO_2$—, —O—, —S—, or a group formed by combination thereof. Examples of the combination of the groups include —NRCO—, —CONR—, —$SO_2$NR—, and —NR$SO_2$—. $C^1$ is preferably —NR—, —NRCO—, —CONR—, —$SO_2$NR—, or —NR$SO_2$—, and more preferably —NR—, —NRCO—, or —CONR—. R represents a hydrogen atom, an alkyl group, or an aryl group. Preferred examples of the alkyl group and the aryl group represented by R are the same as the above-mentioned ranges. R is preferably a hydrogen atom.

$D^1$ represents a single bond, an alkylene group, or an arylene group. Examples thereof include a methylene group, an ethylene group, a propylene group, a butylene group, a pentylene group, a hexylene group, a decylene group, a cyclopropylene group, a cyclobutylene group, a cyclopentylene group, a cyclohexylene group, a cyclooctylene group, a cyclodecylene group, a phenylene group, and a naphthylene group. $D^1$ is preferably a linear alkylene group, and more preferably a linear alkylene group having carbon atoms 1 to 5.

$E^1$ represents —$NR^{100}R^{101}$. $R^{100}$ and $R^{101}$ each independently represent a hydrogen atom, an alkyl group, or an aryl group, and $R^{100}$ and $R^{101}$ may be linked to form a ring.

t is preferably 1 or 2, and more preferably 2.

Specific examples of the basic pigment derivative are shown below, but the present invention is not limited thereto. In addition, with regard to the pigment derivative, reference can be made to the descriptions in paragraphs 0162 to 0183 of JP2011-252065A, the contents of which are incorporated herein by reference.

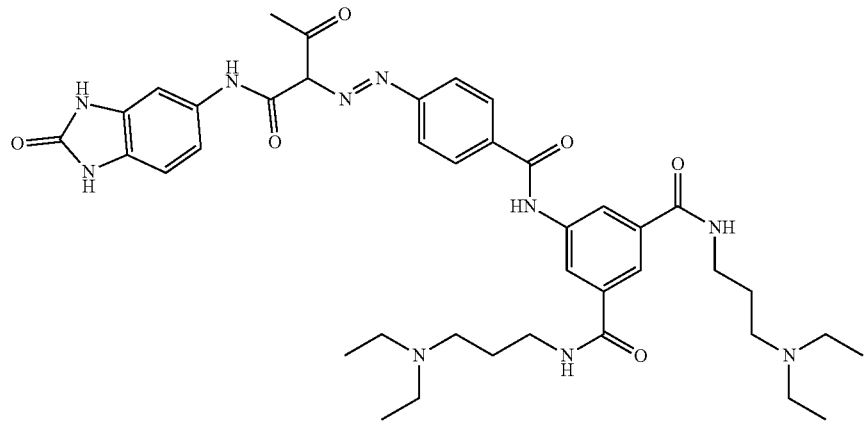

B-1

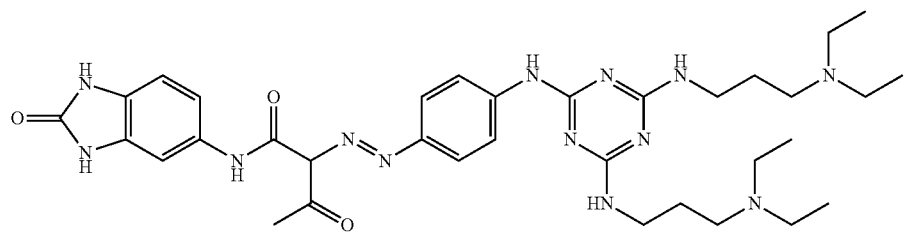

B-2

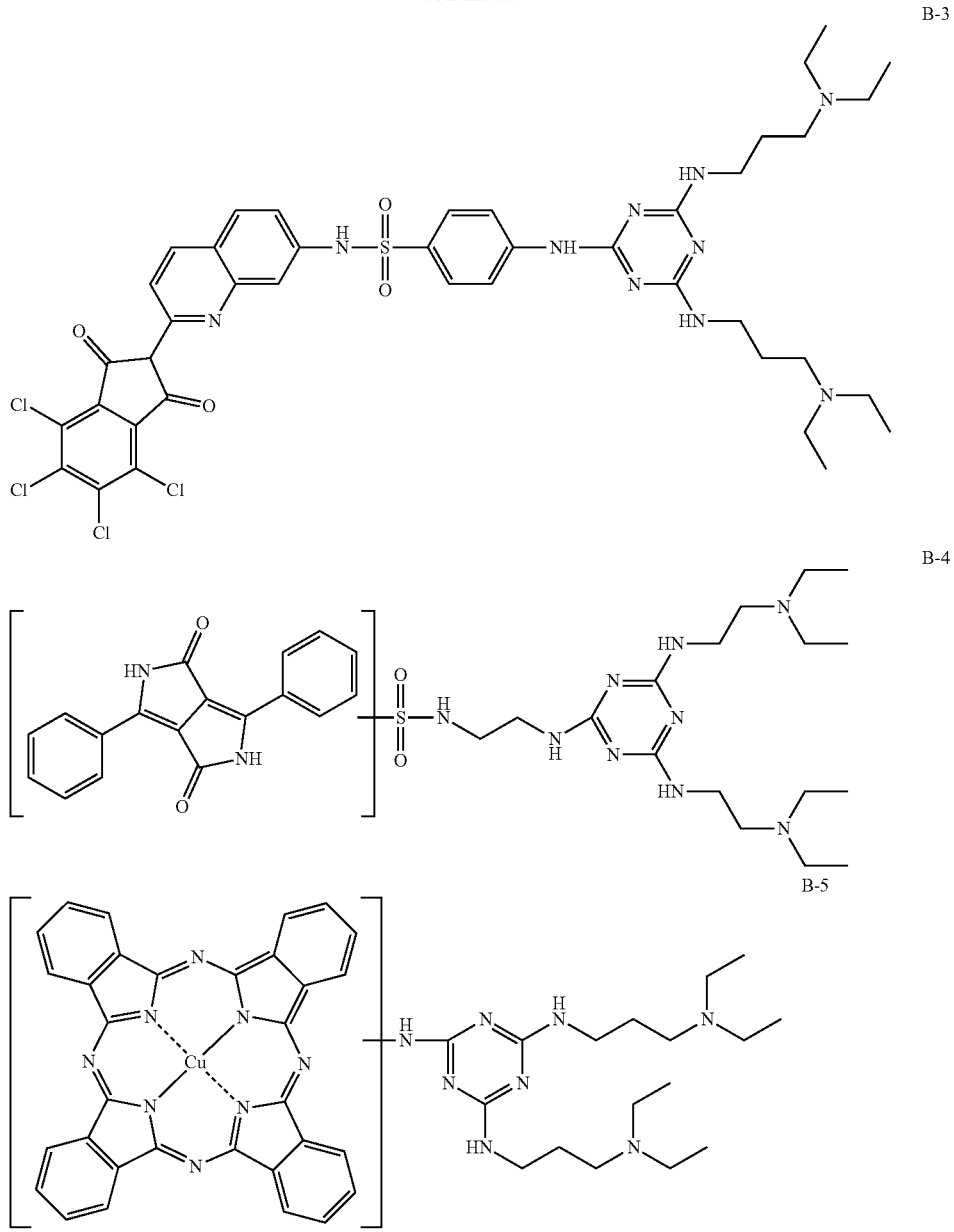

In the present invention, as the pigment derivative, a compound (acidic pigment derivative) having a structure resulting from substitution of a portion of an organic pigment with an acid group can also be used. As for the acidic pigment derivative, the content of the acidic pigment derivative in the total mass of the pigment derivative is preferably 10% by mass or less, more preferably 5% by mass or less, and still more preferably, the acidic pigment derivative is not substantially included. The expression, "substantially not including the acidic pigment derivative" means that the content of the acidic pigment derivative in the total mass of the pigment derivative is preferably 1% by mass or less, more preferably 0.5% by mass or less, and still more preferably, the acidic pigment derivative is not contained.

The content of the pigment derivative of the coloring composition of the present invention is preferably 1% to 30% by mass, and more preferably 3% to 20% by mass, with respect to the total mass of the pigment. Further, the content of the basic pigment derivative is preferably 1% to 30% by mass, and more preferably 3% to 20% by mass, with respect to the total mass of the pigment. The pigment derivative may be used singly or in combination of two or more kinds thereof.

<<Resin>>

The coloring composition of the present invention preferably includes a resin. The resin is blended in, for example, applications for dispersing a pigment or the like in a composition or blended as a binder. Further, a resin which usually used to disperse a pigment may also be referred to as a dispersant, but such an application of the resin is merely an example, and the resin can also be used for purposes other than such the applications.

The content of the resin in the coloring composition of the present invention is preferably 1% to 80% by mass, with respect to the total solid content of the coloring composition.

The lower limit is preferably 5% by mass or more, and more preferably 10% by mass or more. The upper limit of the content is preferably 70% by mass or less, and more preferably 60% by mass or less.

<<<Dispersant>>>

The coloring composition of the present invention preferably includes a dispersant as a resin.

The dispersant preferably includes one or more selected from an acidic resin, a basic resin, and an amphoteric resin, more preferably includes the acidic resin and/or the amphoteric resin, and still more preferably includes the acidic resin. According to this aspect, there is tendency that the dispersibility of a coloring agent (particularly an aluminum phthalocyanine pigment) is good and the temporal stability of a coloring composition is improved. In addition, the residual color mixture with other layers after pattern formation, or the like can be effectively suppressed.

In the present invention, the acidic resin means a resin having an acid group, which has an acid value of 5 mgKOH/g or more and an amine value of less than 5 mgKOH/g. It is preferable that the acidic resin does not have a basic group. Examples of the acid group contained in an acidic resin include a carboxyl group, a phosphoric acid group, a sulfonic acid group, and a phenolic hydroxyl group, with the carboxyl group being preferable. The acid value of the acidic resin is preferably 5 to 200 mgKOH/g. The lower limit is more preferably 10 mgKOH/g or more, and still more preferably 20 mgKOH/g or more. The upper limit is more preferably 100 mgKOH/g or less, and still more preferably 60 mgKOH/g or less. Further, the amine value of the acidic resin is preferably 2 mgKOH/g or less, and more preferably 1 mgKOH/g or less.

In the present invention, the basic resin means a resin having a basic group, which has an amine value of 5 mgKOH/g or more and an acid value of less than 5 mgKOH/g. It is preferable that the basic resin does not have an acid group. The basic group contained in the basic resin is preferably an amino group. The amine value of the basic resin is preferably 5 to 200 mgKOH/g, more preferably 5 to 150 mgKOH/g, and still more preferably 5 to 100 mgKOH/g.

In the present invention, the amphoteric resin means a resin having an acid group and a basic group, which has an acid value of 5 mgKOH/g or more and an amine value of 5 mgKOH/g or more. Examples of the acid group include the groups described above, with the carboxyl group being preferable. As the basic group, an amino group is preferable.

It is preferable that the amphoteric resin has an acid value of 5 mgKOH/g or more and an amine value of 5 mgKOH/g or more. The acid value is preferably 5 to 200 mgKOH/g. The lower limit is more preferably 10 mgKOH/g or more, and still more preferably 20 mgKOH/g or more. The upper limit of the content is more preferably 150 mgKOH/g or less, and still more preferably 100 mgKOH/g or less.

The amine value is preferably 5 to 200 mgKOH/g. The lower limit is more preferably 10 mgKOH/g or more, and still more preferably 20 mgKOH/g or more. The upper limit is more preferably 150 mgKOH/g or less, and still more preferably 100 mgKOH/g or less. The ratio of the acid value to the amine value of the amphoteric resin is as follows: the acid value:amine value is preferably 1:4 to 4:1, and more preferably 1:3 to 3:1. In a case where the ratio of the acid value to the amine value falls within the range, both of the dispersibility of a coloring agent (particularly an aluminum phthalocyanine pigment) is good.

Examples of the dispersant include polymer dispersants [for example, a polyamidoamine and a salt thereof, a polycarboxylic acid and a salt thereof, an unsaturated polymer acid ester, a modified polyurethane, a modified polyester, a modified poly(meth)acrylate, a (meth)acrylic copolymer, and a naphthalenesulfonic acid/formalin condensate], a polyoxyethylene alkyl phosphate ester, a polyoxyethylene alkylamine, and an alkanolamine.

The polymer dispersant can further be classified into a linear polymer, a terminal-modified polymer, a graft type polymer, and a block type polymer, depending on its structure. The polymer dispersant is adsorbed on a surface of a pigment and reacts so as to prevent re-aggregation. As a result, examples of a preferable structure thereof include a terminal-modified polymer, a graft type polymer, and a block type polymer, which have an anchoring site on a surface of a pigment. Further, the dispersants described in paragraphs 0028 to 0124 of JP2011-070156A or the dispersants described in JP2007-277514A are also preferably used, the contents of which are incorporated herein by reference.

As the dispersant, a resin represented by Formula (D) is also preferably used.

$$(A^{10}\text{-}L^{11})_n\text{-}L^{10}\text{-}(L^{12}\text{-}P^{10})_k \quad (D)$$

In Formula (D), $L^{10}$ represents an (n+k)-valent linking group, $L^{11}$ and $L^{12}$ each independently represent a single bond or a divalent linking group, $A^{10}$ represents a monovalent organic group including at least one site selected from a colorant structure, a heterocyclic structure, an acidic group, a group having a basic nitrogen atom, a urea group, a urethane group, a group having a coordinative oxygen atom, a hydrocarbon group having 4 or more carbon atoms, an alkoxysilyl group, an epoxy group, an isocyanate group, and a hydroxyl group, and n $A^{10}$'s and $L^{11}$'s may be each independently the same as or different from each other. k $L^{12}$'s may be the same as or different from each other. k represents 1 to 8, n represents 2 to 9, and m+n satisfies 3 to 10. $P^{10}$ represents a monovalent polymer chain having a repeating unit.

With regard to details of $L^{10}$ to $L^{12}$ and $P^{10}$, reference can be made to paragraphs 0071 to 0098 of JP2007-277514A, the contents of which are incorporated herein by reference.

In Formula (1), $A^{10}$ represents a monovalent organic group including at least one site selected from a colorant structure, a heterocyclic structure, an acidic group, a group having a basic nitrogen atom, a urea group, a urethane group, a group having a coordinative oxygen atom, a hydrocarbon group having 4 or more carbon atoms, an alkoxysilyl group, an epoxy group, an isocyanate group, and a hydroxyl group. With regard to details of the monovalent organic group, reference can be made to paragraphs 0041 to 0070 of JP2007-277514A, the contents of which are incorporated herein by reference.

Specific examples of the resin represented by Formula (D) include the resins described in paragraphs 0327 to 0347 of JP2007-277514A, the contents of which are incorporated herein by reference.

As the resin (dispersant), a graft copolymer including a repeating unit represented by any one of Formulae (1) to (4) can also be used.

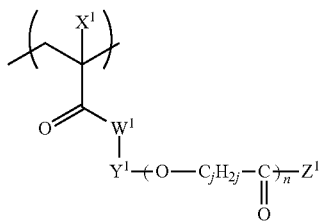

(1)

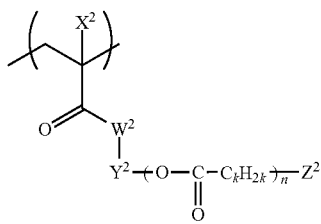

(2)

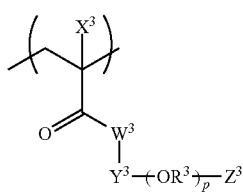

(3)

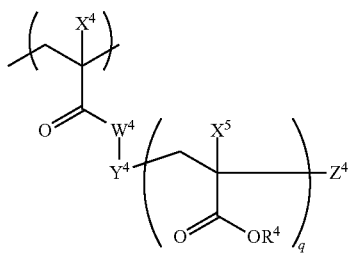

(4)

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom, a monovalent organic group, or a halogen atom, $Y^1$, $Y^2$, $Y^3$, and $Y^4$ each independently represent a divalent linking group, $Z^1$, $Z^2$, $Z^3$, and $Z^4$ each independently represent a monovalent organic group, $R^3$ represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, $R^3$'s which are present in plural numbers may be the same as or different from each other, and in Formula (4), in a case where q is 2 to 500, $X^5$'s and $R^4$'s which are present in plural numbers may be the same as or different from each other.

$W^1$, $W^2$, $W^3$, and $W^4$ are each preferably an oxygen atom. $X^1$, $X^2$, $X^3$, $X^4$, and $X^5$ are each preferably a hydrogen atom or an alkyl group having 1 to 12 carbon atoms, and are each independently more preferably a hydrogen atom or methyl group, and particularly preferably methyl groups. $Y^1$, $Y^2$, $Y^3$, and $Y^4$ each independently represent a divalent linking group, and the linking group is not particularly limited in their structures. The structure of the monovalent organic group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is particularly preferable that Z, $Z^2$, $Z^3$, and $Z^4$ each independently represent an alkyl group or an alkoxy group having 5 to 24 carbon atoms, and among these, they are each independently particularly preferably a branched alkyl group having 5 to 24 carbon atoms, a cyclic alkyl group having 5 to 24 carbon atoms, or an alkoxy group having 5 to 24 carbon atoms. In addition, the alkyl group included in the alkoxy group may be linear, branched, or cyclic.

In Formulae (1) to (4), n, m, p, and q are each independently an integer of 1 to 500. Further, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (4), $R^4$ represents a hydrogen atom or a monovalent organic group, and the monovalent organic group is not particularly limited in terms of its structure. Preferred examples of $R^4$ include a hydrogen atom, an alkyl group, an aryl group, and a heteroaryl group, with the hydrogen atom or the alkyl group being preferable. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is particularly preferable. In Formula (4), in a case where q is 2 to 500, $X^5$'s and $R^4$'s which are present in plural numbers in a graft copolymer may be the same as or different from each other.

With regard to details of the graft copolymer, reference can be made to the descriptions in paragraphs 0025 to 0094 of JP2012-255128A, the contents of which are incorporated herein by reference. Specific examples of the graft copolymer include the following resins. Other examples thereof include the resins described in paragraphs 0072 to 0094 of JP2012-255128A, the contents of which are incorporated herein by reference.

31 32
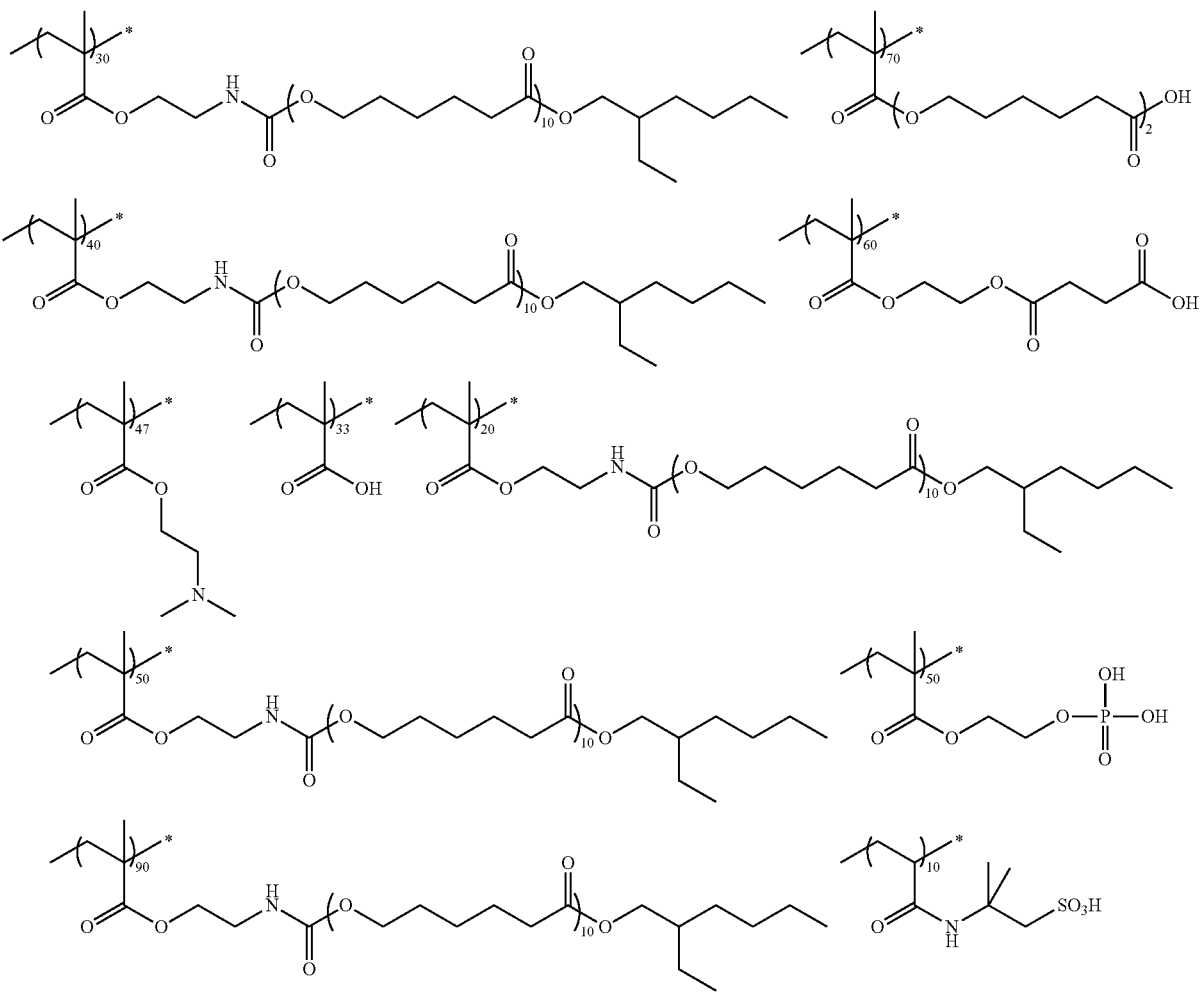
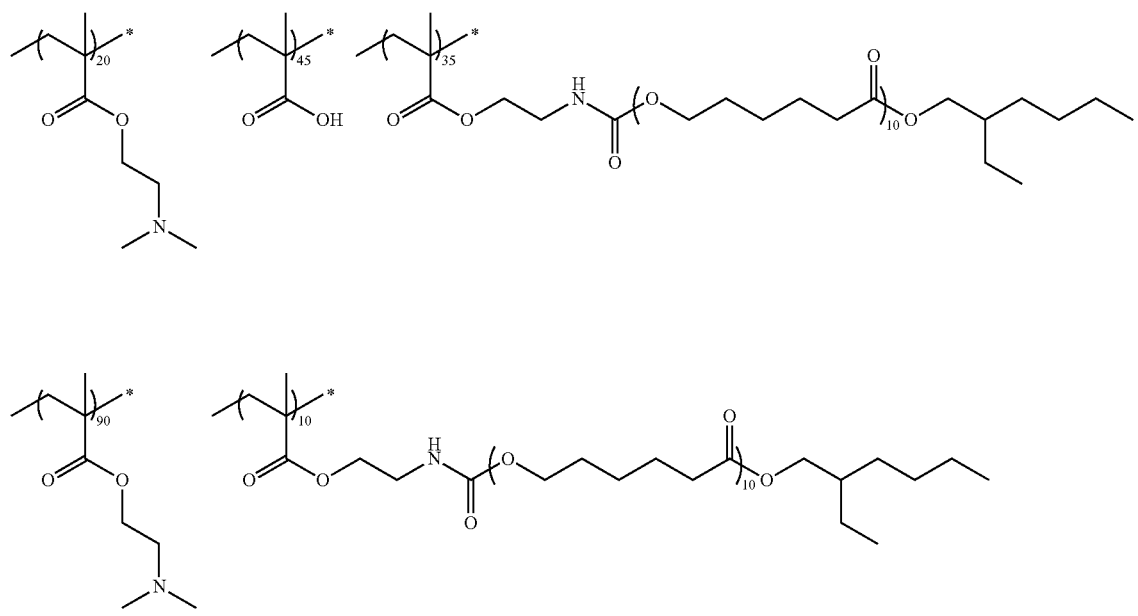

Moreover, as the resin, an oligoimine-based dispersant having a nitrogen atom in at least one of the main chain or a side chain can also be used. As the oligoimine-based dispersant, a resin including a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity.

Examples of the oligoimine-based dispersant include a dispersant including a repeating unit represented by Formula (I-1), a repeating unit represented by Formula (1-2), and/or a repeating unit represented by Formula (I-2a).

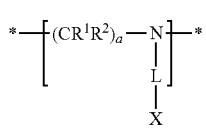  (I-1)

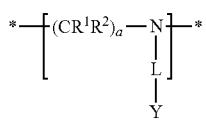  (I-2)

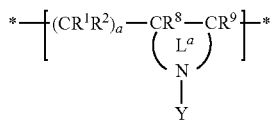  (I-2a)

$R^1$ and $R^2$ each independently represent a hydrogen atom, a halogen atom or an alkyl group (preferably having 1 to 6 carbon atoms). a's each independently represent an integer from 1 to 5. * represents a linking moiety between the repeating units.

$R^8$ and $R^9$ are each independently a group having the same definition as $R^1$.

L is a single bond, an alkylene group (which preferably has 1 to 6 carbon atoms), an alkenylene group (which preferably has 2 to 6 carbon atoms), an arylene group (which preferably has 6 to 24 carbon atoms), a heteroarylene group (which preferably has 1 to 6 carbon atoms), an imino group (which preferably has 0 to 6 carbon atoms), an ether group, a thioether group, a carbonyl group, or a linking group which is related to a combination thereof. Among these, a single bond or —$CR^5R^6$—$NR^7$— (an imino group bonds with X or Y) is preferable. Here, $R^5$ and $R^6$ each independently represent a hydrogen atom, a halogen atom or an alkyl group (which preferably has 1 to 6 carbon atoms). $R^7$ is a hydrogen atom or an alkyl group which has 1 to 6 carbon atoms.

$L^a$ is a structural site which forms a cyclic structure along with $CR^8CR^9$ and N, and is preferably a structural site which forms a non-aromatic heterocycle which has 3 to 7 carbon atoms along with the carbon atoms of $CR^8CR^9$. A structural site which forms a non-aromatic heterocycle which has 5 to 7 members along with the carbon atoms of $CR^8CR^9$ and N (a nitrogen atom) is more preferable, a structural site which forms a non-aromatic heterocycle which has 5 members is even more preferable, and a structural site which forms pyrrolidine is particularly preferable. Here, the structural site may further have a substituent such as an alkyl group.

X represents a group which has a functional group with a pKa of 14 or less.

Y represents a side chain having 40 to 10,000 atoms.

The dispersant (oligoimine-based dispersant) may further contain one or more selected from repeating units represented by Formulae (1-3), (1-4), and (1-5) as a copolymerization component. It is possible to further improve the dispersibility of the pigment by incorporating such a repeating unit into the dispersant.

  (I-3)

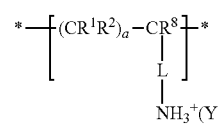  (I-4)

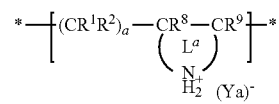  (I-5)

$R^1$, $R^2$, $R^8$, $R^9$, L, $L^a$, a, and * have the same definitions as in Formulae (I-1), (1-2), and (I-2a).

Ya represents a side chain having 40 to 10,000 atoms, which has an anion group. The repeating unit represented by Formula (I-3) can be formed by performing a reaction by adding an oligomer or polymer having a group capable of forming a salt by the reaction with an amine to a resin having a primary or secondary amino group in a main chain portion.

With regard to details of the oligoimine-based dispersant, reference can be made to the descriptions in paragraphs 0102 to 0166 of JP2012-255128A, the contents of which are incorporated herein by reference. Specific examples of the oligoimine-based dispersant include the following ones. Further, the resins described in paragraphs 0168 to 0174 of JP2012-255128A can be used.

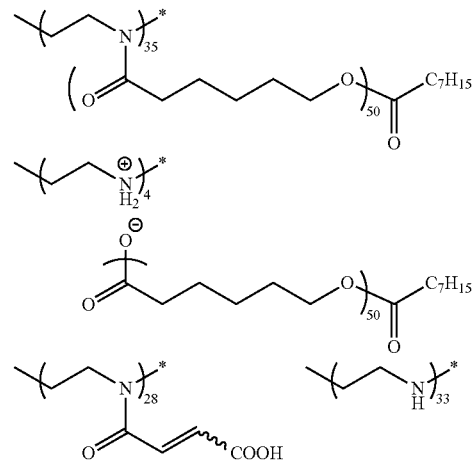

The dispersant is also available as a commercially available product, and specific examples thereof include "DA-7301" manufactured by Kusumoto Chemicals, Ltd., "Disperbyk-101 (polyamidoamine phosphate), 107 (carboxylic acid ester), 110 (copolymer including an acid group), 111

(phosphoric acid-based dispersant), 130 (polyamide), 161, 162, 163, 164, 165, 166, and 170 (polymeric copolymers)", and "BYK-P104 and P105 (unsaturated, high-molecular-weight polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (polymer polycarboxylate), 6220 (fatty acid polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalene sulfonate formaldehyde condensate), MS, C, and SN-B (aromatic sulfonate formaldehyde condensate)", "HOMOGENOL L-18 (polymeric polycarboxylic acid)", "EMULGEN 920, 930, 935, and 985 (polyoxyethylene nonyl phenyl ether)", and "ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional portion in the terminal portion), and 24000, 28000, 32000, and 38500 (graft polymers)" manufactured by The Lubrizol Corporation, "NIKKOL T106 (polyoxyethylene sorbitan monooleate) and MYS-IEX (polyoxyethylene monostearate)" manufactured by NIKKO CHEMICALS Co., Ltd., "HINOACT T-8000E" manufactured by Kawaken Fine Chemicals Co., Ltd., "Organosiloxane Polymer KP-341" manufactured by Shin-Etsu Chemical Co., Ltd., "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, polymer dispersants such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA CORPORATION, and "IONET (trade name) S-20" manufactured by Sanyo Chemical Industries, Ltd.

Furthermore, the resins described for the dispersant can also be used in applications other than those as dispersants. For example, the resins can also be used as a binder.

<<<Alkali-Soluble Resin>>>

The coloring composition of the present invention can contain an alkali-soluble resin as the resin. By incorporation of the alkali-soluble resin, the developability or the pattern formability are improved. In addition, the alkali-soluble resin can also be used as a dispersant or a binder.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin may be a linear organic high-molecular-weight polymer, and can be appropriately selected from alkali-soluble resins having at least one group enhancing alkali solubility in a molecule (preferably a molecule having an acrylic copolymer or a styrene-based copolymer as a main chain).

From the viewpoint of heat resistance, the alkali-soluble resin is preferably a polyhydroxystyrene-based resin, a polysiloxane-based resin, an acrylic resin, an acrylamide-based resin, or an acryl/acrylamide copolymer resin, and further, from the viewpoint of controlling developability, the alkali-soluble resin is preferably an acrylic resin, an acrylamide-based resin, or an acryl/acrylamide copolymer resin.

Examples of the group enhancing alkali solubility (hereinafter also referred to as an acid group) include a carboxyl group, a phosphoric acid group, a sulfonic acid group, and a phenolic hydroxyl group. The group enhancing alkali solubility is preferably a group which is soluble in an organic solvent and can be developed by an aqueous weak alkaline solution, and particularly preferred examples thereof include (meth)acrylic acid. These acid groups may be used singly or in combination of two or more kinds thereof.

The alkali-soluble resin is preferably a polymer having a carboxyl group in a side chain, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, as other monomers, the N-position-substituted maleimide monomers described in JP1998-300922A (JP-H10-300922A) can also be used. Specific examples thereof include N-phenylmaleimide and N-cyclohexylmaleimide. In addition, other monomers copolymerizable with a (meth)acrylic acid may be used singly or in combination of two or more kinds thereof.

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. As the alkali-soluble resin, those obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl (meth)acrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can be preferably used. In addition, as a commercially available product thereof, for example, FF-426 (manufactured by Fujikura Kasei Co., Ltd.) or the like can also be used.

Moreover, as the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Chemical Industries, Ltd.), EBECRYL 3800 (manufactured by Daicel-UCB Co., Ltd.), ACRYCURE RD-F8 (manufactured by Nippon Shokubai Co., Ltd.), and DP-1305 (manufactured by FUJIFINE Chemical CORPORATION).

It is also preferable that the alkali-soluble resin includes a polymer obtained by polymerizing monomer components including a compound represented by Formula (ED1) and/or the compound represented by Formula (1) of JP2010-168539A (these compounds are hereinafter also referred to as an "ether dimer" in some cases).

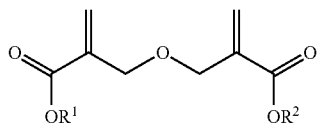

(ED1)

In Formula (ED1), $R^1$ and $R^2$ each independently represent a hydrogen atom or a hydrocarbon group having 1 to 25 carbon atoms, which may have a substituent.

Specific examples of the ether dimer include those described in paragraph 0317 of JP2013-29760A, the contents of which are incorporated herein by reference. These ether dimers may be of one kind or of two or more kinds.

The alkali-soluble resin may include a repeating unit derived from a compound represented by Formula (X).

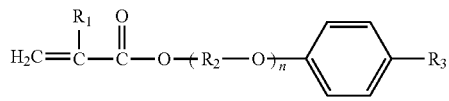

(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may include a benzene ring, and n represents an integer of 1 to 15.

In Formula (X), the number of carbon atoms in the alkylene group of $R_2$ is preferably 2 or 3. Further, the number of carbon atoms in the alkyl group of $R_3$ is 1 to 20, and more preferably 1 to 10, and the alkyl group of $R_3$ may include a benzene ring. Examples of the alkyl group including a benzene ring, represented by $R_3$, include a benzyl group and a 2-phenyl(iso)propyl group.

With regard to the alkali-soluble resin, reference can be made to the descriptions in paragraphs 0558 to 0571 of JP2012-208494A ([0685] to [0700] of the corresponding US2012/0235099A), the contents of which are incorporated herein by reference. Moreover, it is possible to use the copolymers (B) described in paragraphs 0029 to 0063 of JP2012-32767A and the alkali-soluble resins used in Examples of the document; the binder resins described in paragraphs 0088 to 0098 of JP2012-208474A and the binder resins used in Examples of the document; the binder resins described in paragraphs 0022 to 0032 of JP2012-137531A and the binder resins in Examples of the document; the binder resins described in paragraphs 0132 to 0143 of JP2013-024934A and the binder resins used in Examples of the document; the binder resins described in paragraphs 0092 to 0098 of JP2011-242752A and used in Examples; or the binder resins described in paragraphs 0030 to 0072 of JP2012-032770A, the contents of which are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and most preferably 120 mgKOH/g or less.

The content of the alkali-soluble resin is preferably 1% to 80% by mass with respect to the total solid content of the coloring composition. The lower limit is preferably 2% by mass or more, and more preferably 3% by mass or more. The upper limit is preferably 70% by mass or less, and more preferably 60% by mass or less. The coloring composition of the present invention may include one kind or two or more kinds of the alkali-soluble resins. In a case where the alkali-soluble resins are included in combination of two or more kinds thereof, the total amount thereof preferably falls within the range.

<<Solvent>>

The coloring composition of the present invention contains a solvent. The solvent is preferably an organic solvent. The organic solvent is not particularly limited as long as it satisfies the solubility of the respective components or the coatability of the coloring composition.

Examples of the organic solvent include the following solvents, for example, esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-oxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate, ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate (1-methoxy-2-propyl acetate), propylene glycol monoethyl ether acetate, propylene glycol monopropyl ether acetate, and 2-methoxy-1-propyl acetate, ketones, for example, methyl ethyl ketone, cyclohexanone, cyclopentanone, 2-heptanone, and 3-heptanone, and aromatic hydrocarbons, for example, toluene and xylene.

However, it may be preferable in some cases that the amount of aromatic hydrocarbons (benzene, toluene, xylene, ethylbenzene, and the like) as the solvent is reduced in an environmental view or the like (the amount thereof can be set to, for example, 50 ppm or less, 10 ppm or less, or 1 ppm or less with respect to the total amount of the organic solvent).

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol monomethyl ether acetate (1-methoxy-2-propyl acetate), and 2-methoxy-1-propyl acetate.

In the present invention, the organic solvent preferably includes 2-methoxy-1-propyl acetate. The content of 2-methoxy-1-propyl acetate is preferably 0.001% to 5% by mass with respect to the mass of the coloring composition. The upper limit is preferably 3% by mass or less, and more preferably 2% by mass or less.

Furthermore, the content of 2-methoxy-1-propyl acetate is preferably 0.01% to 0.5% by mass with respect to the mass of the solvent. The lower limit is preferably 0.05% by mass or more, and more preferably 0.1% by mass or more. The upper limit is preferably 0.4% by mass or less, and more preferably 0.2% by mass or less.

In the present invention, the organic solvent preferably has a content of peroxides of 0.8 mmol/L or less, and the organic solvent which does not substantially include peroxides is more preferably used. Further, an organic solvent having a small metal content is preferably used, and an organic solvent having a metal content of, for example, 10 ppb or less is preferable. As desired, am organic solvent having a metal content at a ppt level may be used, and such a high-purity solvent is provided by, for example, Toyo Gosei Co., Ltd. (The Chemical Daily (Kagaku Kogyo Nippo), Nov. 13, 2015).

The content of the solvent is preferably set such that the concentration of the total solid contents of the coloring composition becomes 5% to 80% by mass. The lower limit is, for example, preferably 10% by mass or more. The upper limit is preferably 60% by mass or less, more preferably 50% by mass or less, and still more preferably 40% by mass or less.

<<Curing Aid>>

In a case where the coloring composition of the present invention includes an epoxy compound as a curable compound, it is preferable that the coloring composition further includes a curing aid. According to this aspect, it is possible to lower the curing temperature of the epoxy compound. As a result, even in a case where the value of the curing temperature is low, it is possible to form a cured film having excellent curability. It can be used to provide a coloring composition suitable in applications in which curing at a high temperature is hardly performed, such as a solid-state imaging device having an organic photoelectric conversion portion (for example, an organic complementary metal-oxide semiconductor (CMOS)).

Furthermore, by blending a curing aid into the composition, effects of suppressing the residual color mixture, improving the moisture resistance, and the like are obtained. A reason therefor is not clear, but is presumed to be due to an effect obtained by the interaction of these curing aids with the aluminum phthalocyanine pigment, leading to making contributions around the pigment, along with an effect of improving curability by the curing aid.

In addition, the epoxy compound curing aid can also be used as a curing aid for a curable compound other than the epoxy compound.

Examples of the curing aid include a compound represented by Formula (1), a compound represented by Formula (2), a tertiary amine compound, an ammonium salt, a phosphonium salt, an amidine salt, an amide compound, a thiol compound, a blocked isocyanate compound, and an imidazole ring-containing compound. From the viewpoint of curability, the compound represented by Formula (1), the compound represented by Formula (2), and the imidazole ring-containing compound are preferable, and the imidazole ring-containing compound is more preferable.

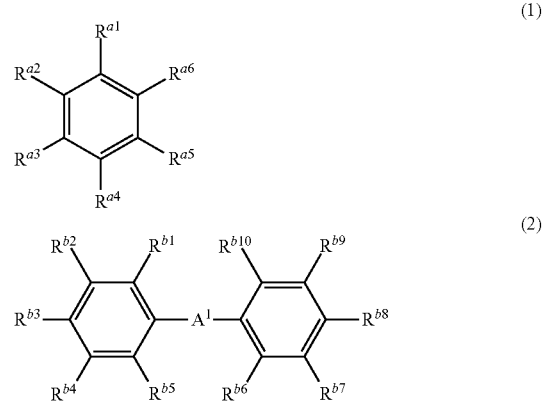

In Formula (1), $R^{a1}$ to $R^{a6}$ each independently represent a hydrogen atom, an electron withdrawing group, $-NR^{100}R^{101}$, or a group having $-NR^{100}R^{101}$, and at least one of $R^{a1}, \ldots,$ or $R^{a6}$ represents an electron withdrawing group, $-NR^{100}R^{101}$, or a group having $-NR^{100}R^{101}$. $R^{100}$ and $R^{101}$ each independently represent a hydrogen atom or a substituent. Two adjacent groups of $R^{a1}$ to $R^{a6}$ may be bonded to each other to form a ring.

In Formula (2), $R^{b1}$ to $R^{b10}$ each independently represent a hydrogen atom, an electron withdrawing group, $-NR^{100}R^{101}$, or a group having $-NR^{100}R^{101}$, and at least one of $R^{b1}, \ldots,$ or $R^{b10}$ represents an electron withdrawing group, $-NR^{100}R^{101}$, or a group having $-NR^{100}R^{101}$. Two adjacent groups of $R^{b1}$ to $Rb^{10}$ may be bonded to each other to form a ring. $A$ represents a single bond or a divalent linking group. $R^{100}$ and $R^{101}$ each independently represent a hydrogen atom or a substituent.

Examples of the substituent represented by $R^{100}$ and $R^{101}$ include an alkyl group, an aryl group, and a heterocyclic group, with the alkyl group being preferable. The number of carbon atoms of the alkyl group is preferably 1 to 10, more preferably 1 to 5, and still more preferably 1 to 3. The alkyl group is preferably linear or branched, and more preferably linear.

Examples of the electron withdrawing group represented by each of $R^{a1}$ to $R^{a6}$, and $R^{b1}$ to $R^{b10}$ include a halogen atom, a cyano group, a nitro group, a trifluoromethyl group, a carboxyl group, an acyl group, an alkylsulfonyl group, an alkyloxysulfonyl group, a dicyanovinyl group, a tricyanovinyl group, and a sulfonyl group. Among these, the nitro group, the trifluoromethyl group, or the alkyloxysulfonyl group is preferable.

Examples of the divalent linking group represented by $A^1$ include an alkylene group, —O—, —CO—, —OCO—, —COO—, —SO$_2$—, —SO—, —S—, and a group formed by combination thereof. The number of carbon atoms of the alkylene group is preferably 1 to 10, and more preferably 1 to 5. The alkylene group is preferably linear or branched. The alkylene group may be unsubstituted or have a substituent. Examples of the substituent include a halogen atom.

Specific examples of the compound represented by each of Formulae (1) and (2) include, 2,2-bis(4-aminophenyl) hexafluoropropane, 2,3-bis(4-aminophenyl)succinic nitrile, 4,4'-diaminobenzophenone, 4,4'-diaminophenylbenzoate, 4,4'-diaminodiphenylsulfone, 1,4-diamino-2-chlorobenzene, 1,4-diamino-2-bromobenzene, 1,4-diamino-2-iodobenzene, 1,4-diamino-2-nitrobenzene, 1,4-diamino-2-trifluoromethylbenzene, 2,5-diaminobenzonitrile, 2,5-diaminoacetophenone, 2,5-diaminobenzoic acid, 2,2'-dichlorobenzidine, 2,2'-dibromobenzidine, 2,2'-diiodobenzidine, 2,2'-dinitrobenzidine, 2,2'-bis(trifluoromethyl)benzidine, ethyl 3-aminobenzenesulfonate, 3,5-bistrifluoromethyl-1,2-diaminobenzene, 4-aminonitrobenzene, N,N-dimethyl-4-nitroaniline, and salicylic hydrazide.

Examples of the tertiary amine compound include a compound represented by Formula (5).

(5)

In Formula (5), $R^{c1}$ to $R^{c3}$ each independently represent an alkyl group having 1 to 20 carbon atoms, an aryl group having 6 to 18 carbon atoms, or an aralkyl group having 7 to 30 carbon atoms. $R^{c1}$ and $R^{c2}$ may be bonded to each other to form a cyclic structure, together with a nitrogen atom to which they are bonded. Some or all of hydrogen atoms in the alkyl group, the aryl group, and the aralkyl group may be substituted.

Examples of the tertiary amine compound include N,N-dimethylbenzylamine, triphenylamine, tributylamine, trioctylamine, tridodecylamine, dibutylbenzylamine, trinaphthylamine, N-ethyl-N-methylaniline, N,N-diethylaniline, N-phenyl-N-methyl aniline, N,N-dimethyl-p-toluidine, N,N-dimethyl-4-bromoaniline, N,N-dimethyl-4-methoxyaniline, N-phenylpiperidine, N-(4-methoxyphenyl)piperidine, N-phenyl-1,2,3,4-tetrahydroisoquinoline, 6-benzyloxy-N-phenyl-7-methoxy-1,2,3,4-tetrahydroisoquinoline, N,N'-dimethylpiperazine, N,N-dimethylcyclohexylamine, 2-dimethylaminomethylphenol, and 2,4,6-tris(dimethylaminomethyl)phenol.

Examples of the ammonium salt and the phosphonium salt include a compound represented by Formula (6).

(6)

In Formula (6), A is a nitrogen atom or a phosphorus atom. $R^{d1}$ to $R^{d4}$ each independently represent a hydrogen atom, an alkyl group having 1 to 20 carbon atoms, an aryl group having 6 to 18 carbon atoms, or having an aralkyl group having 7 to 30 carbon atoms, provided that these groups may have some or all of hydrogen atoms substituted. $Q^-$ is a monovalent anion.

Examples of the monovalent anion represented by $Q^-$ include chloride ions, bromide ions, iodide ions, cyanide ions, nitrate ions, nitrite ions, hypochlorite ions, chlorite ions, chlorate ions, perchlorate ions, permanganate ions, bicarbonate ions, dihydrogen phosphate ions, hydrogen sulfide ions, thiocyanate ions, carboxylate ions, sulfonate ions, phenoxide ions, tetrafluoroborate ions, tetraarylborate ions, and hexafluoroantimonate ions.

In a case where A is a nitrogen atom, that is, examples of ammonium salts as the monovalent anion include tetramethylammonium chloride, tetrabutylammonium chloride, dodecyldimethylbenzylammonium chloride, octyltrimethylammonium chloride, decyltrimethylammonium chloride, dodecyltrimethylammonium chloride, tetradecylchloridetrimethylammonium chloride, cetyltrimethylammonium chloride, stearyltrimethylammonium chloride, hexadecyltrimethylammonium bromide, benzyltrimethylammonium chloride, benzyltriethylammonium chloride, benzalkonium chloride, benzalkonium bromide, didecyldimethylammonium chloride, and distearyldimethylammonium chloride.

In a case where A is a phosphorus atom, that is, examples of phosphonium salts as the monovalent anion include tetraphenylphosphonium/tetraphenylborate, tetraphenylphosphonium/tetra(p-tolyl)borate, tetraphenylphosphonium/tetra(p-ethylphenyl)borate, tetratriphenylphosphonium/tetra(p-methoxyphenyl)borate, tetraphenylphosphonium/tetra(p-ethoxyphenyl)borate, tetraphenylphosphonium/tetra(p-tert-butoxyphenyl)borate, tetraphenylphosphonium/tetra(m-tolyl)borate, tetraphenylphosphonium/tetra(m-methoxyphenyl)borate, tri(p-tolyl) triphenylphosphonium/tetra(p-tolyl)borate, tetra(p-tri) phosphonium/tetra(p-tolyl)borate, tri(p-methoxyphenyl) triphenylphosphonium/tetra(p-tolyl)borate, tetraphenylphosphonium thiocyanate, butyltriphenylphosphonium thiocyanate, methyltriphenylphosphonium thiocyanate, and p-tolyltriphenylphosphonium thiocyanate.

As the amidine salt, a salt of a compound represented by Formula (7) is preferable.

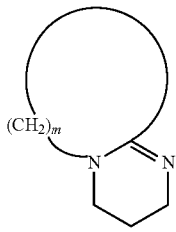

(7)

In Formula (7), m is an integer of 2 to 6, provided that some or all of hydrogen atoms contained in the alkylene group may be substituted with organic groups. Further, the alkylene group refers to both of an alkylene group in the tetrahydropyrimidine ring and an alkylene group represented by Formula (7) $(CH_2)_m$.

Examples of the compound represented by Formula (7) include 1,5-diazabicyclo[4.3.0]-nonene-5 (DBN), 1,5-diazabicyclo[4.4.0]-decene-5, 1,8-diazabicyclo[5.4.0]-undecene-7 (DBU), and 5-hydroxypropyl-1,8-diazabicyclo[5.4.0]-undecene-7,5-dibutylamino-1,8-diazabicyclo[5.4.0]-undecene-7.

Examples of an acid used to form a salt together with the compound represented by Formula (7) include an organic acid and an inorganic acid. Examples of the organic acid include carboxylic acid, monoalkyl carbonate, an aromatic hydroxy compound, and sulfonic acid. Among these acids, the carboxylic acid, the aromatic hydroxy compound, and the sulfonic acid are preferable, a saturated fatty acid, the aromatic hydroxy compound, and the sulfonic acid are more preferable, sulfonic acid which is a strong acid is particularly preferable, and toluenesulfonic acid, methanesulfonic acid, and octylbenzenesulfonic acid are the most preferable. As the amidine salt, a salt of DBU with toluenesulfonic acid, a salt of DBU with octylbenzenesulfonic acid, a salt of DBN with toluenesulfonic acid, and a salt of DBN with octylbenzenesulfonic acid are preferable.

As the amide compound, at least one selected from the group consisting of compounds having amide groups represented by Formulae (8) to (10) can be used.

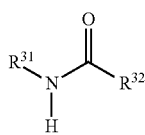

(8)

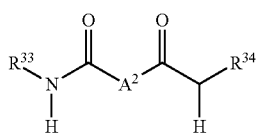

(9)

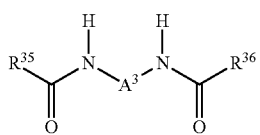

(10)

In Formula (8), $R^{31}$ and $R^{32}$ each independently represent a hydrogen atom, a linear alkyl group having 1 to 12 carbon atoms, a phenyl group, a naphthyl group, a vinyl group, or a 2-pyridyl group, provided that the linear alkyl group having 1 to 12 carbon atoms, the phenyl group, and the naphthyl group may be substituted with an alkyl group having 1 to 6 carbon atoms, a halogen atom, a hydroxyl group, a carboxyl group, or an acetyl group.

In Formula (9), $R^{33}$ and $R^{34}$ each independently represent a hydrogen atom, a linear alkyl group having 1 to 12 carbon atoms, or a cyclohexyl group. $A^2$ is a methylene group, a linear alkylene group having 2 to 12 carbon atoms, a phenylene group, a naphthylene group, or a vinylene group, provided that the methylene group, the linear alkylene group having 2 to 12 carbon atoms, the phenylene group, and the naphthylene group may be substituted with an alkyl group having 1 to 6 carbon atoms or a halogen atom.

In Formula (10), $R^{35}$ and $R^{36}$ each independently represent a hydrogen atom, a linear alkyl group having 1 to 12 carbon atoms or a cyclohexyl group. $A^3$ is a methylene group, a linear alkylene group having 2 to 12 carbon atoms, a phenylene group, a naphthylene group, or a vinylene group, provided that the methylene group, the linear alkylene group having 2 to 12 carbon atoms, the phenylene group, and the naphthylene group may be substituted with an alkyl group having 1 to 6 carbon atoms or a halogen atom.

Specific examples of the compound represented by Formula (8) include acetamide, N-methylacetamide, N-ethylacetamide, phthalamic acid, acrylamide, benzamide, naphthamide, nicotinamide, and isonicotinamide.

Specific examples of the compounds represented by Formulae (9) and (10) include phthalamide, isophthalamide, adipic amide, terephthalamide, malonamide, succinamide, N,N'-diacetyl-p-phenylenediamine, N,N'-diacetyl-hexamethylenediamine, and N,N'-diacetyl-dodecylmethylenediamine.

Examples of the thiol compound include a polyfunctional thiol compound having two or more mercapto groups in the molecule. The polyfunctional thiol compound thiol may be added for the purpose of improving stability, odor, resolution, developability, adhesiveness, and the like. The polyfunctional thiol compound is preferably a secondary alkane thiol compound, and more preferably a compound having a structure represented by Formula (T1).

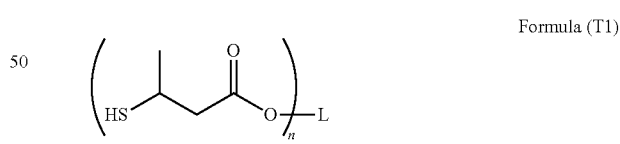

Formula (T1)

(In Formula (T1), n represents an integer of 2 to 4, and L represents a divalent to tetravalent linking group.)

In Formula (T1), the linking group L is preferably an aliphatic group having 2 to 12 carbon atoms, and particularly preferably an alkylene group with n being 2 and L having 2 to 12 carbon atoms. Specific examples of the polyfunctional thiol compound include compounds represented by Structural Formulae (T2) to (T4), with the compound represented by Formula (T2) being particularly preferable. The thiol compound may be used singly or in combination of plural kinds thereof.

(T2)
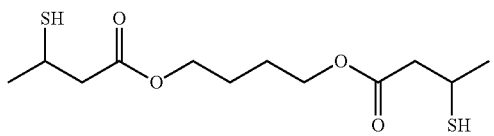

(T3)
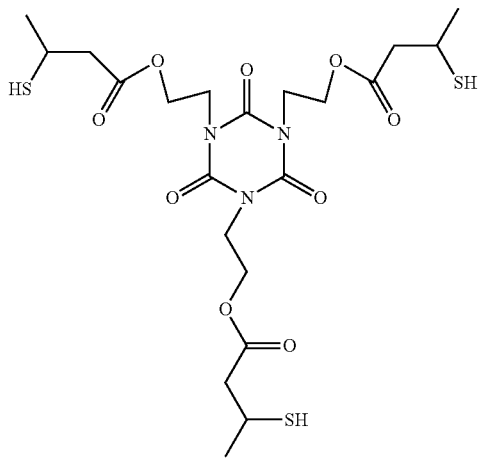

(T4)
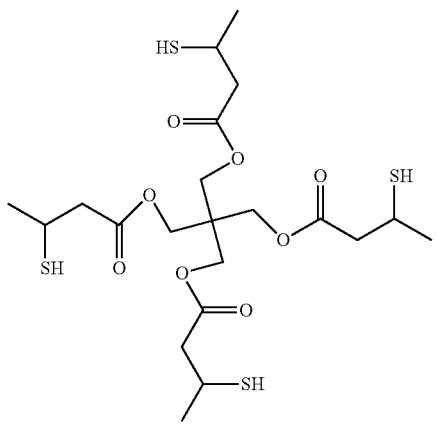

The blocked polyisocyanate compound becomes inert at normal temperature by reacting an isocyanate group with a compound (blocking agent) containing an active hydrogen group, and has a property that upon heating the compound, the blocking agent is dissociated to regenerate an isocyanate group. The blocked polyisocyanate compound is obtained by a known reaction of polyisocyanate derived from aliphatic or alicyclic diisocyanate with a compound (blocking agent) containing an active hydrogen group. With regard to details of the blocked polyisocyanate compound, reference can be made to the descriptions in paragraphs 0239 to 0242 of JP2013-41165A, the contents of which are incorporated herein by reference.

Examples of the imidazole ring-containing compound include a compound represented by Formula (16).

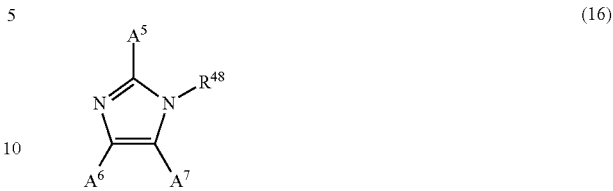

In Formula (16), $A^5$, $A^6$, $A^7$, and $R^{48}$ each independently represent a hydrogen atom or a linear, branched or cyclic hydrocarbon group having 1 to 20 carbon atoms, which may have a substituent. $A^6$ and $A^7$ may be linked to form a ring.

Examples of the linear, branched or cyclic hydrocarbon group having 1 to 20 carbon atoms, represented by each of $A^5$, $A^6$, $A^7$, and $R^{48}$, include:

a linear or branched alkyl group having 1 to 20 carbon atoms, such as a methyl group, an ethyl group, an n-propyl group, an i-propyl group, an n-butyl group, an i-butyl group, a sec-butyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-eicosyl group;

a cyclic alkyl group having carbon atoms 3 to 20, such as a cyclopentyl group, a cyclobutyl group, a cyclopentyl group, and a cyclohexyl group;

an aryl group having 6 to 20 carbon atoms, such as a phenyl group, a toluyl group, a benzyl group, a methylbenzyl group, a xylyl group, a mesityl group, naphthyl group, and an anthryl group; and a crosslinked alicyclic hydrocarbon group having 6 to 20 carbon atoms, such as a norbornyl group, a tricyclodecanyl group, a tetracyclododecyl group, an adamantyl group, a methyladamantyl group, an ethyladamantyl group, and a butyladamantyl group.

The hydrocarbon group may have a substituent. Examples of the substituent include a hydroxyl group, a carboxyl group, a hydroxyalkyl group, an alkoxyl group having 1 to 4 carbon atoms, a cyano group, a cyanoalkyl group having 2 to 5 carbon atoms, an alkoxycarbonyl group having 2 to 5 carbon atoms, an alkoxycarbonylalkoxyl group having 3 to 6 carbon atoms, a halogen atom, and a fluoroalkyl group.

Examples of the ring formed by the mutual linking of $A^6$ and $A^7$ include an aromatic ring and a saturated or unsaturated, nitrogen-containing heterocycle having 2 to 20 carbon atoms. Examples of the imidazole ring-containing compound in a case where the ring formed by the mutual linking of $A^6$ and $A^7$ is a benzene ring include a compound represented by Formula (17).

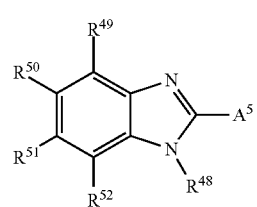

In Formula (17), $R^{48}$ and $A^5$ each have the same definitions as in Formula (16). $R^{49}$ to $R^{52}$ each independently represent a linear, branched, or cyclic hydrocarbon group having 1 to 20 carbon atoms, which may have a substituent. Further, examples of the hydrocarbon group represented by each of $R^{49}$ to $R^{52}$ include the same ones as the hydrocarbon group in Formula (16).

Examples of the imidazole ring-containing compound include 2-phenylbenzoimidazole, 2-methylimidazole, 2-methylbenzoimidazole, 1-benzyl-2-methylimidazole, 1,2-dimethylimidazole, 2-phenylimidazole, and 1-cyanoethyl-2-ethyl-4-methylimidazole.

As the curing aid, a commercially available product can also be used. Examples of the commercially available product include AMICURE UDH-J (manufactured by Ajinomoto Fine-Techno Co., Inc), and U-CAT SA102 (manufactured by SAN-APRO Co., Ltd.).

Furthermore, as to the curing aid, methylol-based compounds (for example, the compounds exemplified as a crosslinking agent in paragraph 0246 of JP2015-34963A), amines, a phosphonium salt, an amidine salt, an amide compound (all, for example, the curing agents described in paragraph 0186 of JP2013-41165A), a base generator (for example, the ionic compound described in JP2014-55114A), a cyanate compound (for example, the compound described in paragraph 0071 of JP2012-150180A), an alkoxysilane compound (for example, the alkoxysilane compound having an epoxy group, described in JP2011-253054A), an onium salt compound (for example, the compounds exemplified as an acid generator in paragraph 0216 of JP2015-34963A, and the compounds described in JP2009-180949A), or the like can be used.

In a case where the coloring composition of the present invention contains the curing aid, the content of the curing aid is preferably 0.3% to 8.9% by mass, and more preferably 0.8% to 6.4% by mass, with respect to the total solid content of the coloring composition.

Furthermore, the content of the curing aid is preferably 1 to 30 parts by mass, and more preferably 1 to 20 parts by mass, with respect to 100 parts by mass of the epoxy compound. According to this aspect, it is easy to obtain good curability even in a case where the curing temperature is low (for example, 180° C. or lower).

<<Photopolymerization Initiator>>

It is preferable that the coloring composition of the present invention further contains a photopolymerization initiator. The photopolymerization initiator is not particularly limited as long as it can initiate the polymerization of polymerizable compounds, and can be appropriately selected from known photopolymerization initiators. For example, it is preferably sensitive to radiations from an ultraviolet region to a visible region. Further, it may be an activator that causes a certain action with a photoexcited sensitizer to generate active radicals. Incidentally, the photopolymerization initiator preferably contains at least one compound having a molar light absorption coefficient of at least about 50 in the range of about 300 nm to 800 nm (more preferably 330 nm to 500 nm).

Examples of the photopolymerization initiator include halogenated hydrocarbon derivatives (for example, those having a triazine skeleton and those having an oxadiazole skeleton), acylphosphine compounds such as acylphosphine oxide, hexaaryl biimidazole, oxime compounds such as oxime derivatives, organic peroxides, thio compounds, ketone compounds, aromatic onium salts, ketoxime ethers, aminoacetophenone compounds, and hydroxyacetophenone.

Furthermore, from the viewpoint of exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, and a 3-aryl-substituted coumarin compound is preferable.

As the photopolymerization initiator, a hydroxyacetophenone compound, an aminoacetophenone compound, and an acylphosphine compound can also suitably be used. More specifically, for example, the aminoacetophenone-based initiators described in JP1998-291969A (JP-H10-291969A) and the acylphosphine-based initiators described in JP4225898B can also be used.

As the hydroxyacetophenone-based initiator, IRGACURE 184, DAROCUR 1173, IRGACURE 500, IRGACURE 2959, and IRGACURE 127 (trade names, all manufactured by BASF) can be used. As the aminoacetophenone-based initiator, IRGACURE-907, IRGACURE 369, and IRGACURE 379 (trade names: all manufactured by BASF) which are commercially available products can be used. In addition, as the aminoacetophenone-based initiator, the compound described in JP2009-191179A, of which an absorption wavelength matches with a light source at a long wavelength of 365 nm, 405 nm, or the like can be used. In addition, as the acylphosphine-based initiator, IRGACURE 819 or IRGACURE TPO (trade names, both manufactured by BASF) which is a commercially available product can be used.

In particular, in a case where the coloring composition of the present invention is used to manufacture a color filter for a solid-state imaging device, it is important that it should be not only readily curable but also developable without leaving a residue in unexposed areas since it is necessary to form micropatterns in sharp shapes. From such a viewpoint, it is particularly preferable to use an oxime compound as a photopolymerization initiator. In particular, when micropatterns are formed in a solid-state imaging device, a stepper exposure apparatus (exposure machine) is used for curing exposure, but such an exposure machine may be damaged by halogen, and thus, it is necessary to reduce the addition amount of the photopolymerization initiator. Thus, taking these points into consideration, it is particularly preferable to use the oxime compound as the photopolymerization initiator for forming micropatterns as in a solid-state imaging device or the like.

With respect to specific examples of the photopolymerization initiator, reference can be made to, for example, paragraphs 0265 to 0268 of JP2013-29760A, the contents of which are incorporated herein by reference.

More preferred examples of the photopolymerization initiator include an oxime compound. As the specific examples of the oxime compound, the compound described in JP2001-233842A, the compound described in JP2000-80068A, the compound described in JP2006-342166A, and the compound described in JP2016-21012A can be used. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1- phenylpropan-1-one, 3-(4-toluenesulfonyloxy)iminobutan-2-one, and 2-ethoxycarbonyloxyimino-1-phenylpropan-1-one.

As the oxime compound, the compounds described in J. C. S. Perkin II (1979), pp. 1653-1660, J. C. S. Perkin II (1979), pp. 156-162, Journal of Photopolymer Science and Technology (1995), pp. 202-232, and each publication of JP2000-66385A, JP2000-80068A, JP2004-534797A, and JP2006-342166A, or the like can also be used.

As the commercially available products thereof, IRGACURE-OXE01 (manufactured by BASF) and IRGACURE-OXE02 (manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 (manufactured by ADEKA Corporation) can also be used.

Moreover, as oxime compounds other than the above-described oxime compounds, the compound described in JP2009-519904A in which oxime is linked to an N-position of a carbazole ring, the compound described in U.S. Pat. No. 7,626,957B in which a hetero-substituent is introduced into a benzophenone moiety, the compounds described in JP2010-15025A and US2009-292039A in which a nitro group is introduced into a colorant moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has excellent sensitivity to a light source of g-rays, and the like, may be used. Preferably, reference can be made to the descriptions in, for example, paragraphs 0274 and 0275 of JP2013-29760A, the contents of which are incorporated herein by reference. Specifically, as the oxime compound, a compound represented by General Formula (OX-1) is preferable. In addition, the compound may be an oxime compound in which an N—O bond of oxime forms an (E) isomer, an oxime compound in which the N—O bond forms a (Z) isomer, or a mixture in which the N—O bond forms a mixture of the (E) isomer and the (Z) isomer.

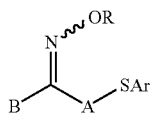
(OX-1)

In Formula (OX-1), R and B each independently represent a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in Formula (OX-1), an alkylene group having 1 to 12 carbon atoms, or an alkynylene group is preferable. These groups may have one or more substituents. Examples of the substituent include the above-mentioned substituents.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can also be used as the photopolymerization initiator. The oxime compound having a nitro group is preferably used in the form of a dimer. Specific examples of the oxime compound having a nitro group include the compounds described in paragraphs 0031 to 0047 of JP2013-114249 and paragraphs 0008 to 0012, and 0070 to 0079 of JP2014-137466A, the compounds described in paragraphs 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

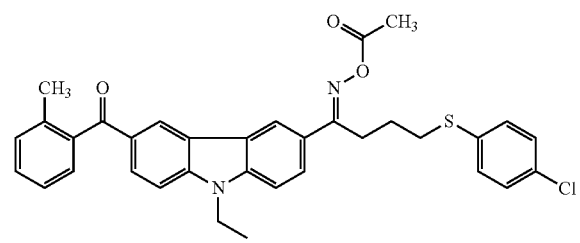
(C-1)

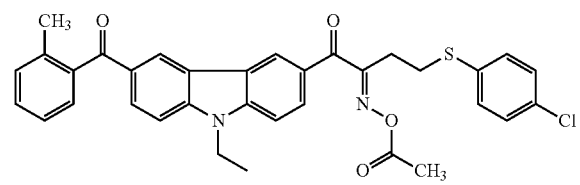
(C-2)

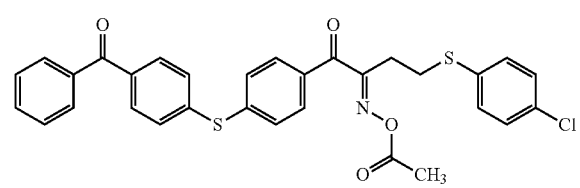
(C-3)

-continued
(C-4)
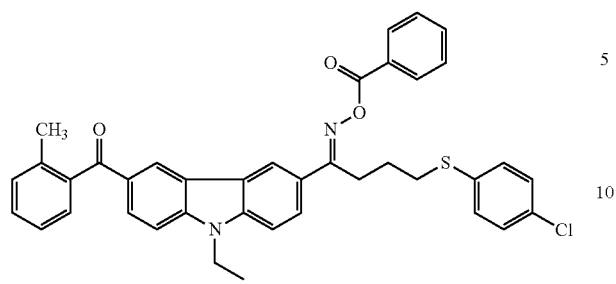
(C-9)
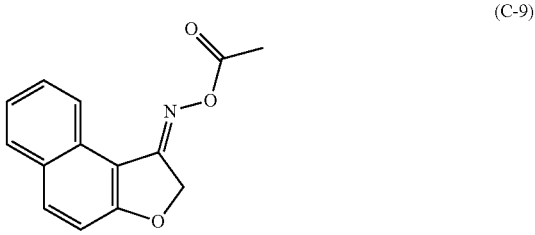
(C-5)
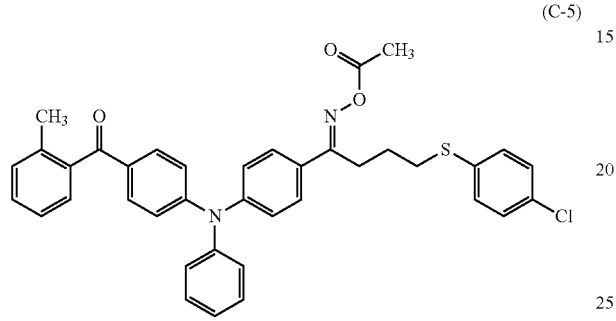
(C-10)
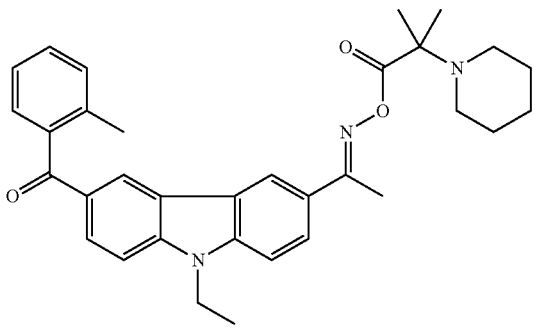
(C-6)
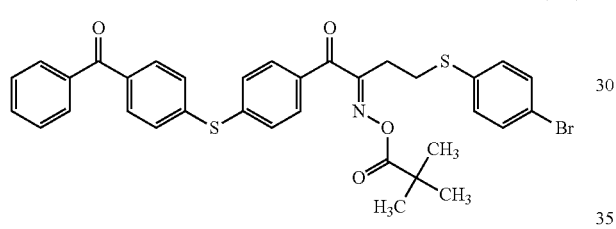
(C-11)
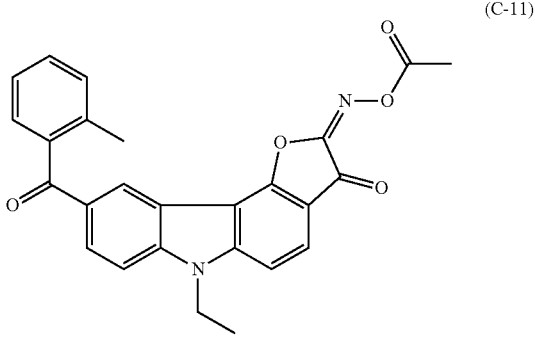
(C-7)
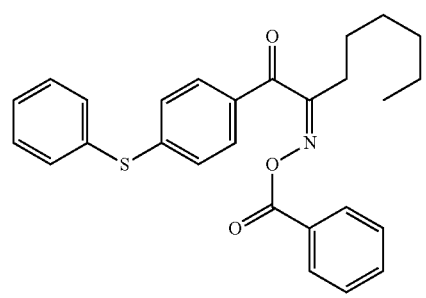
(C-12)
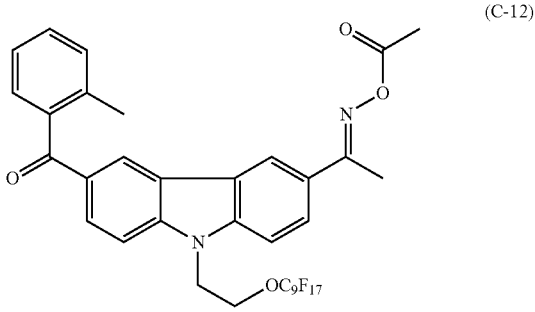
(C-8)
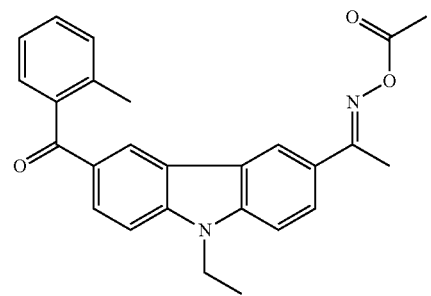
(C-13)
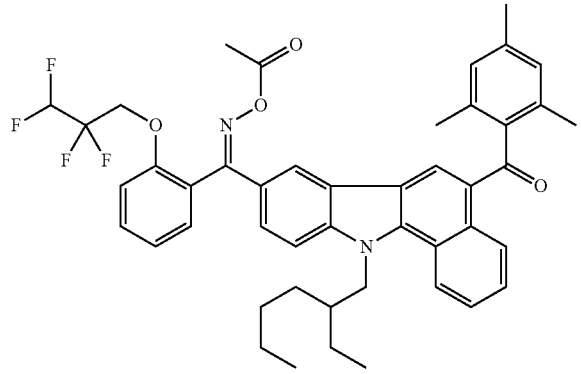 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

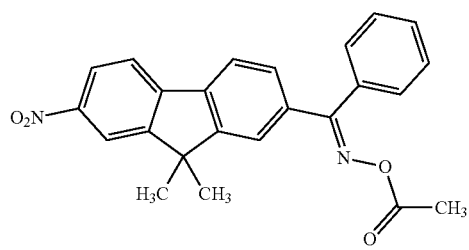

(C-14)

The oxime compound has a maximum absorption wavelength in a wavelength range of preferably 350 nm to 500 nm, and more preferably in a wavelength range of 360 nm to 480 nm, and an oxime compound showing a high absorbance at 365 nm and 405 nm is particularly preferable.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, and specifically, it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

In the present invention, it is also preferable to use a combination of a photopolymerization initiator (hereinafter also referred to as a photopolymerization initiator (a)) with a light absorption coefficient at 365 nm of $1.0 \times 10^3$ mL/gcm or more in methanol and a photopolymerization initiator with a light absorption coefficient at 365 nm of $1.0 \times 10^2$ mL/gcm or less and a light absorption coefficient at 254 nm in methanol of $1.0 \times 10^3$ mL/gcm or more in methanol (hereinafter also referred to as a photopolymerization initiator (b)). According to this aspect, it is easy to form a curable film having excellent solvent resistance by performing heating at a low temperature.

The photopolymerization initiator (a) has a light absorption coefficient at 365 nm of preferably $1.0 \times 10^3$ to $1.0 \times 10^4$ mL/gcm, more preferably $2.0 \times 10^3$ to $9.0 \times 10^3$ mL/gcm, and still more preferably $6.0 \times 10^3$ to $8.0 \times 10^3$ mL/gcm in methanol.

As the photopolymerization initiator (a), an oxime compound, an aminoacetophenone compound, or an acylphosphine compound can be suitably used, with the oxime compound being preferable. As the oxime compound, the compound represented by Formula (OX-1) is preferable.

The photopolymerization initiator (b) as a light absorption coefficient at 365 nm of preferably 10 to $1.0 \times 10^2$ mL/gcm, and more preferably 20 to $9.0 \times 10^2$ mL/gcm in methanol. A difference between the light absorption coefficient at a wavelength of 365 nm of the photopolymerization initiator (a) and the light absorption coefficient at a wavelength of 365 nm of the photopolymerization initiator (b) is preferably $9.0 \times 10^2$ mL/gcm or more, more preferably $9.0 \times 10^2$ to $1.0 \times 10^5$ mL/gcm, and still more preferably $9.0 \times 10^2$ to $1.0 \times 10^4$ mL/gcm.

The photopolymerization initiator (b) has a light absorption coefficient at 254 nm of preferably $1.0 \times 10^3$ to $1.0 \times 10^6$ mL/gcm, and more preferably $5.0 \times 10^3$ to $1.0 \times 10^5$ mL/gcm in methanol.

As the photopolymerization initiator (b), the hydroxyacetophenone compound, the aminoacetophenone compound, or the acylphosphine compound can be suitably used. The hydroxyacetophenone compound is preferably a phosphorus compound represented by Formula (V).

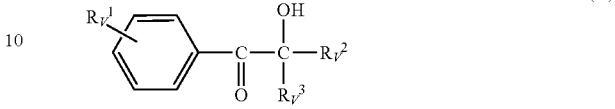

(V)

In Formula (V), $Rv^1$ represents a hydrogen atom, an alkyl group (preferably an alkyl group having 1 to 10 carbon atoms), an alkoxy group (preferably an alkoxy group having 1 to 10 carbon atoms), or a divalent organic group. In a case where $Rv^1$ is a divalent organic group, it represents a dimer formed by the linking of two photoactive hydroxyacetophenone structures (that is, structures excluding a substituent $Rv^1$ from the compound represented by General Formula (V)) through $Rv^1$. $Rv^2$ and $Rv^3$ each independently represent a hydrogen atom or an alkyl group (preferably an alkyl group having 1 to 10 carbon atoms). $Rv^2$ and $Rv^3$ may be bonded to each other to form a ring (preferably a ring having 4 to 8 carbon atoms). An alkyl group and an alkoxy group as $Rv^1$, and an alkyl group as each of $Rv^2$ and $Rv^3$, and a ring formed by the bonding of $Rv^2$ and $Rv^3$ may further have a substituent.

In a case where the coloring composition of the present invention contains a photopolymerization initiator, the content of the photopolymerization initiator is preferably 0.1% to 50% by mass, more preferably 0.5% to 30% by mass, and still more preferably 1% to 20% by mass, with respect to the total solid content of the coloring composition. Within this range, better sensitivity and pattern forming properties are obtained. The coloring composition of the present invention may include one kind or two or more kinds of the photopolymerization initiator. In a case where the polymerization initiators are used in combination of two or more kinds thereof, the total amount thereof is preferably within a range.

Furthermore, in a case where the photopolymerization initiator (a) and the photopolymerization initiator (b) as described above are used in combination, the content of the photopolymerization initiator (a) is preferably 1.5% to 10% by mass, and more preferably 3% to 8% by mass, in the total solid content of the coloring composition of the present invention. Further, the content of the photopolymerization initiator (b) is preferably 1.5% to 7.5% by mass, and more preferably 2% to 6% by mass, in the total solid content of the coloring composition of the present invention. If the content of the photopolymerization initiator (a) and the photopolymerization initiator (b) falls within the range, it is easy to form a cured film having excellent solvent resistance. The photopolymerization initiator (a) and the photopolymerization initiator (b) may be used singly or in combination of two or more kinds thereof.

<<Surfactant>>

From the viewpoint of further improving coatability, the coloring composition of the present invention may contain various surfactants. As the surfactant, various surfactants such as a fluorine-based surfactant, a non-ionic surfactant, a cationic surfactant, an anionic surfactant, and a silicon-based surfactant can be used.

By incorporating a fluorine-based surfactant into the coloring composition of the present invention, liquid characteristics (in particular, fluidity) in a case of preparation of a coating liquid using the coloring composition are further improved, and thus, the evenness of coating thickness or liquid saving properties can be further improved. That is, in a case where a film is formed using to which a coloring composition containing a fluorine-based surfactant has been applied, the interfacial tension between a surface to be coated and the coating liquid is reduced to improve wettability with respect to the surface to be coated, and enhance coatability with respect to the surface to be coated. Therefore, a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film, liquid saving properties, and the like, and the solubility of the surfactant in the composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and RS-72-K (all manufactured by DIC Corporation), FLUORAD FC430, FC431, and FC171 (all manufactured by Sumitomo 3M), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by ASAHI GLASS Co., Ltd.), and PF636, PF656, PF6320, PF6520, and PF7002 (manufactured by OMNOVA). Further, as the fluorine-based surfactant, the compounds described in paragraphs 0015 to 0158 of JP2015-117327A or the compounds described in paragraphs 0117 to 0132 of JP2011-132503A can be used. As the fluorine-based surfactant, a blocked polymer can also be used, and specific examples thereof include the compounds described in JP2011-89090A.

The fluorine-based surfactant can also preferably use a fluorine-containing polymer compound including a repeating unit derived from a (meth)acrylate compound having a fluorine atom and a repeating unit derived from a (meth) acrylate compound having 2 or more (preferably 5 or more) alkyleneoxy groups (preferably ethyleneoxy groups or propyleneoxy groups), the following compounds are also exemplified as a fluorine-based surfactant for use in the present invention.

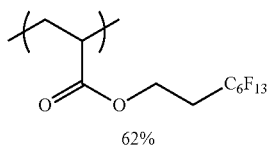

62%

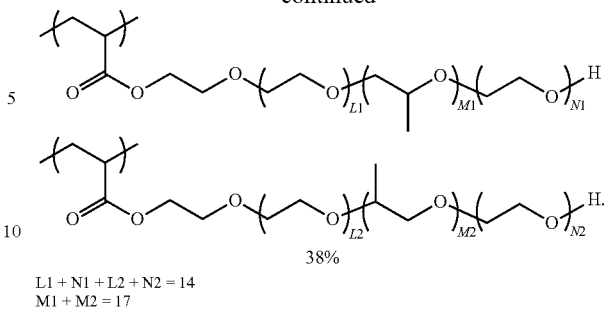

38%

L1 + N1 + L2 + N2 = 14
M1 + M2 = 17

The weight-average molecular weight of the compounds is preferably 3,000 to 50,000, and is, for example 14,000.

A fluorine-containing polymer having an ethylenically unsaturated group in a side chain can also be used as the fluorine-based surfactant. Specific examples thereof include the compounds described in paragraphs 0050 to 0090 and paragraphs 0289 to 0295 of JP2010-164965A, such as MEGAFACE RS-101, RS-102, and RS-718K, all manufactured by DIC Corporation.

Specific examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2 manufactured by BASF, and TETRONIC 304, 701, 704, 901, 904, and 150R1 manufactured by BASF), SOLSEPERSE 20000 (manufactured by Lubrizol Japan Ltd.), NCW-101, NCW-1001, or NCW-1002 manufactured by Wako Pure Chemical Industries, Ltd., PIONIN D-6112, D-6112-W or D-6315 manufactured by Takemoto Oil & Fat Co., Ltd., OLFIN E1010, and SURFYNOL 104, 400, and 440 manufactured by Nissin Chemical Industry Co., Ltd.

Specific examples of the cationic surfactant include an organosiloxane polymer KP-341 (manufactured by Shin-Etsu Chemical Co., Ltd.), a (meth)acrylic acid-based (co) polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and BL (manufactured by Sanyo Chemical Industries, Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP-341, KF6001, and KF6002 (all manufactured by Shin-Etsu Chemical Co., Ltd.), and BYK307, BYK323, and BYK330 (all manufactured by BYK Chemie).

The surfactants may be used singly or in combination of two or more kinds thereof.

The content of the surfactant is preferably 0.001% to 2.0% by mass, and more preferably 0.005% to 1.0% by mass, with respect to the total solid content of the coloring composition.

<<Silane Coupling Agent>>

The coloring composition of the present invention can contain a silane coupling agent. Further, in the present invention, the silane coupling agent means a silane compound having a hydrolyzable group and other functional groups. Further, the hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, and an acyloxy group.

The silane coupling agent is preferably a silane compound having an amino group and an alkoxy group as the functional group. Examples of such the silane coupling agent include N-β-aminoethyl-γ-aminopropylmethyldimethoxysilane (trade name KBM-602, manufactured by Shin-Etsu Chemical Co., Ltd.), N-β-aminoethyl-γ-aminopropyltrimethoxysilane (trade name KBM-603, manufactured by Shin-Etsu Chemical Co., Ltd.), N-β-aminoethyl-γ-aminopropyltriethoxysilane (trade name KBE-602, manufactured by Shin-Etsu Chemical Co., Ltd.), γ-aminopropyltrimethoxysilane (trade name KBM-903, manufactured by Shin-Etsu Chemical Co., Ltd.), γ-aminopropyltriethoxysilane (trade name KBE-903, manufactured by Shin-Etsu Chemical Co., Ltd.), and 3-methacryloxypropyltrimethoxysilane (trade name KBM-503, manufactured by Shin-Etsu Chemical Co., Ltd.). With regard to the details of the silane coupling agent, reference can be made to the descriptions in paragraphs 0155 to 0158 of JP2013-254047A, the contents of which are incorporated herein by reference.

In a case where the coloring composition of the present invention contains a silane coupling agent, the content of the silane coupling agent is preferably 0.001% to 20% by mass, more preferably 0.01% to 10% by mass, and particularly preferably 0.1% to 5% by mass, with respect to the total solid content of the coloring composition. The coloring composition of the present invention may include one kind or two or more kinds of the silane coupling agents. In a case where the silane coupling agents are included in combination of two or more kinds thereof, the total amount thereof preferably falls within the range.

<<Polymerization Inhibitor>>

It is also preferable that to the coloring composition of the present invention contains a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol), and a N-nitrosophenylhydroxylamine salt (an ammonium salt, a cerous salt, or the like)

In a case where the coloring composition of the present invention contains a polymerization inhibitor, the content of the polymerization inhibitor is preferably 0.01% to 5% by mass with respect to the total solid content of the coloring composition. The coloring composition of the present invention may include one kind or two or more kinds of the polymerization inhibitor. In a case where the polymerization inhibitors are included in combination of two or more kinds thereof, the total amount thereof preferably falls within the range.

<<Other Additives>>

Various additives, for example, a filler, an adhesion promoter, an antioxidant, an ultraviolet absorber, and an aggregation inhibitor can be blended into the coloring composition of the present invention, as desired. Examples of these additives include those described in paragraphs 0155 and 0156 of JP2004-295116A, the contents of which are incorporated herein by reference. As the antioxidant, for example, a phenol compound, a phosphorus-based compound (for example, the compounds described in paragraph No. 0042 of JP2011-90147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used as a mixture of two or more kinds thereof. As the ultraviolet absorber, an ultraviolet absorber such as an aminodiene-based ultraviolet absorber, a salicylate-based ultraviolet absorber, a benzophenone-based ultraviolet absorber, a benzotriazole-based ultraviolet absorber, an acrylonitrile-based ultraviolet absorber, and a triazine-based ultraviolet absorber can be used, and specific examples thereof include the compounds described in JP2013-68814A. As the benzotriazole-based ultraviolet absorber, MYUA series manufactured by Miyoshi Oils and Fats (Chemical Industry Daily, Feb. 1, 2016) may be used. The coloring composition of the present invention may contain the sensitizers or the light stabilizers described in paragraph 0078 of JP2004-295116A, or the thermal polymerization inhibitors described in paragraph 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm or less, and preferably controlled to 0.01 to 10 ppm. Further, the total amount of the inorganic metal salts in the coloring composition is preferably 100 ppm or less, and preferably controlled to 0.5 to 50 ppm.

<Method for Preparing Coloring Composition>

The coloring composition of the present invention can be prepared by mixing the above-mentioned components. In the preparation of the coloring composition, the respective components may be blended at once or may be blended sequentially after dissolving and/or dispersing the respective components in a solvent. Further, the order of the components to be introduced or the operational conditions during the blending is not particularly limited. For example, the composition may be prepared by dissolving and/or dispersing all the components in a solvent at the same time, or by appropriately leaving the respective components in two or more solutions or dispersion liquids, and mixing them into a solution during the use (during the coating), as desired.

It is preferable that in the preparation of the coloring composition, filtration is performed using a filter for the purpose of removing foreign matters, reducing defects, or the like. As the filter, any filters that have been used in the related art for filtration use and the like may be used without particular limitation. Examples of the filter include filters formed of a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm. By setting the pore diameter of the filter to the range, fine foreign matters which inhibit the preparation of a uniform and smooth film in the next step can be reliably removed. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha, Ltd., Nihon Entegris K. K. (formerly Nippon Microlith Co., Ltd.), Kitz Micro Filter Corporation, or the like, for example.

As the second filter, those formed of the same material as that of the above-described first filter can be used.

For example, the filtration through the first filter may be carried out with only a dispersion liquid, the other components may be mixed, and then the filtration through the second filter may be carried out.

The coloring composition of the present invention can be used after its viscosity is adjusted for the purposes of adjusting the state of a film surface (flatness or the like), adjusting a film thickness, or the like. The value of the viscosity can be appropriately selected as desired, and is, for example, preferably 0.3 mPa·s to 50 mPa·s, and more preferably 0.5 mPa·s to 20 mPa·s at 25° C. As for a method for measuring the viscosity, the viscosity can be measured, for example, with a temperature being adjusted to 25° C., using a viscometer RE85L (rotor: 1°34'×R24, measurement range of 0.6 to 1,200 mPa·s) manufactured by Toki Sangyo Co., Ltd.

The moisture content in the coloring composition of the present invention is usually 3% by mass or less, preferably 0.01% to 1.5% by mass, and more preferably 0.1% to 1.0% by mass. In addition, the moisture content is a value measured by a Karl Fischer method.

The coloring composition of the present invention can be suitably used for forming pixels in cyan color. In addition, the coloring composition can be preferably used in a solid-state imaging device having an organic photoelectric conversion film, or the like since it is capable of producing a cured film having excellent curability even at a low temperature.

<Color Filter>

Next, the color filter of the present invention will be described.

The color filter of the present invention is formed using the above-mentioned coloring composition of the present invention. The film thickness of the color filter of the present invention can be appropriately adjusted depending on the purposes. The film thickness is preferably 20 μm or less, more preferably 10 μm or less, and still more preferably 5 μm or less. The lower limit of the film thickness is preferably 0.1 μm or more, more preferably 0.2 m or more, and still more preferably 0.3 μm or more. The color filter of the present invention can be used for a solid-state imaging device such as a charge-coupled device (CCD) and a complementary metal-oxide semiconductor (CMOS), an image display device, or the like.

In a case where the color filter of the present invention is used in applications of a liquid crystal display device, the voltage holding ratio of a liquid crystal display element including the color filter is preferably 70% or more, and more preferably 90% or more. A known means for obtaining a high voltage holding ratio can be appropriately introduced, and a typical means therefor include the use of a material having a high purity (for example, reduction in ionic impurities) and the control of the amount of acidic functional groups in a composition. The voltage holding ratio can be measured by, for example, the methods described in paragraph 0243 of JP2011-008004A or paragraphs 0123 to 0129 of JP2012-224847A.

<Method for Producing Cured Film>

Next, the method for producing a cured film of the present invention will be described. The method for producing a cured film of the present invention includes a step of forming a coloring composition layer on a substrate using the above-mentioned the coloring composition of the present invention, a step of patternwise exposing the coloring composition layer, and a step of removing an unexposed area by development to form a pattern, and is carried out at a temperature of 180° C. or lower through all the steps (preferably a temperature of 170° C. or lower). Further, in the present invention, the expression, "being carried out at a temperature of 180° C. or lower through all the steps" means that each of the steps in the process for producing a cured film is carried out at a temperature of 180° C. or lower. That is, in a case where the process for procuring a cured film further includes other steps (for example, a case where an exposure treatment or a heat treatment is performed to further perform curing, after forming a pattern), in addition to the above-mentioned steps, these treatments are also performed at a temperature of 180° C. or lower. On the other hand, after forming a cured film, dicing (division into chips), bonding, or the like is further included in some cases, but the steps after forming the cured film are not included in the "total steps" in the present invention. That is, in the steps after forming the cured film, the treatments may be performed at a temperature of higher than 180° C.

Hereinafter, details of the respective steps will be described.

<<Step of Forming Coloring Composition Layer>>

In the step of forming a coloring composition layer, a coloring composition layer is formed on a substrate, using the coloring composition of the present invention.

Examples of the substrate include substrates made of materials such as glass, silicon, polycarbonate, polyester, aromatic polyamide, polyamideimide, and polyimide. These substrates may have an organic photoelectric conversion film. Examples of the organic photoelectric conversion film include an organic layer formed of a laminate or combination of an electromagnetic wave-absorbing portion, a photoelectric conversion portion, an electron-transporting portion, a hole-transporting portion, an electron-blocking portion, a hole-blocking portion, a crystallization-preventing portion, a portion for improving the contact between an electrode and a layer, and the like. The organic layer preferably contains an organic p-type compound or an organic n-type compound. With regard to details of the organic layer, reference can be made to paragraphs 0018 to 0030 of JP2015-38979A, the contents of which are incorporated herein by reference. In addition, the organic photoelectric conversion film can also be used as the substrate.

As a method for applying the coloring composition of the present invention onto the substrate, various methods such as slit coating, an ink jet method, spin coating, cast coating, roll coating, and a screen printing method can be used.

The coloring composition layer formed on the substrate is preferably heated (pre-baked). Heating is carried out at preferably 120° C. or lower, more preferably 50° C. to 120° C., still more preferably 80° C. to 110° C., and particularly preferably 90° C. to 105° C. By performing heating at 120° C. or lower, in a case where a photoelectric conversion film of a solid-state imaging device is constituted with an organic material (that is, a case of using an organic photoelectric conversion film), these characteristics can be maintained more effectively.

The heating time is preferably 10 seconds to 300 seconds, more preferably 40 to 250 seconds, and still more preferably 80 to 220 seconds. Heating can be performed using a hot plate, an oven, or the like.

<<Exposing Step>>

Next, the coloring composition layer film formed on the substrate is patternwise exposed. For example, the coloring composition layer can be patternwise exposed by performing exposure through a mask having a predetermined mask pattern, using an exposure apparatus such as a stepper, whereby an exposed area can be cured.

As a radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$, and more preferably 0.05 to 1.0 J/cm$^2$.

The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

<<Developing Step>>

Next, the unexposed area is removed by development to form a pattern. The removal of the unexposed area by development can be carried out using a developer. Thus, the coloring composition layer in the unexposed area in the exposing step is eluted into the developer, and as a result, only a photocured portion remains.

As the developer, an organic alkali developer causing no damage on the underlying solid-state imaging device, circuit, or the like is preferable.

The temperature of the developer is preferably for example, 20° C. to 30° C., and the development time is preferably 20 to 180 seconds. Further, in order to improve residue removing properties, a step of removing the developer by shaking per 60 seconds and supplying a new developer may be repeated multiple times.

Examples of the alkali agent used for the developer include organic alkaline compounds such as aqueous ammonia, ethylamine, diethylamine, dimethylethanolamine, diglycol amine, diethanol amine, hydroxy amine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass.

In addition, an inorganic alkali may be used in a developer. As the inorganic alkali, sodium hydroxide, potassium hydroxide, sodium carbonate, sodium hydrogen carbonate, sodium silicate, sodium metasilicate, or the like is preferable.

Moreover, a surfactant may also be used in the developer. Examples of the surfactant include the surfactants described as the above-mentioned curable composition, with a nonionic surfactant being preferable.

Incidentally, in a case where a developer formed of such an aqueous alkaline solution is used, it is preferable that cleaning (rinsing) with pure water is generally performed after development.

After development, a heating treatment (post-baking) can also be performed after carrying out drying. The post-baking is a heating treatment after development so as to complete the curing of the film. In a case of performing the post-baking, the post-baking temperature is preferably 100° C. to 180° C., and preferably 120° C. to 170° C. The post-baking time is preferably 1 to 30 minutes, and more preferably 3 to 15 minutes.

The Young's modulus of the film after post-baking is preferably 0.5 to 20 GPa, and more preferably 2.5 to 15 GPa.

Post-baking can be performed continuously or batchwise by using a heating means such as a hot plate, a convection oven (hot-air circulating dryer), and a high-frequency heater so that the film after development satisfies the conditions. Post-baking may be performed in atmosphere or in nitrogen. From the viewpoint of the curability of a film, post-baking is preferably performed in nitrogen.

Moreover, in a case where as a coloring composition including a radically polymerizable compound, the above-mentioned photopolymerization initiator (a), and the above-mentioned photopolymerization initiator (b) as the coloring composition, it is also preferable that the exposing step is performed by performing exposure with light at a wavelength of more than 350 nm and 380 nm or less (preferably light at a wavelength of 355 to 370 nm, and particularly preferably i-rays), and the coloring composition layer after the developing step is further subjected to exposure with light at a wavelength of 254 to 350 nm (preferably light at a wavelength of 254 nm). That is, it is preferable that the exposure before formation of the pattern is performed with light at a wavelength of more than 350 nm and 380 nm or less, and the exposure after formation of the pattern is performed with light at a wavelength of 254 to 350 nm.

Furthermore, a difference between the wavelength of the light used for the exposure before formation of the pattern and the wavelength of the light used for the exposure after formation of the pattern is preferably 200 nm or less, and more preferably 100 to 150 nm.

By exposing the coloring composition layer in the two steps before and after pattern formation, the coloring composition can be suitably cured by the first exposure (the exposure before formation of the pattern), and approximately the entire coloring composition can be suitably cured by the next exposure (the exposure after formation of the pattern). As a result, even in a case where the post-baking temperature is 180° C. or lower, the curability of the coloring composition can be improved and the solvent resistance of the color filter can be improved. In addition, color mixture with other colors can also be suppressed.

The exposure before the developing step can be carried out at an irradiation dose (exposure dose) of light at a wavelength of more than 350 nm and 380 nm or less and the oxygen concentration during exposure under the conditions as described above in the exposing step. Further, the reaction rate of the radically polymerizable compound during the exposure before the developing step is preferably 30% to 60%. By adopting such a reaction rate, the radically polymerizable compound can be kept in a state of being suitably cured. Here, the reaction rate of the radically polymerizable compound refers to a ratio of all the unsaturated double bonds that undergo a reaction in all the unsaturated double bonds contained in the radically polymerizable compound.

The exposure after the developing step can be carried out at an irradiation dose (exposure dose) of light at a wavelength of 254 to 300 nm and the oxygen concentration during exposure under the conditions as described above in the exposing step. Further, the reaction rate of the radically polymerizable compound during the exposure before the developing step is preferably 60% to 90%. By adopting such a reaction rate, the curing state of the film after exposure can be improved.

Even in a case of performing the exposure in two steps, post-baking may further be performed after performing exposure after the developing step. The post-baking temperature is preferably 100° C. to 180° C., and more preferably 120° C. to 170° C. The post-baking time is preferably 1 to 30 minutes, and more preferably 3 to 15 minutes. Post-baking may be carried out in atmosphere or in nitrogen. From the viewpoint of the curability of a film, post-baking is preferably performed in nitrogen.

<Solid-State Imaging Device>

The solid-state imaging device of the present invention has the above-mentioned color filter of the present invention. The configuration of the solid-state imaging device of the present invention is not particularly limited as long as the solid-state imaging device is configured to include the color filter of the present invention and function as a solid-state imaging device. However, examples thereof include the following configurations.

The solid-state imaging device is configured to have a plurality of photodiodes constituting a light-receiving area of the solid-state imaging device (a charge-coupled device (CCD) image sensor, a complementary metal-oxide semiconductor (CMOS) image sensor image sensor, or the like), and a transfer electrode formed of a polysilicon and the like on a substrate; have a light-shielding film having openings only over the light receiving portion of the photodiodes on the photodiodes and the transfer electrode; have a device-protective layer formed of silicon nitride or the like, which is formed to cover the entire surface of the light-shielding film and the light receiving portion of the photodiodes, on the light-shielding film; and have a color filter on the device-protective layer. In addition, the solid-state imaging device may also be configured, for example, such that it has a light collecting means (for example, a microlens, which shall apply hereinafter) on a device-protective layer under a color filter (a side closer to the substrate), or has a light-collecting means on a color filter. In addition, the color filter may have a structure in which a cured film forming each color pixel is embedded in, for example, a space partitioned in a lattice shape by a partition wall. The partition wall in this case preferably has a low refractive index for each color pixel. Examples of an imaging device having such a structure include the devices described in JP2012-227478A and JP2014-179577A.

Furthermore, it is also preferable that the solid-state imaging device of the present invention further has an organic photoelectric conversion film. Examples of the solid-state imaging device having the organic photoelectric conversion film include a solid-state imaging device having the following configuration.

A configuration in which an organic photoelectric conversion film is formed on an inorganic photoelectric conversion portion, and a color filter is further formed through a protective layer may be exemplified. Further, the protective layer may be omitted. A configuration in which pixels of a color filter are formed corresponding to an inorganic photoelectric conversion portion, and for example, pixels of a cyan color filter and pixels of a yellow color filter are arranged to extract blue and red may also be exemplified. The pixels of the cyan color filter are preferably constituted with the coloring composition of the present invention. Further, a light-collecting lens that collects light incident on the inorganic photoelectric conversion portion may be formed on the pixels of each of the color filters.

By allowing the organic photoelectric conversion film to absorb, for example, green light, it is possible for the inorganic photoelectric conversion portion to easily perform the separation of blue light and red light. The organic photoelectric conversion film has a maximum absorption wavelength in the range of preferably 510 to 560 nm, and more preferably 520 to 550 nm. Here, the maximum absorption wavelength means an absorption wavelength having the highest light absorbance. The absorbance at this maximum absorption wavelength, that is, the maximum absorbance is preferably from 80% to 100%, and more preferably from 90% to 100%. The absorbance half-value width is preferably from 50 nm to 100 nm, and more preferably from 60 nm to 90 nm. Here, the absorbance half-value width means a width at an absorption wavelength in the absorbance of the half-value at the maximum absorbance.

This solid-state imaging device extracts green signals from the organic photoelectric conversion film, and blue and red can be extracted by the combination with pixels of cyan and yellow color filters. Such the color matching and combination are not limited to the above examples, B (blue), G (green), R (red), Cy (cyan), M (magenta), and Y (yellow) can be appropriately combined to obtain a solid-state imaging device in a desired form.

With regard to details of the solid-state imaging device in the above configuration, reference can be made to paragraphs 0009 to 0143 of JP2015-38979A, the contents of which are incorporated herein by reference.

<Image Display Device>

The color filter of the present invention can be used for an image display device such as a liquid crystal display device and an organic electroluminescence display device. The definitions of the image display device or the details of each of the image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices in various modes described in the above "Liquid Crystal Display Technology for Next Generation".

EXAMPLES

Hereinbelow, the present invention will be described in more detail with reference to Examples. The materials, the amounts of use, the proportions, the treatment details, the treatment procedures, and the like shown in Examples below can be modified as appropriate without departing from the spirit of the present invention. Therefore, the scope of the present invention is not intended to be limited to the specific examples shown below. Further, "part(s)" and "%" are given on the basis of mass unless otherwise specifically stated.

<Measurement of Weight-Average Molecular Weight>

The weight-average molecular weight of the resin was measured by the following method.

Types of columns: Columns of TOSOH TSKgel Super HZM-H, TOSOH TSKgel Super HZ4000, and TOSOH TSKgel Super HZ2000 connected in series Developing solvent: Tetrahydrofuran Column temperature: 40° C.

Flow rate (injection amount of a sample): 1.0 μL (sample concentration: 0.1% by mass)

Name of apparatus: HLC-8220GPC manufactured by TOSOH CORPORATION

Detector: Refractive Index (RI) detector

Calibration curve base resin: Polystyrene

<Method for Measuring Acid Value>

The acid value is expressed in the mass of potassium hydroxide required to neutralize acidic components per gram of a solid content. A measurement sample was dissolved in a mixed solvent of tetrahydrofuran/water=9/1 (mass ratio), and the obtained solution was titrated by neutralization with a 0.1-mol/L aqueous sodium hydroxide solution, using a potentiometric titrator (trade name: AT-510, manufactured by Kyoto Electronics Manufacturing Co., Ltd.), at 25° C. The acid value was calculated by the following equation, using an inflection point in a titration pH curve as a titration end point.

$$A = 56.11 \times Vs \times 0.5 \times f/w$$

A: Acid value (mgKOH/g)

Vs: Used amount (mL) of the 0.1-mol/L aqueous sodium hydroxide solution required for titration f: Titer of the 0.1-mol/L aqueous sodium hydroxide solution w: Mass (g) (in terms of a solid content) of the measurement sample <Method for Measuring Amine Value>

The amine value is expressed in the mass of potassium hydroxide (KOH) equivalent to the basic components per gram of a solid content. A measurement sample was dissolved in acetic acid, and the obtained solution was titrated by neutralization with a 0.1-mol/L aqueous perchloric acid/acetic acid solution, using a potentiometric titrator (trade name: AT-510, manufactured by Kyoto Electronics Manufacturing Co., Ltd.), at 25° C. The amine value was calculated by the following equation, using an inflection point in a titration pH curve as a titration end point.

$$B = 56.11 \times Vs \times 0.1 \times f/w$$

B: Amine value (mgKOH/g)

Vs: Use amount (mL) of the 0.1-mol/L aqueous perchloric acid/acetic acid solution required for titration f: Titer of the 0.1-mol/L aqueous perchloric acid/acetic acid solution w: Mass (g) (in terms of a solid content) of the measurement sample <Preparation of Pigment Dispersion Liquid>

A mixed liquid obtained by blending the materials shown in the following table was mixed and dispersed for 3 hours with a bead mill (a high-pressure dispersion device NANO-3000-10 (manufactured by Japan BEE) equipped with a decompression mechanism), using zirconia beads with a diameter of 0.3 mm, thereby preparing a pigment dispersion liquid.

TABLE 1

|  | Pigment | Addition amount (parts by mass) | Pigment derivative | Addition amount (parts by mass) | Dispersant | Addition amount (parts by mass) | solvent | Addition amount (parts by mass) |
| --- | --- | --- | --- | --- | --- | --- | --- | --- |
| Dispersion liquid 1 | A-1 | 10 | B-1 | 1 | C-1 | 6 | PGMEA | 83 |
| Dispersion liquid 2 | A-2 | 10 | B-1 | 1 | C-1 | 6 | PGMEA | 83 |
| Dispersion liquid 3 | A-3 | 10 | B-1 | 1 | C-1 | 6 | PGMEA | 83 |
| Dispersion liquid 4 | A-4 | 10 | B-1 | 1 | C-1 | 6 | PGMEA | 83 |
| Dispersion liquid 5 | A-5 | 10 | B-1 | 1 | C-1 | 6 | PGMEA | 83 |
| Dispersion liquid 6 | A-5 | 10 | B-2 | 1 | C-1 | 6 | PGMEA | 83 |
| Dispersion liquid 7 | A-5 | 10 | B-3 | 1 | C-1 | 6 | PGMEA | 83 |
| Dispersion liquid 8 | A-5 | 10 | B-4 | 1 | C-1 | 6 | PGMEA | 83 |
| Dispersion liquid 9 | A-5 | 10 | B-5 | 1 | C-1 | 6 | PGMEA | 83 |
| Dispersion liquid 10 | A-5 | 10 | B-1 | 1 | C-2 | 6 | PGMEA | 83 |
| Dispersion liquid 11 | A-5 | 10 | B-1 | 1 | C-2 | 4 | PGMEA | 85 |
| Dispersion liquid 12 | A-5 | 10 | B-1 | 1 | C-2 | 3 | PGMEA | 86 |
| Dispersion liquid 13 | A-5 | 10 | B-1 | 1 | C-3 | 6 | PGMEA | 83 |
| Dispersion liquid 14 | A-5 | 10 | B-1 | 1 | C-4 | 6 | PGMEA | 83 |
| Dispersion liquid 15 | A-5 | 10 | B-1 | 1 | C-5 | 6 | PGMEA | 83 |
| Dispersion liquid 16 | A-5 | 10 | B-1 | 1 | C-6 | 6 | PGMEA | 83 |
| Dispersion liquid 17 | A-5 | 10 | B-1 | 1 | C-7 | 6 | PGMEA | 83 |
| Dispersion liquid 18 | A-6 | 10 | B-1 | 1 | C-1 | 6 | PGMEA | 83 |
| Dispersion liquid 19 | A-7 | 10 | B-1 | 1 | C-1 | 6 | PGMEA | 83 |
| Dispersion liquid 20 | A-5/A-8 | 5/5 | B-1 | 1 | C-1 | 6 | PGMEA | 81 |

TABLE 1-continued

| | Pigment | Addition amount (parts by mass) | Pigment derivative | Addition amount (parts by mass) | Dispersant | Addition amount (parts by mass) | solvent | Addition amount (parts by mass) |
| --- | --- | --- | --- | --- | --- | --- | --- | --- |
| Dispersion liquid 21 | A-5/A-9 | 5/5 | B-1 | 1 | C-1 | 6 | PGMEA | 81 |
| Dispersion liquid 22 | A-13 | 10 | B-1 | 1 | C-1 | 6 | PGMEA | 83 |
| Dispersion liquid 23 | A-5 | 10 | B-1 | 1 | C-8 | 6 | PGMEA | 83 |
| Comparative dispersion liquid 1 | A-5 | 10 | B-6 | 1 | C-8 | 6 | PGMEA | 83 |
| Comparative dispersion liquid 2 | A-5 | 10 | None | 0 | C-1 | 6 | PGMEA | 84 |
| Comparative dispersion liquid 3 | A-8 | 10 | B-1 | 1 | C-1 | 6 | PGMEA | 83 |
| Comparative dispersion liquid 4 | A-9 | 10 | B-1 | 1 | C-1 | 6 | PGMEA | 83 |
| PY138 dispersion liquid | A-10 | 10 | B-1 | 1 | C-3 | 6 | PGMEA | 83 |
| PY139 dispersion liquid | A-11 | 10 | B-1 | 1 | C-1 | 6 | PGMEA | 83 |
| PY185 dispersion liquid | A-12 | 10 | B-1 | 1 | C-1 | 6 | PGMEA | 83 |

The raw materials described in the table are as follows.
(Pigments)
A-1 to A-7, and A-13: Compounds having the following structures (aluminum phthalocyanine pigments)

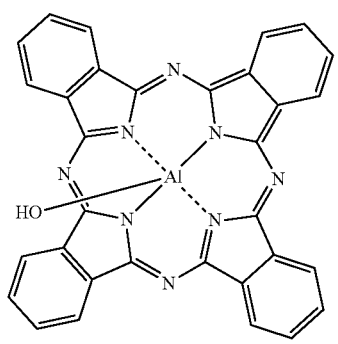

A-1

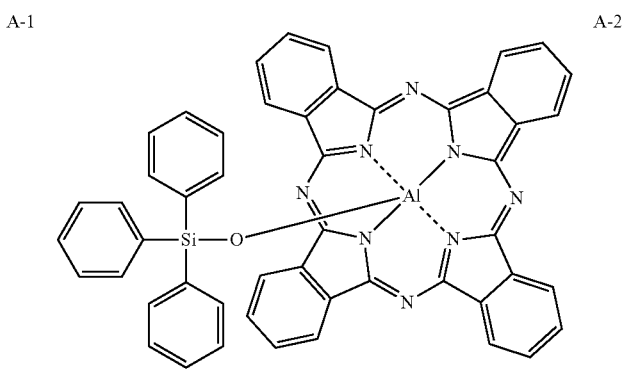

A-2

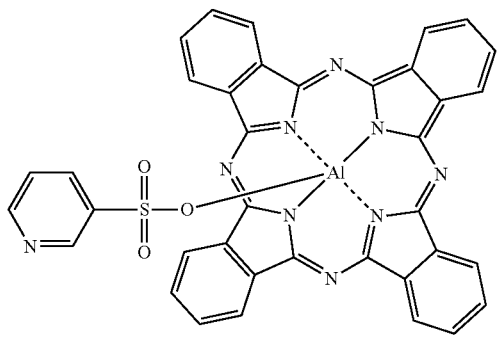

A-3

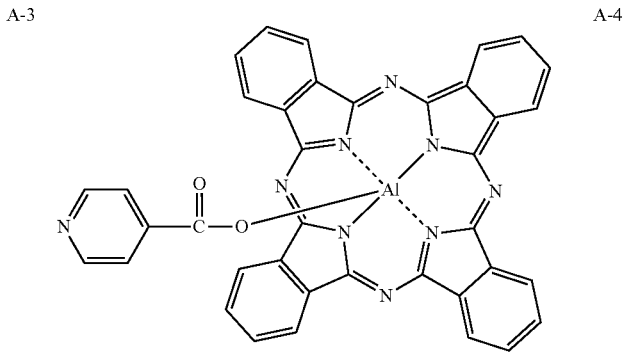

A-4

-continued
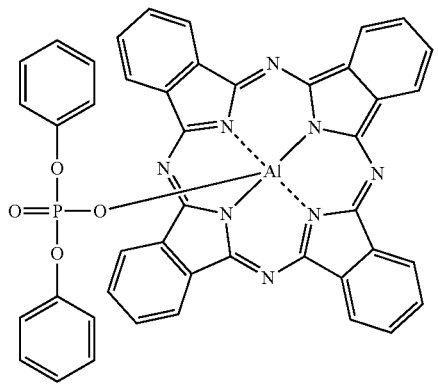
A-5
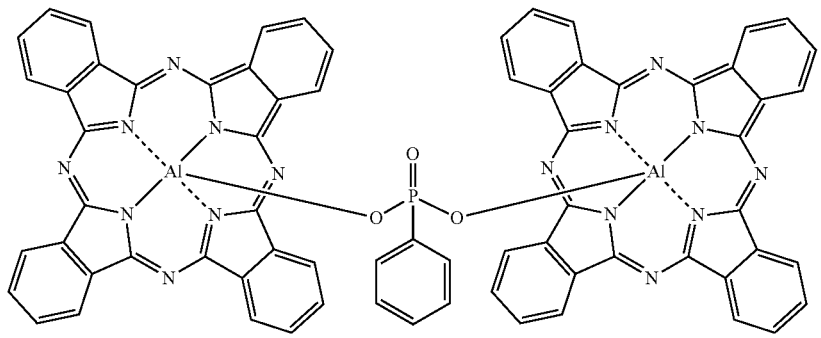
A-6
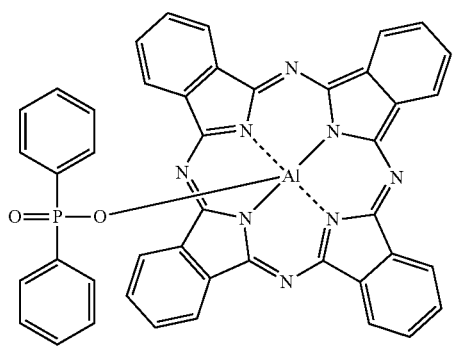
A-7
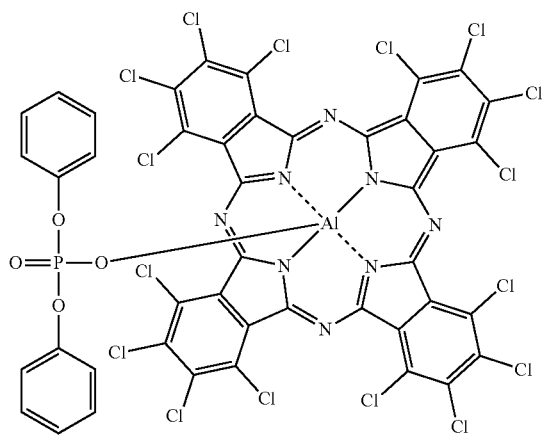
A-13

A-8: C. I. Pigment Green 58 (FASTOGEN Green Al 10, manufactured by DIC Corporation)

A-9: C. I. Pigment Green 36 (FASTOGEN Green 2YK, manufactured by DIC Corporation)

A-10: C. I. Pigment Yellow 138 (Paliotol Yellow L 0962 HD, manufactured by BASF)

A-11: C. I. Pigment Yellow 139 (Paliotol Yellow L 2140 HD, manufactured by BASF)

A-12: C. I. Pigment Yellow 185 (Paliotol Yellow L 1155, manufactured by BASF)

(Pigment Derivatives)

B-1 to B-6: Compounds having the following structures

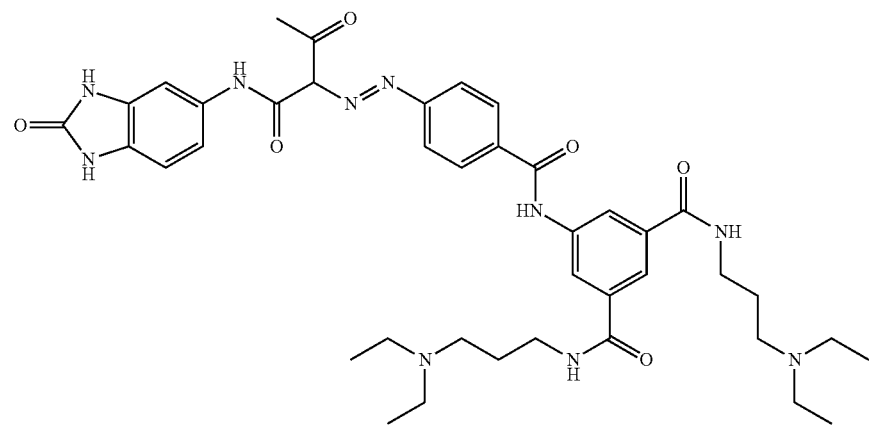

B-1

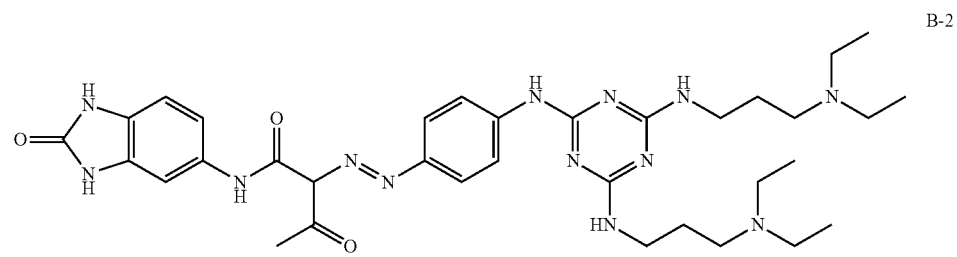

B-2

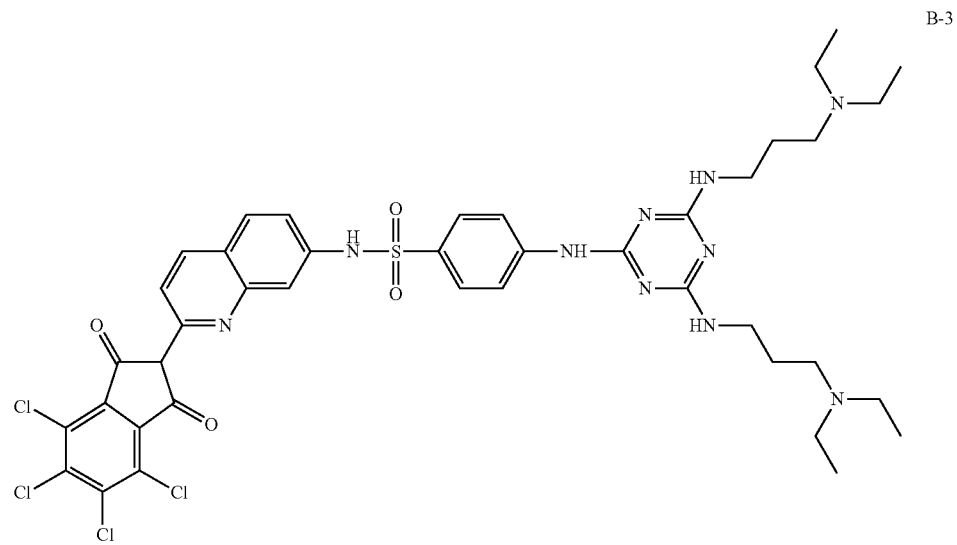

B-3

-continued

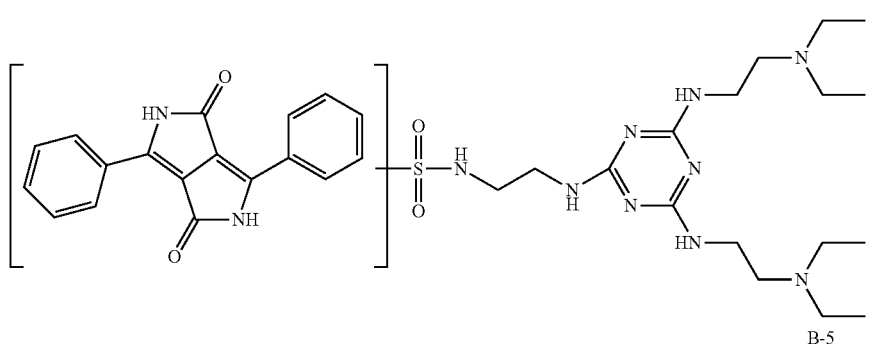
B-4

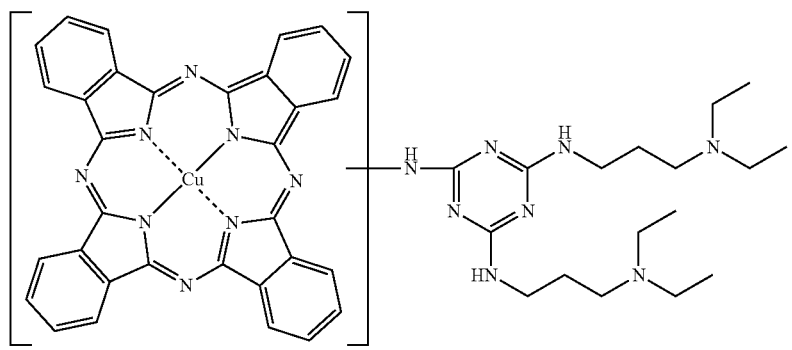
B-5

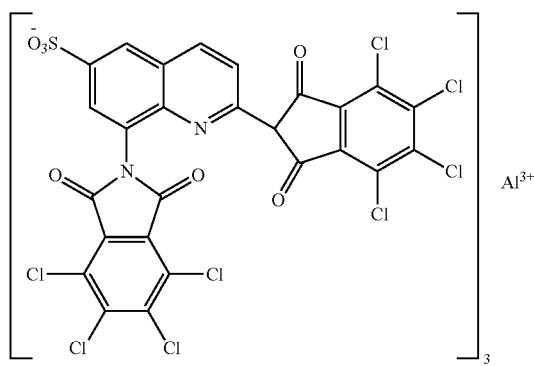
B-6

(Dispersants)

C-1 to C-8: Resins having the following structures. The numerical values described with the respective repeating units represent the contents [mass ratio] of the respective repeating units, and the numerical values described with the repeating units in the side chain represent the repetition numbers of the repeating moieties.

C-1: (amine value=0 mgKOH/g, acid value=64.9 mgKOH/g, weight-average molecular weight=12,000)

C-2: (amine value=0 mgKOH/g, acid value=51.7 mgKOH/g, weight-average molecular weight=13,000)

C-3: (amine value=73.5 mgKOH/g, acid value=51.6 mgKOH/g, weight-average molecular weight=11,000)

C-4: (amine value=45 mgKOH/g, acid value=32 mgKOH/g, weight-average molecular weight=15,000)

C-5: (amine value=0 mgKOH/g, acid value=58.2 mgKOH/g, weight-average molecular weight=10,000)

C-6: (amine value=0 mgKOH/g, acid value=4.8 mgKOH/g, weight-average molecular weight=15,000)

C-7: (amine value=21.6 mgKOH/g, acid value=48.6 mgKOH/g, weight-average molecular weight=13,000)

C-8: (amine value=187.2 mgKOH/g, acid value=0 mgKOH/g, weight-average molecular weight=12,000)

C-1

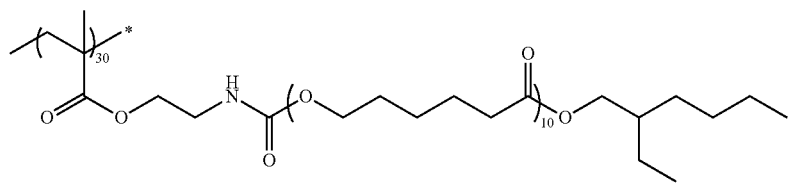

-continued
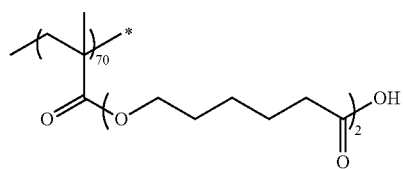
C-2
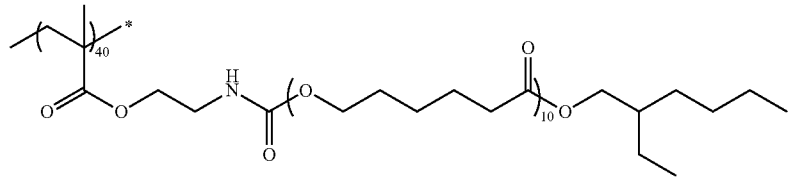
C-3
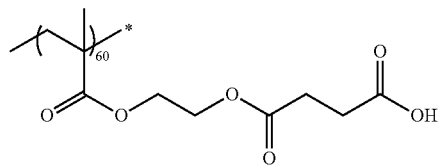
C-4
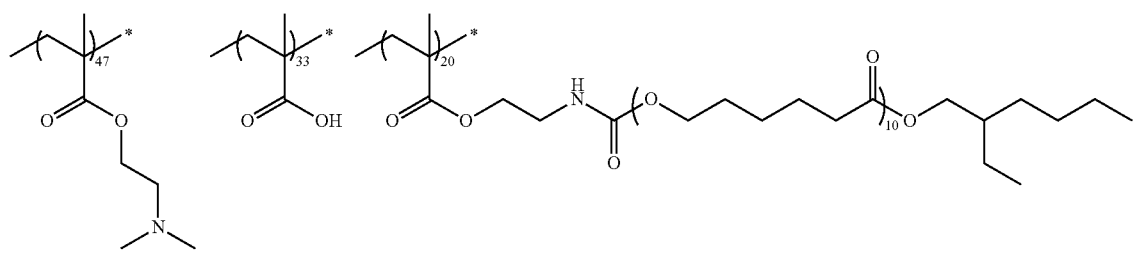
C-5
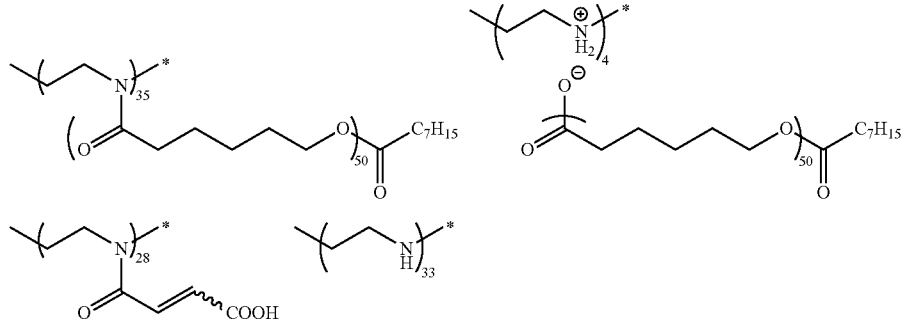
C-6
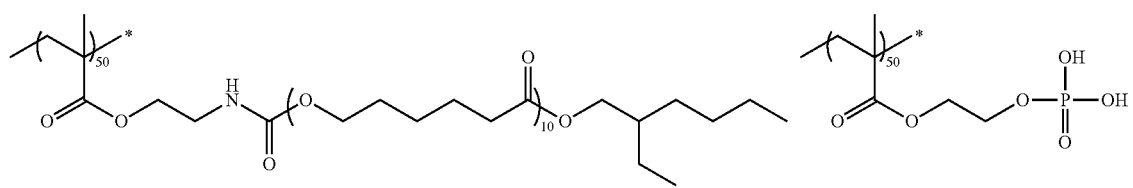
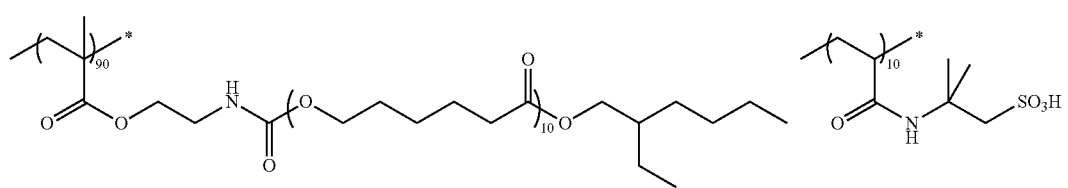

-continued

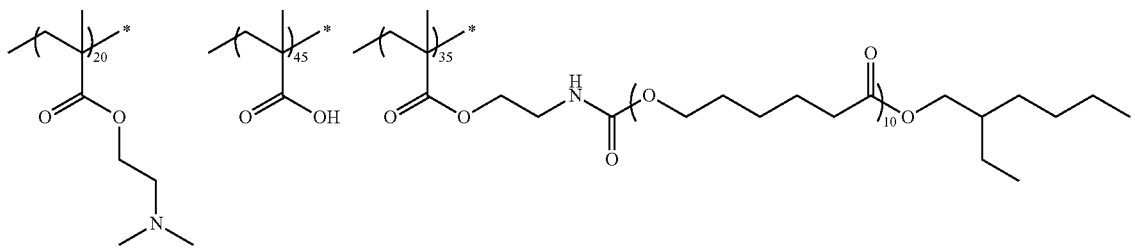

C-7

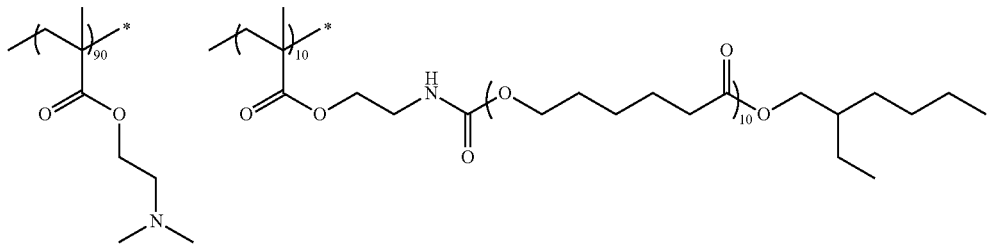

C-8

(Solvent)
PGMEA: Propylene glycol monomethyl ether acetate
<Preparation of Coloring Composition>
The following components were mixed to produce a coloring composition.

TABLE 2-1

| | Dispersion liquid | Addition amount (parts by mass) | Polymerizable compound | Addition amount (parts by mass) | Photopolymerization initiator | Addition amount (parts by mass) | Resin | Addition amount (parts by mass) | Others | Addition amount (parts by mass) | Solvent | Addition amount (parts by mass) |
|---|---|---|---|---|---|---|---|---|---|---|---|---|
| Coloring composition Example 1 | Dispersion liquid 1 | 60 | D-1 | 4.2 | E-1 | 0.8 | H-1 | 1.2 | None | 0 | S-1 | 33.8 |
| Coloring composition Example 2 | Dispersion liquid 2 | 60 | D-1 | 4.2 | E-1 | 0.8 | H-1 | 1.2 | None | 0 | S-1 | 33.8 |
| Coloring composition Example 3 | Dispersion liquid 3 | 60 | D-1 | 4.2 | E-1 | 0.8 | H-1 | 1.2 | None | 0 | S-1 | 33.8 |
| Coloring composition Example 4 | Dispersion liquid 4 | 60 | D-1 | 4.2 | E-1 | 0.8 | H-1 | 1.2 | None | 0 | S-1 | 33.8 |
| Coloring composition Example 5 | Dispersion liquid 5 | 60 | D-1 | 4.2 | E-1 | 0.8 | H-1 | 1.2 | None | 0 | S-1 | 33.8 |
| Coloring composition Example 6 | Dispersion liquid 6 | 60 | D-1 | 4.2 | E-1 | 0.8 | H-1 | 1.2 | None | 0 | S-1/S-2 | 18.8/15 |
| Coloring composition Example 7 | Dispersion liquid 7 | 60 | D-1 | 4.2 | E-1 | 0.8 | H-1 | 1.2 | None | 0 | S-1/S-3 | 18.8/15 |
| Coloring composition Example 8 | Dispersion liquid 8 | 60 | D-1 | 4.2 | E-1 | 0.8 | H-1 | 1.2 | None | 0 | S-1 | 33.8 |
| Coloring composition Example 9 | Dispersion liquid 9 | 60 | D-1 | 4.2 | E-1 | 0.8 | H-1 | 1.2 | None | 0 | S-1 | 33.8 |
| Coloring composition Example 10 | Dispersion liquid 10 | 60 | D-1 | 4.2 | E-1 | 0.8 | H-1 | 1.2 | None | 0 | S-1 | 33.8 |
| Coloring composition Example 11 | Dispersion liquid 11 | 60 | D-1 | 4.2 | E-1 | 0.8 | H-1 | 1.2 | None | 0 | S-1 | 33.8 |
| Coloring composition Example 12 | Dispersion liquid 11 | 60 | D-2 | 4.2 | E-1 | 0.8 | H-1 | 1.2 | None | 0 | S-1 | 33.8 |

TABLE 2-1-continued

| | Dispersion liquid | Addition amount (parts by mass) | Polymerizable compound | Addition amount (parts by mass) | Photopolymerization initiator | Addition amount (parts by mass) | Resin | Addition amount (parts by mass) | Others | Addition amount (parts by mass) | Solvent | Addition amount (parts by mass) |
|---|---|---|---|---|---|---|---|---|---|---|---|---|
| Coloring composition Example 13 | Dispersion liquid 11 | 60 | D-2 | 4.2 | E-2 | 0.8 | H-1 | 1.2 | None | 0 | S-1 | 33.8 |
| Coloring composition Example 14 | Dispersion liquid 11 | 60 | D-2 | 4.2 | E-3 | 0.8 | H-1 | 1.2 | None | 0 | S-1 | 33.8 |
| Coloring composition Example 15 | Dispersion liquid 11 | 60 | D-2 | 4.2 | E-3 | 0.8 | H-1 | 1.2 | None | 0 | S-1 | 33.8 |
| Coloring composition Example 16 | Dispersion liquid 11 | 60 | D-2 | 4.2 | E-3 | 0.8 | H-2 | 1.2 | None | 0 | S-1 | 33.8 |
| Coloring composition Example 17 | Dispersion liquid 11 | 60 | D-2 | 4.2 | E-3 | 0.8 | H-2 | 1.2 | F-1 | 3 | S-1 | 30.8 |
| Coloring composition Example 18 | Dispersion liquid 11 | 60 | D-2 | 4.2 | E-3 | 0.8 | H-2 | 1.2 | F-2 | 3 | S-1 | 30.8 |
| Coloring composition Example 19 | Dispersion liquid 11 | 60 | D-2 | 4.2 | E-3 | 0.8 | H-2 | 1.2 | F-1/G-1 | 3/0.3 | S-1 | 30.5 |
| Coloring composition Example 20 | Dispersion liquid 11 | 60 | D-2 | 4.2 | E-3 | 0.8 | H-2 | 1.2 | F-1/G-2 | 3/0.3 | S-1 | 30.5 |
| Coloring composition Example 21 | Dispersion liquid 11 | 60 | D-2 | 4.2 | E-3 | 0.8 | H-2 | 1.2 | F-1/G-3 | 3/0.3 | S-1 | 30.5 |
| Coloring composition Example 22 | Dispersion liquid 11 | 60 | D-2 | 4.2 | E-3 | 0.8 | H-2 | 1.2 | F-1/G-4 | 3/0.3 | S-1 | 30.5 |
| Coloring composition Example 23 | Dispersion liquid 11 | 60 | D-2 | 4.2 | E-3 | 0.8 | H-2 | 1.2 | F-1/G-5 | 3/0.3 | S-1 | 30.5 |
| Coloring composition Example 24 | Dispersion liquid 11 | 60 | D-2 | 4.2 | E-3 | 0.8 | H-2 | 1.2 | F-1/G-6 | 3/0.3 | S-1 | 30.5 |
| Coloring composition Example 25 | Dispersion liquid 11 | 60 | D-2 | 4.2 | E-3 | 0.8 | H-2 | 1.2 | F-1/G-7 | 3/0.3 | S-1 | 30.5 |
| Coloring composition Example 26 | Dispersion liquid 11 | 60 | D-2 | 4.2 | E-3 | 0.8 | H-2 | 1.2 | F-1/G-8 | 3/0.3 | S-1 | 30.5 |
| Coloring composition Example 27 | Dispersion liquid 11 | 60 | D-1 | 4.2 | E-4 | 0.8 | H-1 | 1.2 | None | 0 | S-1 | 33.8 |
| Coloring composition Example 28 | Dispersion liquid 11 | 60 | D-1 | 4.2 | E-1/E-5 | 0.8/0.2 | H-1 | 1.2 | None | 0 | S-1 | 33.6 |
| Coloring composition Example 29 | Dispersion liquid 12 | 60 | D-1 | 4.2 | E-1 | 0.8 | H-1 | 1.2 | None | 0 | S-1 | 33.8 |
| Coloring composition Example 30 | Dispersion liquid 13 | 60 | D-1 | 4.2 | E-1 | 0.8 | H-1 | 1.2 | None | 0 | S-1 | 33.8 |
| Coloring composition Example 31 | Dispersion liquid 14 | 60 | D-1 | 4.2 | E-1 | 0.8 | H-1 | 1.2 | None | 0 | S-1 | 33.8 |
| Coloring composition Example 32 | Dispersion liquid 15 | 60 | D-1 | 4.2 | E-1 | 0.8 | H-1 | 1.2 | None | 0 | S-1 | 33.8 |
| Coloring composition Example 33 | Dispersion liquid 16 | 60 | D-1 | 4.2 | E-1 | 0.8 | H-1 | 1.2 | None | 0 | S-1/S-2 | 18.8/15 |
| Coloring composition Example 34 | Dispersion liquid 17 | 60 | D-1 | 4.2 | E-1 | 0.8 | H-1 | 1.2 | None | 0 | S-1/S-3 | 18.8/15 |
| Coloring composition Example 35 | Dispersion liquid 18 | 60 | D-1 | 4.2 | E-1 | 0.8 | H-1 | 1.2 | None | 0 | S-1 | 33.8 |
| Coloring composition Example 36 | Dispersion liquid 19 | 60 | D-1 | 4.2 | E-1 | 0.8 | H-1 | 1.2 | None | 0 | S-1 | 33.8 |
| Coloring composition Example 37 | Dispersion liquid 20 | 60 | D-1 | 4.2 | E-1 | 0.8 | H-1 | 1.2 | None | 0 | S-1 | 33.8 |

TABLE 2-1-continued

| | Dispersion liquid | Addition amount (parts by mass) | Polymerizable compound | Addition amount (parts by mass) | Photopolymerization initiator | Addition amount (parts by mass) | Resin | Addition amount (parts by mass) | Others | Addition amount (parts by mass) | Solvent | Addition amount (parts by mass) |
|---|---|---|---|---|---|---|---|---|---|---|---|---|
| Coloring composition Example 38 | Dispersion liquid 21 | 60 | D-1 | 4.2 | E-1 | 0.8 | H-1 | 1.2 | None | 0 | S-1 | 33.8 |
| Coloring composition Example 39 | Dispersion liquid 22 | 60 | D-1 | 4.2 | E-1 | 0.8 | H-1 | 1.2 | None | 0 | S-1 | 33.8 |
| Coloring composition Example 40 | Dispersion liquid 23 | 60 | D-1 | 4.2 | E-1 | 0.8 | H-1 | 1.2 | None | 0 | S-1 | 33.8 |

TABLE 2-2

| | Dispersion liquid | Addition amount (parts by mass) | Polymerizable compound | Addition amount (parts by mass) | Photopolymerization initiator | Addition amount (parts by mass) | Resin | Addition amount (parts by mass) | Others | Addition amount (parts by mass) | Solvent | Addition amount (parts by mass) |
|---|---|---|---|---|---|---|---|---|---|---|---|---|
| Comparative coloring composition 1 | Comparative dispersion liquid 1 | 60 | D-1 | 4.2 | E-1 | 0.8 | H-1 | 1.2 | None | 0 | S-1 | 33.8 |
| Comparative coloring composition 2 | Comparative dispersion liquid 2 | 60 | D-1 | 4.2 | E-1 | 0.8 | H-1 | 1.2 | None | 0 | S-1 | 33.8 |
| Comparative coloring composition 3 | Comparative dispersion liquid 3 | 60 | D-1 | 4.2 | E-1 | 0.8 | H-1 | 1.2 | None | 0 | S-1 | 33.8 |
| Comparative coloring composition 4 | Comparative dispersion liquid 4 | 60 | D-1 | 4.2 | E-1 | 0.8 | H-1 | 1.2 | None | 0 | S-1 | 33.8 |
| Comparative coloring composition 5 | Dispersion liquid 5/ PY138 Dispersion liquid | 25/35 | D-1 | 4.2 | E-1 | 0.8 | H-1 | 1.2 | None | 0 | S-1 | 33.8 |
| Comparative coloring composition 6 | Dispersion liquid 5/ PY139 Dispersion liquid | 30/30 | D-1 | 4.2 | E-1 | 0.8 | H-1 | 1.2 | None | 0 | S-1 | 33.8 |
| Comparative coloring composition 7 | Dispersion liquid 5/ PY185 Dispersion liquid | 45/15 | D-1 | 4.2 | E-1 | 0.8 | H-1 | 1.2 | None | 0 | S-1 | 33.8 |
| PY139 composition | PY139 Dispersion liquid | 60 | D-1 | 4.2 | E-1 | 0.8 | H-1 | 1.2 | None | 0 | S-1 | 33.8 |
| PY150 composition | PY150 Dispersion liquid | 60 | D-1 | 4.2 | E-1 | 0.8 | H-1 | 1.2 | None | 0 | S-1 | 33.8 |
| Transparent composition | None | 0 | D-1 | 7.5 | E-1 | 0.8 | H-1 | 7.5 | None | 0 | S-1 | 84.2 |

The raw materials in the table are as follows.

(Polymerizable Compounds)

D-1: KAYARAD DPHA (manufactured by Nippon Kayaku Co., Ltd.)

D-2: NK ESTER A-TMMT (manufactured by Shin-Nakamura Chemical Co., Ltd.)

(Photopolymerization Initiators)

E-1: IRGACURE OXE01 (manufactured by BASF)

E-2: IRGACURE OXE02 (manufactured by BASF)

E-3: The following compounds

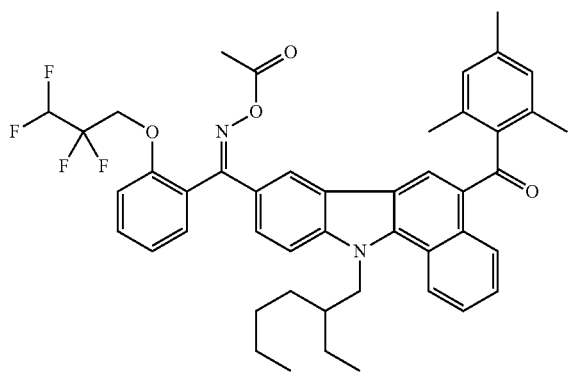

E-4: IRGACURE 379 (manufactured by BASF)

E-5: IRGACURE 2959 (manufactured by BASF)

(Epoxy Compounds)

F-1: EHPE 3150 (manufactured by Daicel Chemical Industries, Ltd.)

F-2: EPICLON N-695 (manufactured by DIC Corporation)

(Resins)

H-1: The resin having the following structure (acid value of 113 mgKOH/g, Mw=33,000). The numerical values described with the respective repeating units represent the contents [mass ratio] of the respective repeating units.

H-2: The resin having the following structure (acid value of 32 mgKOH/g, Mw=14,000). The numerical values described with the respective repeating units represent the contents [mass ratio] of the respective repeating units.

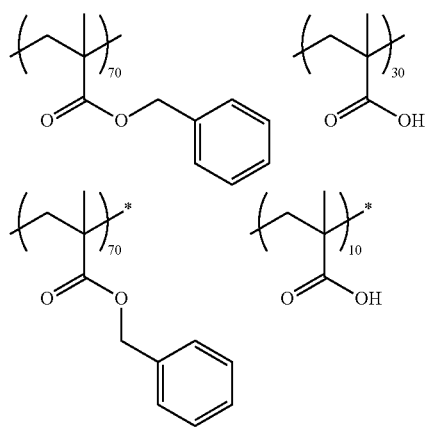

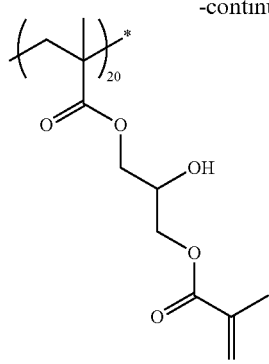

(Curing Aids)

G-1: 1-Benzyl-2-methylimidazole

G-2: 1,2-Dimethylimidazole

G-3: 2-Phenylimidazole

G-4: 1-Cyanoethyl-2-ethyl-4-methylimidazole

G-5: 4,4'-Aminodiphenylsulfone

G-6: AMICURE UDH-J (manufactured by Ajinomoto Fine-Techno Co., Inc.)

G-7: Salicylic hydrazide (manufactured by Otsuka Kagaku Kabushiki Kaisha)

G-8: U-CAT SA102 (manufactured by San-Apro, Ltd.)

(Solvents)

S-1 Propylene glycol monomethyl ether acetate

S-2 Propylene glycol monomethyl ether

S-3 Cyclohexanone

<Evaluation of Moisture Resistance>

The coloring composition was applied onto a glass wafer with an undercoat layer such that the film thickness after drying reached 0.8 μm, using a spin coater, and a heating treatment (prebaking) was performed using a hot plate at 110° C. for 120 seconds. Subsequently, the obtained composition layer was exposed with light at a wavelength of 365 nm at 1,000 mJ/cm² through a mask with a pattern in 2 cm×2 cm, using an i-ray stepper exposure apparatus FPA-3000i5+ (manufactured by Canon Inc.). Thereafter, the glass wafer having the exposed composition layer formed thereon was placed on a horizontal rotary table of a spin-shower developing machine (DW-30 Type, manufactured by Chemitronics Co., Ltd.), and subjected to puddle development at 23° C. for 60 seconds, using a 60%-by-mass diluted solution of CD-2000 (manufactured by Fujifilm Electronics Materials) as a developer, thereby forming a colored pattern on the glass wafer.

The glass wafer having the colored pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in a shower form from above the rotational center from discharge nozzles, and then spin-dried.

Incidentally, a heating treatment (post-baking) using a hot plate and additive exposure (light source: including a high-pressure mercury lamp (ozone-free) and light at a wavelength of 254 to 350 nm), using UMA-802 manufactured by USHIO Inc., under the conditions described in Table 3, thereby obtaining a color filter.

The obtained color filter was left to stand for 500 hours in an atmosphere of a temperature of 130° C. and a relative humidity of 85%, using a HAST tester (EHS-221M) manufactured by ESPEC Corporation, and subjected to a moisture resistance test. Transmittance changes at a wavelength of 400 to 700 nm between before and after the moisture resistance test were measured, and a transmittance change at a wavelength with the maximum transmittance change shown was taken as an evaluation standard for the moisture resistance.

Transmittance change $\Delta T$ % max=|Transmittance before moisture resistance test-Transmittance after moisture resistance test|

A: $\Delta T$ % max<0.5%
B: 0.5%<$\Delta T$ % max<1.0%
C: 1.0%<$\Delta T$ % max<3.0%
D: 3.0%<$\Delta T$ % max<5.0%
E: $\Delta T$ % max>5.0%

<Evaluation of Residue>

The coloring composition obtained above was applied onto an 8-inch (200-mm) silicon wafer with an undercoat layer such that the film thickness after drying reached 0.8 µm, using a spin coater, and a heating treatment (prebaking) was performed, using a hot plate at 110° C. for 120 seconds.

Subsequently, the obtained composition layer was exposed (at an exposure dose of 50 to 1,700 mJ/cm$^2$) with light at a wavelength of 365 nm through a mask with an island pattern in 1.0 µm$^2$, using an i-ray stepper exposure apparatus FPA-3000i5+(manufactured by Canon Inc.). Then, the composition layer after exposure was subjected to development using a development apparatus (Act-8 manufactured by Tokyo Electron Ltd.). The composition layer was subjected to shower development at 23° C. for 60 seconds, using a 0.3%-by-mass aqueous tetramethylammonium hydroxide (TMAH) solution as a developer. Thereafter, the composition layer was subjected to rinsing in spin shower using pure water to obtain a pattern. The obtained pattern was observed (magnification: 20,000 times) using a scanning electron microscope (SEM) (S-4800H, manufactured by Hitachi High-Technologies Corporation), and the residue was evaluated. The evaluation standard for a residue is as follows.

A: There is no residue in a non-image area between patterns.
B: A residue with a maximum length of less than 0.01 µm is observed in a non-image area between patterns.
C: A residue with a maximum length of 0.01 µm or more and less than 0.05 µm is observed in a non-image area between patterns.
D: A residue with a maximum length of 0.05 µm or more and less than 0.10 µm is observed in a non-image area between patterns.
E: A residue with a maximum length of 0.10 m or more is observed in a non-image area between patterns.

<Adhesiveness>

A pattern group having a pattern size of 1.0 µm among the patterns prepared in Evaluation of Residue was observed (magnification: 100 times) using an optical microscope (manufactured by Olympus Corporation). The evaluation standard for the adhesiveness is as follows.

A: There are no release and defects of patterns.
B: A total occurrence of the release and defects of patterns is less than 5%.
C: A total occurrence of the release and defects of patterns is 5% or more and less than 10%.
D: A total occurrence of the release and defects of patterns is 10% or more and less than 30%.
E: A total occurrence of the release and defects of patterns is 30% or more.

<Evaluation of Temporal Stability>

The coloring composition obtained above immediately after the production thereof was applied onto an 8-inch (200-mm) silicon wafer with an undercoat layer such that the film thickness after drying reached 0.8 µm, using a spin coater, and a heating treatment (prebaking) was performed, using a hot plate at 110° C. for 120 seconds.

Subsequently, the obtained composition layer was exposed (at an exposure dose of 50 to 1,700 mJ/cm$^2$) with light at a wavelength of 365 nm through a mask with an island pattern in 1.0 µm$^2$, using an i-ray stepper exposure apparatus FPA-3000i5+(manufactured by Canon Inc.). Then, the composition layer after exposure was subjected to development using a development apparatus (Act-8 manufactured by Tokyo Electron Ltd.). The composition layer was subjected to shower development at 23° C. for 60 seconds, using a 0.3%-by-mass aqueous tetramethylammonium hydroxide (TMAH) solution as a developer. Thereafter, the composition layer was rinsed in spin shower using pure water to obtain a pattern. The size of the obtained pattern was observed (magnification: 20,000 times) using a scanning electron microscope (SEM) (S-4800H, manufactured by Hitachi High-Technologies Corporation), and an exposure dose at which the pattern size reached 1.0 m was taken as an exposure dose (Eopt) of each of the coloring compositions.

Subsequently, a liquid obtained by leaving each of the coloring compositions to stand at room temperature (23° C.) for 3 months was prepared, thereby preparing a pattern in the same manner as above. Exposure was performed at the exposure dose of Eopt determined above, and the pattern size was measured. A change rate between the pattern size using the coloring composition immediately after the production thereof and the pattern size using the coloring composition after being left to stand for 3 months was determined, and the temporal stability was evaluated according to the following standard.

Change rate in pattern size=(|Pattern size using the coloring composition immediately after the production thereof-Pattern size using the coloring composition after being left to stand for 3 months/Pattern size using the coloring composition immediately after the production thereof|)× 100

A: The change rate in pattern size is less than 1.0%.
B: The change rate in pattern size is more than 1.0% and less than 3.0%.
C: The change rate in pattern size is more than 3.0% and less than 5.0%.
D: The change rate in pattern size is more than 5.0% and less than 10.0%.
E: The change rate in pattern size is 10.0% or more.

<Evaluation of Residual Color Mixture>

(Residual Color Mixture 1)

The coloring composition described in Table 3 was applied onto a glass wafer with an undercoat layer such that the film thickness after drying reached 0.8 µm, using a spin coater, and a heating treatment (prebaking) was performed, using a hot plate at 110° C. for 120 seconds.

Subsequently, the obtained composition layer was exposed at 1,000 mJ/cm$^2$ with light at a wavelength of 365 nm through a mask with a pattern in 2 cm×2 cm, using an i-ray stepper exposure apparatus FPA-3000i5+(manufactured by Canon Inc.).

Thereafter, the glass wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using a 60%-by-mass diluted solution of CD-2000 (manufactured by Fujifilm Electronics Materials), thereby forming a pattern on the glass wafer.

The glass wafer having the pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in a shower form from above the rotational center from discharge nozzles, and then spin-dried.

Incidentally, a heating treatment (post-baking) using a hot plate and additive exposure (light source: including high-pressure mercury lamp (ozone-free) and light at a wavelength of 254 to 350 nm), using UMA-802 manufactured by USHIO Inc., under the conditions described in Table 3, thereby obtaining a monochromatic color filter having a first-layer pattern formed thereon.

Next, the PY150 coloring composition described in Table 2-2 was applied onto the color filter having the first-layer pattern formed thereon such that the film thickness after drying reached 0.8 μm, using a spin coater, and a heating treatment (prebaking) was performed, using a hot plate at 100° C. for 120 seconds, thereby obtaining a laminated color filter having a second-layer coloring composition layer (second layer) formed on the first-layer pattern.

Subsequently, the obtained laminated color filter was subjected to development, rinsing, and drying treatments in the same manner as for the formation of the first-layer pattern to remove the coloring composition layer in an uncured area by development.

The transmittance of the pattern was measured using MCPD-3000 (manufactured by Otsuka Electronics Co., Ltd.), and the transmittance change at a wavelength at which the transmittance change between a transmittance at a wavelength of 400 to 700 nm of the first-layer pattern immediately after formation of the pattern of the first-layer pattern and a transmittance of the first-layer pattern after development of the second-layer pattern is maximum was taken as $\Delta T$ % max, which was used as an evaluation standard for the residual color mixture 1.

$\Delta T$ % max=|Transmittance at a wavelength at which the transmittance change between the transmittance at a wavelength of 400 to 700 nm of the first-layer pattern immediately after formation of the pattern of the first-layer pattern and the transmittance of the first-layer pattern after development of the second-layer pattern is maximum|

As the $\Delta T$ % max is smaller, it is more difficult for residual color mixture to be generated, which is thus more preferable.

A: $\Delta T$ % max<0.5%
B: 0.5%<$\Delta T$ % max<1.0%
C: 1.0%<$\Delta T$ % max<3.0%
D: 3.0%<$\Delta T$ % max<5.0%
E: $\Delta T$ % max_5.0%

(Residual Color Mixture 2)

By the same method as in the evaluation 1 of residual color mixture except that the PY139 coloring composition described in Table 2-2 was used as the second-layer coloring composition, spectral variations were calculated and evaluated.

(Residual Color Mixture 3)

The transparent composition described in Table 2-2 was applied onto a glass wafer with an undercoat layer such that the film thickness after drying reached 0.8 jm, using a spin coater, and a heating treatment (prebaking) was performed, using a hot plate at 110° C. for 120 seconds.

Subsequently, the obtained composition layer was exposed at 1,000 mJ/cm$^2$ with light at a wavelength of 365 nm through a mask with a pattern in 2 cm×2 cm, using an i-ray stepper exposure apparatus FPA-3000i5+(manufactured by Canon Inc.).

Thereafter, the glass wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using a 60%-by-mass diluted solution of CD-2000 (manufactured by Fujifilm Electronics Materials), thereby forming a pattern on the glass wafer.

The glass wafer having the pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in a shower form from above the rotational center from discharge nozzles, and then spin-dried.

In addition, post-baking was performed using a hot plate at 165° C. for 10 minutes to obtain a monochromatic color filter having the first-layer pattern formed thereon.

Next, the coloring composition described in Table 3 was applied onto the color filter having the first-layer pattern formed thereon such that the film thickness after drying reached 0.8 μm, using a spin coater, and a heating treatment (prebaking) was performed, using a hot plate at 100° C. for 120 seconds, thereby obtaining a laminated color filter having a second-layer coloring composition layer (second layer) formed on the first-layer pattern.

Subsequently, the obtained laminated color filter was subjected to development, rinsing, and drying treatments in the same manner as for the formation of the first-layer pattern to remove the coloring composition layer in an uncured area by development.

The transmittance of the pattern was measured using MCPD-3000 (manufactured by Otsuka Electronics Co., Ltd.), and the transmittance change at a wavelength at which the transmittance change between a transmittance at a wavelength of 400 to 700 nm of the first-layer pattern immediately after formation of the pattern of the first-layer pattern and a transmittance of the first-layer pattern after development of the second-layer pattern is maximum was taken as $\Delta T$ % max, which was used as an evaluation standard for the color mixture of residual color mixture 3.

TABLE 3

| | Coloring composition | Post-baking | Additive exposure | Residue | Adhesiveness | Temporal stability | Residual Color mixture 1 | Residual Color mixture 2 | Residual Color mixture 3 | Moisture resistance |
|---|---|---|---|---|---|---|---|---|---|---|
| Example 1 | Coloring composition Example 1 | 165° C./10 minutes | None | C | C | C | C | C | C | C |
| Example 2 | Coloring composition Example 2 | 165° C./10 minutes | None | C | C | C | C | C | B | C |
| Example 3 | Coloring composition Example 3 | 165° C./10 minutes | None | C | C | C | C | C | B | C |
| Example 4 | Coloring composition Example 4 | 165° C./10 minutes | None | C | C | C | C | C | B | C |
| Example 5 | Coloring composition Example 5 | 165° C./10 minutes | None | B | C | B | C | B | B | C |
| Example 6 | Coloring composition Example 6 | 165° C./10 minutes | None | B | C | B | C | B | B | C |
| Example 7 | Coloring composition Example 7 | 165° C./10 minutes | None | B | C | C | C | B | B | C |
| Example 8 | Coloring composition Example 8 | 165° C./10 minutes | None | B | C | C | C | B | B | C |
| Example 9 | Coloring composition Example 9 | 165° C./10 minutes | None | B | C | C | C | B | B | C |
| Example 10 | Coloring composition Example 10 | 165° C./10 minutes | None | B | C | B | C | B | A | C |
| Example 11 | Coloring composition Example 11 | 165° C./10 minutes | None | B | C | B | C | B | A | C |
| Example 12 | Coloring composition Example 12 | 165° C./10 minutes | None | A | C | B | C | B | A | C |
| Example 13 | Coloring composition Example 13 | 165° C./10 minutes | None | A | C | B | B | B | A | C |
| Example 14 | Coloring composition Example 14 | 165° C./10 minutes | None | A | B | B | B | B | A | C |
| Example 15 | Coloring composition Example 15 | 165° C./10 minutes | None | A | B | A | B | B | A | C |
| Example 16 | Coloring composition Example 16 | 165° C./10 minutes | None | A | A | A | B | B | A | C |
| Example 17 | Coloring composition Example 17 | 165° C./10 minutes | None | A | A | A | B | B | A | B |
| Example 18 | Coloring composition Example 18 | 165° C./10 minutes | None | A | A | A | B | B | A | B |
| Example 19 | Coloring composition Example 19 | 165° C./10 minutes | None | A | A | B | A | A | A | A |
| Example 20 | Coloring composition Example 20 | 165° C./10 minutes | None | A | A | A | A | A | A | A |
| Example 21 | Coloring composition Example 20 | 145° C./10 minutes | None | A | A | A | A | A | A | A |
| Example 22 | Coloring composition Example 20 | 125° C./10 minutes | None | A | A | A | B | B | A | B |
| Example 23 | Coloring composition Example 21 | 165° C./10 minutes | None | A | A | A | B | B | A | A |
| Example 24 | Coloring composition Example 22 | 165° C./10 minutes | None | A | A | A | B | B | A | B |
| Example 25 | Coloring composition Example 23 | 165° C./10 minutes | None | B | A | A | B | B | A | B |
| Example 26 | Coloring composition Example 24 | 165° C./10 minutes | None | B | A | A | B | B | A | B |
| Example 27 | Coloring composition Example 25 | 165° C./10 minutes | None | B | A | A | B | B | A | B |
| Example 28 | Coloring composition Example 26 | 165° C./10 minutes | None | A | A | B | B | B | A | B |
| Example 29 | Coloring composition Example 27 | 165° C./10 minutes | None | B | C | B | C | C | A | C |
| Example 30 | Coloring composition Example 28 | 165° C./10 minutes | None | B | C | B | C | B | A | C |
| Example 31 | Coloring composition Example 28 | 165° C./10 minutes | 300 mW/cm$^2$, 15 seconds | B | C | B | B | A | A | A |
| Example 32 | Coloring composition Example 28 | 165° C./10 minutes | 300 mW/cm$^2$, 30 seconds | B | C | B | A | A | A | A |
| Example 33 | Coloring composition Example 29 | 165° C./10 minutes | None | B | C | B | C | B | A | C |
| Example 34 | Coloring composition Example 30 | 165° C./10 minutes | None | B | C | B | C | B | B | C |
| Example 35 | Coloring composition Example 31 | 165° C./10 minutes | None | B | C | B | C | B | B | C |
| Example 36 | Coloring composition Example 32 | 165° C./10 minutes | None | B | C | C | C | B | A | C |

TABLE 3-continued

| | Coloring composition | Post-baking | Additive exposure | Residue | Adhesiveness | Temporal stability | Residual color mixture | | | Moisture resistance |
| | | | | | | | Residual Color mixture 1 | Residual Color mixture 2 | Residual Color mixture 3 | |
|---|---|---|---|---|---|---|---|---|---|---|
| Example 37 | Coloring composition Example 33 | 165° C./10 minutes | None | B | C | C | C | B | A | C |
| Example 38 | Coloring composition Example 34 | 165° C./10 minutes | None | B | C | B | C | B | B | C |
| Example 39 | Coloring composition Example 35 | 165° C./10 minutes | None | C | C | B | B | B | B | C |
| Example 40 | Coloring composition Example 36 | 165° C./10 minutes | None | C | C | B | B | B | B | C |
| Example 41 | Coloring composition Example 37 | 165° C./10 minutes | None | B | C | A | B | B | B | C |
| Example 42 | Coloring composition Example 38 | 165° C./10 minutes | None | B | C | A | B | B | B | C |
| Example 43 | Coloring composition Example 39 | 165° C./10 minutes | None | B | C | B | C | B | B | C |
| Example 44 | Coloring composition Example 40 | 165° C./10 minutes | None | C | B | C | C | C | C | C |
| Comparative Example 1 | Comparative coloring composition 1 | 165° C./10 minutes | None | E | D | E | D | C | C | D |
| Comparative Example 2 | Comparative coloring composition 2 | 165° C./10 minutes | None | E | D | E | D | C | E | D |
| Comparative Example 3 | Comparative coloring composition 3 | 165° C./10 minutes | None | E | D | C | D | C | C | E |
| Comparative Example 4 | Comparative coloring composition 4 | 165° C./10 minutes | None | C | D | C | D | C | E | E |
| Comparative Example 5 | Comparative coloring composition 5 | 165° C./10 minutes | None | C | D | C | D | C | C | E |
| Comparative Example 6 | Comparative coloring composition 6 | 165° C./10 minutes | None | C | D | C | D | C | C | E |
| Comparative Example 7 | Comparative coloring composition 7 | 165° C./10 minutes | None | C | D | C | D | C | C | E |

As seen from the results, in Examples, it was possible to produce a cured film having excellent moisture resistance. Further, the cured films of Examples had spectral characteristics which are optimal for cyan color. Incidentally, the residue, the adhesiveness, the temporal stability, and the residual color mixture were also evaluated to be good. Further, from the results of Examples 30, 31, and 32, it was possible to suppress the residual color mixture more effectively by performing additive exposure. In addition, in Examples 1 to 42, and 44 in which A-1 to A-7 were used as an aluminum phthalocyanine pigment, the spectral characteristics of cyan color were particularly excellent, as compared with Example 43 in which A-13 was used.

On the other hand, the cured films of Comparative Examples had deteriorated moisture resistance. In addition, the residue, the adhesiveness, and the residual color mixture were also evaluated to be deteriorated.

What is claimed is:

1. A curable coloring composition comprising:
   a coloring agent including a phthalocyanine pigment having Al as a central metal;
   a basic pigment derivative; and
   a curable compound,
   wherein the coloring agent includes 80% by mass or more of the phthalocyanine pigments, the content of the phthalocyanine pigment having Al as a central metal among phthalocyanine pigments is 30% by mass or more, and the phthalocyanine pigment having Al as a central metal has a ligand including a phosphorus atom.

2. The curable coloring composition according to claim 1, wherein the content of the phthalocyanine pigment having Al as a central metal among the phthalocyanine pigments is 50% by mass or more.

3. The curable coloring composition according to claim 1, wherein the ligand including a phosphorus atom has a hydrophobic group.

4. The curable coloring composition according to claim 1, wherein the phthalocyanine pigment having Al as a central metal is represented by Formula (Pc-1),

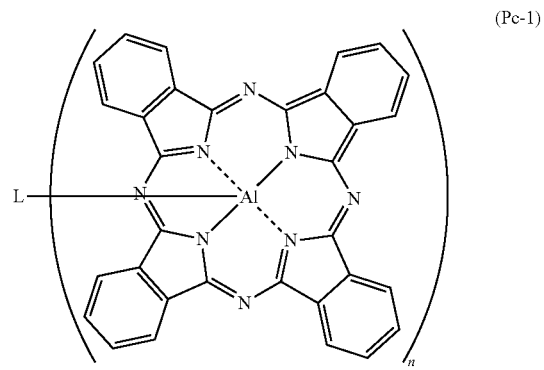

in the formula, L represents a ligand having one or more coordination sites for the Al atom, and n represents the number of coordination sites contained in L.

5. The curable coloring composition according to claim 1, wherein the coloring agent has a content of a yellow coloring agent of 5% by mass or less.

6. The curable coloring composition according to claim 1, wherein the basic pigment derivative has at least one selected from an azo-based skeleton and a benzoimidazolone-based skeleton.

7. The curable coloring composition according to claim 1, wherein the curable compound includes an epoxy compound, and
the curable coloring composition further includes a curing aid.

8. The curable coloring composition according to claim 1, wherein the curable compound includes a radically polymerizable compound, and
the curable coloring composition further includes a photopolymerization initiator A having a light absorption coefficient at 365 nm of $1.0 \times 10^3$ mL/gcm or more in methanol, and a photopolymerization initiator B having a light absorption coefficient at 365 nm of $1.0 \times 10^2$ mL/gcm or less and a light absorption coefficient at 254 nm of $1.0 \times 10^3$ mL/gcm or more in methanol.

9. The curable coloring composition according to claim 1, used for forming pixels in cyan color.

10. A color filter using the curable coloring composition according to claim 1.

11. A solid-state imaging device comprising the color filter according to claim 10.

12. The solid-state imaging device according to claim 11, further comprising an organic photoelectric conversion film.

13. An image display device comprising the color filter according to claim 10.

14. A method for producing a cured film, comprising:
forming a curable coloring composition layer on a substrate, using the curable coloring composition according to claim 1;
patternwise exposing the curable coloring composition layer; and
removing an unexposed area by development to form a pattern,
wherein the method for producing a cured film is carried out at a temperature of 180° C. or lower through all the steps.

15. The method for producing a cured film according to claim 14, further comprising performing exposure after formation of the pattern.

16. The method for producing a cured film according to claim 15,
wherein a curable coloring composition including a radically polymerizable compound, a photopolymerization initiator A having a light absorption coefficient at 365 nm of $1.0 \times 10^3$ mL/gcm or more in methanol, and a photopolymerization initiator B having a light absorption coefficient at 365 nm in methanol of $1.0 \times 10^2$ mL/gcm or less and a light absorption coefficient at 254 nm of $1.0 \times 10^3$ mL/gcm or more in methanol is used as the curable coloring composition, and
the exposure before formation of the pattern is performed with light at a wavelength of more than 350 nm and 380 nm or less, and the exposure after formation of the pattern is performed with light at a wavelength of 254 to 350 nm.

17. The method for producing a cured film according to claim 14,
wherein the substrate is a substrate having an organic photoelectric conversion film.

18. The curable coloring composition according to claim 1, wherein the coloring agent includes, in addition to the aluminum-containing phthalocyanine pigment, at least one other phthalocyanine pigment.

19. The curable coloring composition according to claim 1, wherein the coloring composition includes an acidic resin and/or an amphoteric resin.

20. The curable coloring composition according to claim 1, wherein the coloring agent includes 90% by mass or more of phthalocyanine pigments.

21. The curable coloring composition according to claim 1, wherein the content of yellow coloring agent in the coloring agent is 1% by mass or less.

22. A pixel in cyan color formed from the coloring composition according to claim 1.

23. A curable coloring composition comprising:
a coloring agent including a phthalocyanine pigment having Al as a central metal;
a basic pigment derivative; and
a curable compound,
wherein the coloring agent includes 80% by mass or more of phthalocyanine pigments, the content of the phthalocyanine pigment having Al as a central metal among phthalocyanine pigments is 30% by mass or more, and the phthalocyanine pigment having Al as a central metal is a compound represented by Formula (Pc):

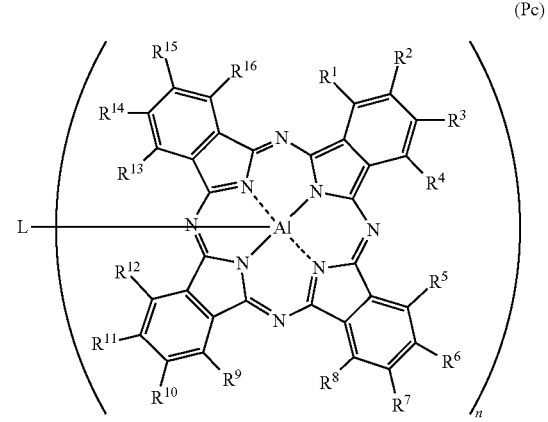

(Pc)

wherein in Formula (Pc), $R^1$ to $R^{16}$ each independently represents a hydrogen atom or a substituent, L represents a ligand having one or more coordination sites for the Al atom and having a hydrophobic group, and n represents the number of coordination sites contained in L.

24. The curable coloring composition according to claim 23, wherein the coloring agent includes, in addition to the aluminum-containing phthalocyanine pigment, at least one other phthalocyanine pigment.

* * * * *